(12) United States Patent
Suh et al.

(10) Patent No.: US 7,858,400 B2
(45) Date of Patent: Dec. 28, 2010

(54) METHOD OF MANUFACTURING MAGNETIC FIELD DETECTOR

(75) Inventors: Jeongdae Suh, Daejeon (KR); Myungae Chung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 230 days.

(21) Appl. No.: 12/170,882

(22) Filed: Jul. 10, 2008

(65) Prior Publication Data
US 2009/0155932 A1    Jun. 18, 2009

(30) Foreign Application Priority Data
Dec. 14, 2007    (KR) .................. 10-2007-0131075

(51) Int. Cl.
*H01L 21/00* (2006.01)
(52) U.S. Cl. ........................... 438/3; 438/57
(58) Field of Classification Search .............. 438/3, 438/49, 57–81
See application file for complete search history.

(56) References Cited

U.S. PATENT DOCUMENTS

| | | | | |
|---|---|---|---|---|
| 5,200,051 | A * | 4/1993 | Cozzette et al. | 204/403.07 |
| 5,212,050 | A * | 5/1993 | Mier et al. | 430/320 |
| 5,883,764 | A * | 3/1999 | Pinarbasi | 360/322 |
| 6,519,120 | B1 * | 2/2003 | Lee et al. | 360/324.1 |
| 6,689,624 | B2 * | 2/2004 | Doan et al. | 438/3 |
| 6,710,984 | B1 * | 3/2004 | Yuasa et al. | 360/324.11 |
| 6,784,509 | B2 * | 8/2004 | Yuasa et al. | 257/421 |
| 6,875,621 | B2 | 4/2005 | Tondra | |
| 6,906,369 | B2 | 6/2005 | Ross et al. | |
| 6,940,750 | B2 * | 9/2005 | Yamamoto et al. | 365/173 |
| 7,002,839 | B2 * | 2/2006 | Kawabata et al. | 365/171 |
| 2005/0087000 | A1 | 4/2005 | Coehoorn et al. | |
| 2007/0063695 | A1 | 3/2007 | Ruhrig | |

FOREIGN PATENT DOCUMENTS

| | | | |
|---|---|---|---|
| JP | 2004-139681 A | 5/2004 |
| JP | 2004-193479 A | 7/2004 |
| JP | 2004-327583 A | 11/2004 |

OTHER PUBLICATIONS

Guanxiong Li, et al: "Detection of single micron-sized magnetic bead and magnetic nanoparticles using spin valve sensors for biological applications" Journal of Applied Physics, vol. 93, No. 10, May 15, 2003 pp. 7557-7559.
J.C. Rife, et al: "Design and performance of GMR sensors for the detection of magnetic microbeads in biosensors", Sensors and Actuators, A, Physical, Jul. 25, 2003, pp. 209-218.
J. Schotter, et al: "Comparison of a prototype magnetoresistive biosensor to standard fluorescent DNA detection" Biosensors and Bioelectronics vol. 19, May 15, 2004, pp. 1149-1156.
H.A. Ferreira, et al: "Magnetoresistive DNA chips based on ac field focusing of magnetic labels" Journal of Applied Physics, vol. 99, Apr. 18, 2006, pp. 08P105-1~08P105-3.
Jeong Dae Suh, et al: "Magnetic Sensors with Difference Geometry to Magnetic Nanoparticle Detection for Biosensor Application", MRS 2007 Fall Meeting, Nov. 26-30, 2007, pp. 114.37.

* cited by examiner

*Primary Examiner*—Richard A. Booth
(74) *Attorney, Agent, or Firm*—Ladas & Parry LLP

(57) ABSTRACT

Disclosed is a method of manufacturing a magnetic field detector having various structures that can be used as a high-density magnetic biosensor. An embodiment of the invention provides a method of manufacturing a magnetic field detector including a magnetoresistive element using a magnetic bead detecting thin film. The method includes: preparing a substrate; depositing the thin film on an upper surface of the substrate; and etching the thin film to form a ring-shaped magnetoresistive element.

16 Claims, 63 Drawing Sheets

METHOD OF MANUFACTURING MAGNETIC FIELD DETECTOR

BACKGROUND OF THE INVENTION

1. Field of the Invention

The present invention relates to a method of manufacturing a magnetic field detector, and more particularly, to a method of manufacturing a magnetic field detector that detects a weak magnetic field generated from magnetic beads having a size of several tens of nanometers to several micrometers.

This work was supported by the IT R&D program of MIC/IITA [2006-S-074-02, High Performance Bio-sensor System Using Nano-particles].

2. Description of the Related Art

Micro devices and array devices using the same have had a great effect on the analysis of DNA, RNA, protein, viruses, and bacteria. In order to effectively analyze these bio-molecules, researches on magnetic biosensors using spherical magnetic particles (hereinafter, referred to as "magnetic beads") having a size of several tens of nanometers to several micrometers have been conducted.

The magnetic biosensor includes a magnetic field detector provided with a biochemical layer capable of being coupled to specific molecules. The magnetic biosensor performs analysis using magnetic beads, which are superparamagnetic particles to which biochemical molecules are coupled and have a size of several nanometers to several micrometers. When a solution containing the magnetic beads is dropped on the magnetic field detector, specific binding occurs between capture molecules on the surface of the magnetic field detector and target bio-molecules on the surfaces of the magnetic beads. When an external magnetic field is applied to the magnetic beads to magnetize the magnetic beads, the magnetic field detector detects the magnetic field generated from the magnetic beads, thereby indirectly detecting the bio-molecules.

As the magnetic bead detecting device using the magnetoresistive element according to the related art, the following have been proposed: linear magnetic field detectors each having triangular structures at both ends and an array thereof (M. C. Tondra, U.S. Pat. No. 6,875,621B2); a linear magnetic field detector having a hemispherical structure at one end (G. Li, et al., Journal of Applied Physics 93, 7557 (2003)); a magnetic field detector including linear magnetoresistive elements connected to each other (J. C. Rife, et al., Sensors and Actuators, A107, 209 (2003); a magnetic field detector including linear magnetoresistive element having a spiral shape (Biosensors and Bioelectronics 19, 1149 (2004); and a magnetic field detector including a linear magnetoresistive element having a U shape (H. A. Ferreira et al., Journal of Applied Physics 99, 08P105 (2006)).

In general, the magnetic field detector for detecting the magnetic beads according to the related art uses the above-mentioned linear magnetoresistive element. When the magnetic field detector with the linear structure is used, mutual interference occurs due to a stray field that is generated from the magnetic field detector magnetized by an external magnetic field. That is, the linear magnetoresistive element having a flat upper surface is used in the magnetic field detector according to the related art. Therefore, when an external magnetic field is applied, the magnetization direction of the element is fixed from one end to the other end thereof, which causes the leakage of the magnetic field to the outside of the element, that is, a stray field. The stray field lowers the SN ratio and has an adverse effect on the stability of the magnetic field detector. As a result, the magnetic field detector using the linear magnetoresistive element is not suitable as a high-density magnetic field detector.

SUMMARY OF THE INVENTION

The invention is designed to solve the problems, and an object of the invention is to provide a method of manufacturing a magnetic field detector with various structures capable of being used as a high-density magnetic biosensor.

In order to achieve the object, according to an aspect of the invention, there is provided a method of manufacturing a magnetic field detector including a magnetoresistive element using a thin film for detecting magnetic beads. The method includes: depositing the thin film on a substrate; and etching the thin film to form a ring-shaped magnetoresistive element.

According to another aspect of the invention, there is provided a method of manufacturing a magnetic field detector using a thin film for detecting magnetic beads. The method includes: preparing a substrate; depositing the thin film on an upper surface of the substrate; etching the thin film to form a ring-shaped magnetoresistive element; forming, on the upper surface of a substrate, electrode pads connected to the magnetoresistive element; forming a protective layer that covers the magnetoresistive element and the electrode pads; and forming, on an upper surface of the protective layer, a magnetic bead limiting layer that covers the entire surface of the magnetoresistive element and portions of the electrode pads.

The thin film may be formed of any one of a giant magnetoresistive thin film, an anisotropic magnetoresistive thin film, a spin valve thin film, and a tunnel-type magnetoresistive thin film.

The thin film may include a pinned layer and a free layer.

The thin film may be a laminate of a seed layer, an antiferromagnetic layer, a pinned layer, a gap layer, a free layer, and a protective layer formed in this order.

The seed layer may be formed of Ta.

The antiferromagnetic layer may be formed of IrMn.

The pinned layer may be formed of $Ni_{80}Fe_{20}$ or $Co_{80}Fe_{20}$.

The gap layer may be formed of Cu.

The free layer may be formed of $Ni_{80}Fe_{20}$ or $Co_{80}Fe_{20}$.

The protective layer may be formed of Ta.

The magnetoresistive element may be formed in any one of a circular ring shape, an elliptical ring shape, a square ring shape, and a rectangular ring shape.

In the forming of the electrode pads, the electrode pads may be formed of Ta or Au.

In the forming of the electrode pads, the electrode pads may be formed so as to be horizontally connected to the magnetoresistive element.

In the forming of the electrode pads, the electrode pads may be formed so as to be vertically and horizontally connected to the magnetoresistive element.

In the forming of the protective layer, the protective layer may be formed of $SiO_2$ or $Si_3N_4$.

In the forming of the protective layer, the protective layer may be formed with a thickness of 50 to 300 nm at room temperature.

In the forming of the magnetic bead limiting layer, the magnetic bead limiting layer may be formed using a photosensitive thin film.

In the forming of the magnetic bead limiting layer, the magnetic bead limiting layer may be formed with a thickness of 1 to 2 µm at room temperature.

The outside diameter of the magnetoresistive element may be in a range of 100 nm to 30 µm.

The width of the magnetoresistive element may be in a range of 100 nm to 5 µm.

A plurality of magnetoresistive elements may be formed in a one-dimensional array, or a two-dimensional array, that is, in a matrix.

According to the manufacturing method of the above-described aspect of the invention, since a stray field is formed inside the magnetoresistive element having a circular ring shape, an elliptical ring shape, a square ring shape, or a rectangular ring shape, the stray field does not leak to the outside of the magnetic field detector. Therefore, there is no mutual interference due to the stray field.

In particular, since the magnetic bead limiting layer limits the generation of the stray caused by an external magnetic field inside the magnetoresistive element, the operation of the magnetic field detector can be sufficiently stable to detect bio-molecules on a magnetic biosensor chip.

According to the manufacturing method of the above-described aspect of the invention, it is possible to improve the performance of a magnetic field detector, and manufacture a high-density magnetic field detector.

DESCRIPTION OF THE PREFERRED EMBODIMENTS

Hereinafter, methods of manufacturing magnetic field detectors according to embodiments of the invention will be described with reference to the accompanying drawings.

Figure 1A:
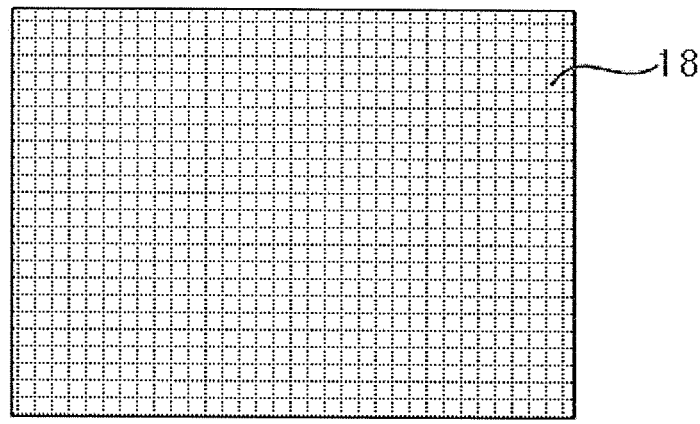
FIGS. 1A to 1C are diagrams illustrating the laminated structure of a giant magnetoresistive thin film according to the invention.
Figure 1B:
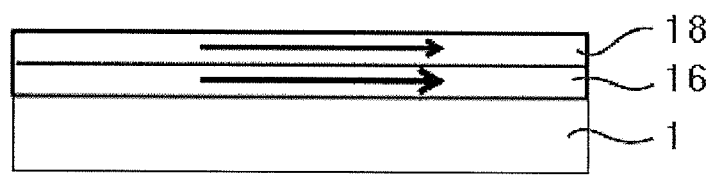
Figure 1C:
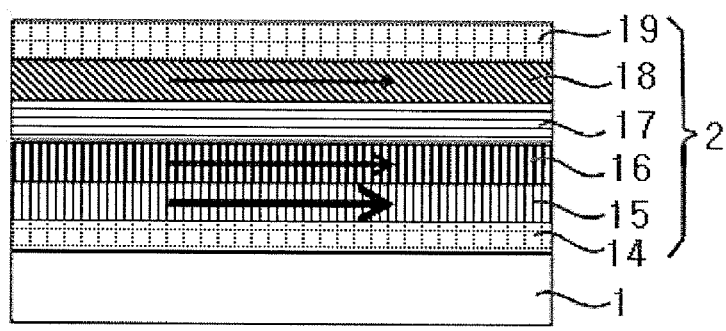

FIGS. 1A to 1C are diagrams illustrating the laminated structure of a giant magnetoresistive thin film according to an embodiment of the invention. In FIG. 1C, a substrate 1 is a Si or $SiO_2$ single crystal substrate. A $SiO_2$ oxidation layer is formed on the surface of the substrate 1. A giant magnetoresistive thin film 2 having a laminated structure of a seed layer, a free layer, a gap layer, a pinned layer, an antiferromagnetic layer, and a protective layer is formed on an upper surface of the substrate 1 by vapor deposition. For example, a seed layer 14 is formed on the upper surface of the substrate 1, and an antiferromagnetic layer 15 is formed on an upper surface of the seed layer 14. A pinned layer 16 is formed on an upper surface of the antiferromagnetic layer 15, and a gap layer 17 is formed on an upper surface of the pinned layer 16. A free layer 18 is formed on an upper surface of the gap layer 17, and a protective layer 19 is formed on an upper surface of the free layer 18.

The seed layer 14 and the protective layer 19 are formed of, for example, Ta film with a thickness of about 5 nm. The antiferromagnetic layer 15 is formed of, for example, IrMn film, and the thickness of the antiferromagnetic layer 15 is about 15 nm. The pinned layer 16 is formed of, for example, $Ni_{80}Fe_{20}$ film, and the thickness of the pinned layer 16 is about 3 nm. The gap layer 17 is formed of, for example, Cu film, and the thickness of the gap layer 17 is about 3 nm. The free layer 18 is formed of, for example, $Ni_{80}Fe_{20}$ film, and the thickness of the free layer 18 is about 6 nm. The magnetization direction of the pinned layer 16 is fixed, and the antiferromagnetic layer 15 is for fixing the magnetization direction of the pinned layer 16. The magnetization direction of the free layer 18 is not fixed.

The giant magnetoresistive thin film 2 having the above-mentioned laminated structure and thicknesses is grown by a sequential sputtering deposition method. The pinned layer 16 and the free layer 18 may be formed of $Co_{80}Fe_{20}$ film, instead of $Ni_{80}Fe_{20}$ film. FIG. 1A is a plan view illustrating the free layer 18, and FIG. 1B is a cross-sectional view illustrating the pinned layer 16 and the free layer 18 of the giant magnetoresistive thin film 2. In the giant magnetoresistive thin film 2, the layers may be laminated in a different order from the above, for example, in the order of the seed layer, the free layer, the gap layer, the pinned layer, the antiferromagnetic layer, and the protective layer, if necessary.

A magnetoresistive element shown in the following drawings is formed in a desired shape by etching the giant magnetoresistive thin film 2. In the following drawings, as shown in FIG. 1B, the magnetoresistive element is schematically illustrated to include the pinned layer 16 and the free layer 18. Arrows shown in the pinned layer 16 and the free layer 18 in FIGS. 1B and 1C indicate the degree of magnetization. Meanwhile, the magnetoresistive element may be formed using, for example, an anisotropic magnetoresistive thin film, a spin valve thin film, or a tunnel-type magnetoresistive thin film other than the giant magnetoresistive thin film 2.

First Embodiment

FIGS. 2A to 8B are diagrams sequentially illustrating a method of manufacturing a magnetic field detector according to a first embodiment of the invention. The magnetic field detector according to the first embodiment is characterized in that it includes a magnetoresistive element with a single circular ring shape.

Figure 2A:
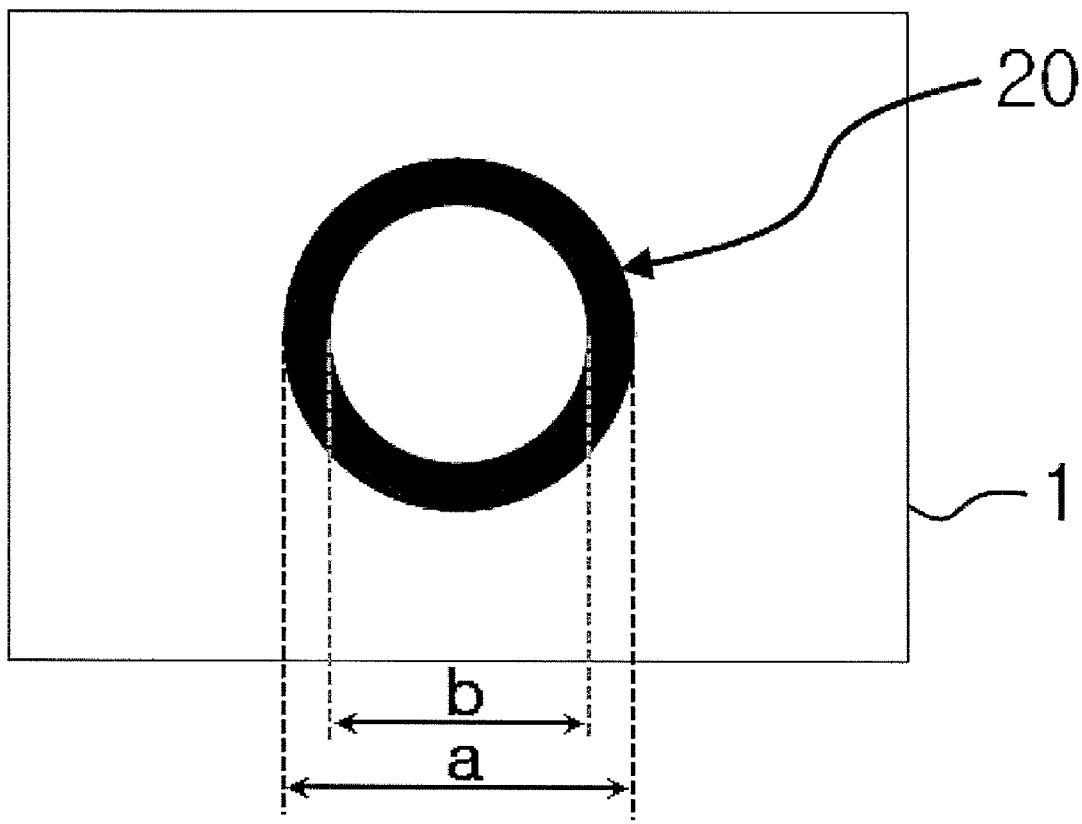
FIGS. 2A to 8B are diagrams sequentially illustrating a method of manufacturing a magnetic field detector according to a first embodiment of the invention.
Figure 2B:
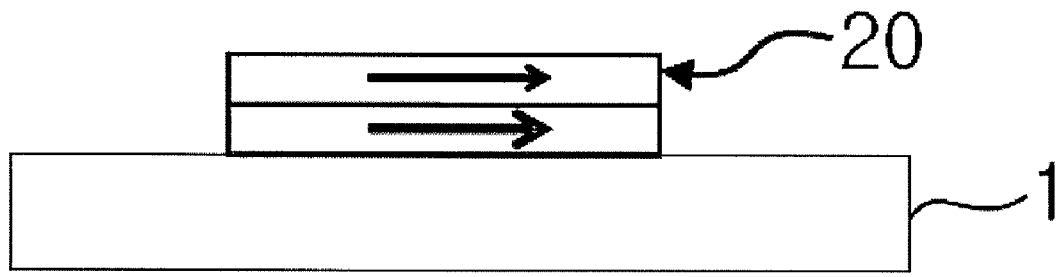

First, the giant magnetoresistive thin film 2 is formed on the substrate 1 by vapor deposition and then etched to form a magnetoresistive element 20 with a circular ring shape (see FIGS. 2A and 2B). In the etching process, dry etching, such as an Ar gas ion milling method, is performed on the giant magnetoresistive thin film 2 shown in FIG. 1C to etch all the portions of the film except a circular ring portion. FIG. 2A is a plan view, and FIG. 2B is a diagram illustrating the arrangement of the substrate 1 and the magnetoresistive element 20. For example, in the first embodiment, the magnetoresistive element 20 has an outside diameter a of about 100 nm to 30 μm, and the magnetoresistive element 20 has a width b of about 100 nm to 5 μm. The dimensions of the magnetoresistive element 20 may be applied to magnetoresistive elements 20 according to other embodiments.

Figure 3A:
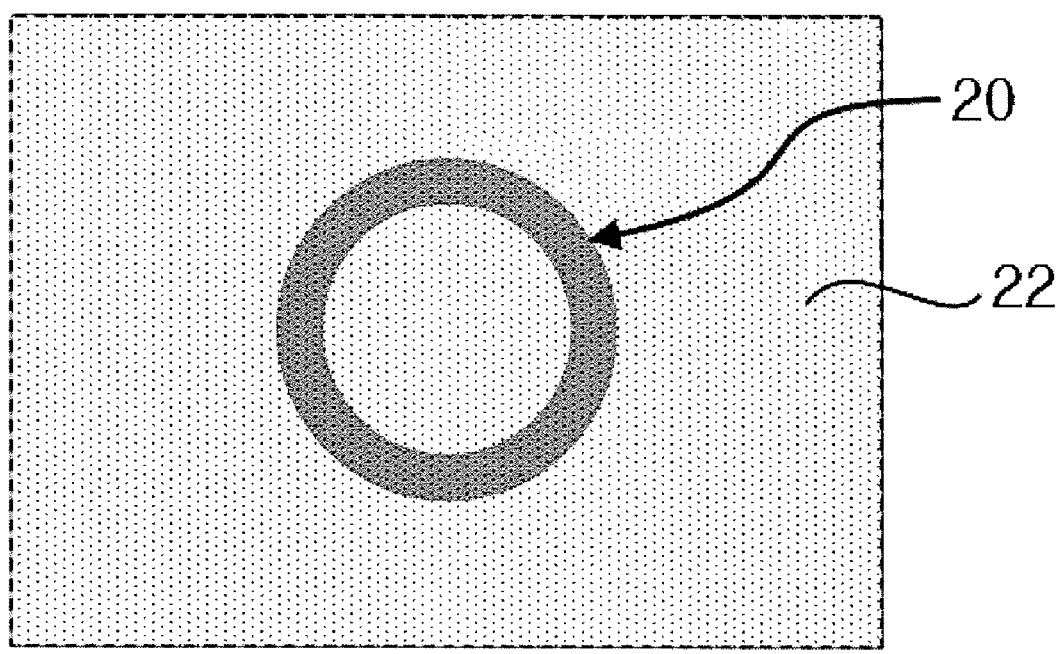
Figure 3B:
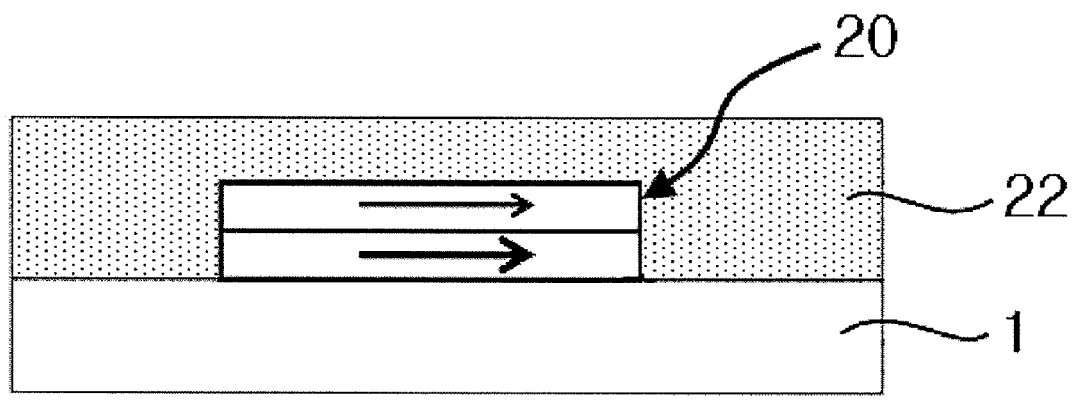

As shown in FIGS. 3A and 3B, a metal thin film layer 22 formed of Au is deposited on the substrate 1 and the magnetoresistive element 20. For example, Au is grown with a thickness of about 150 nm by a sputtering deposition method under the conditions of an argon gas pressure of about $3 \times 10^{-4}$ Torr, a sputtering power of about 60 W, and room temperature, thereby forming the metal thin film layer 22. FIG. 3A is a plan view, and FIG. 3B is a diagram illustrating the deposited metal thin film layer 22. The metal thin film layer 22 may be formed of Ta.

Figure 4A:
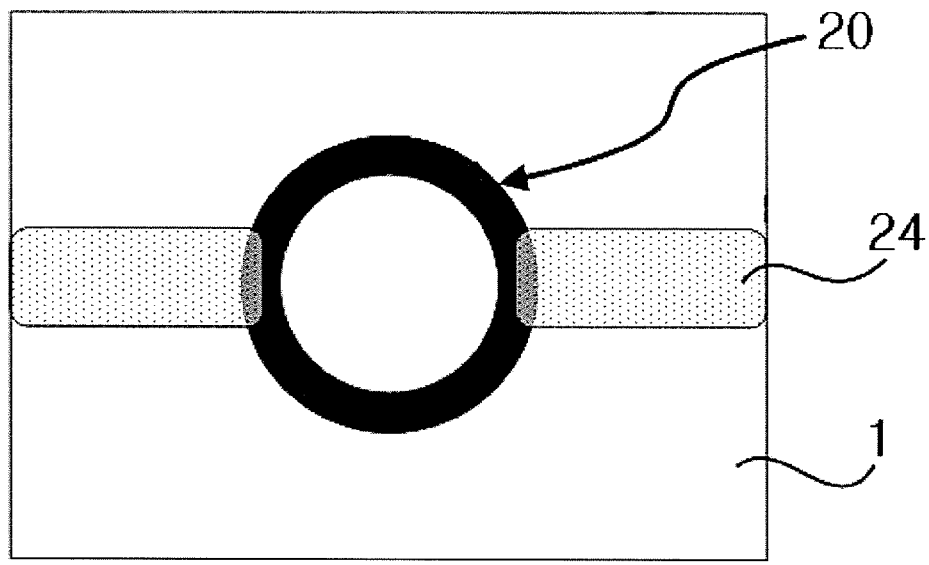
Figure 4B:
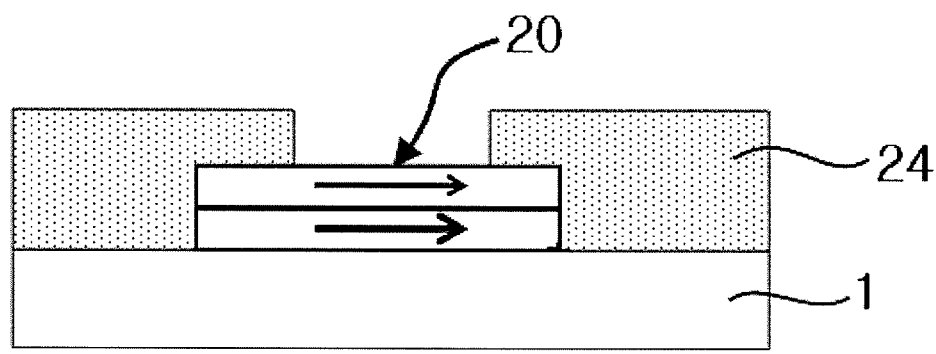

As shown in FIGS. 4A and 4B, electrode pads 24 are formed. The electrode pads 24 are used as electrodes for applying a current and measuring a horizontal voltage. The electrode pads 24 are formed by a lift-up method, using dry etching or a negative photosensitive mask. In this case, all the portions of the metal thin film layer 22 except for portions serving as the electrode pads 24 are removed. For example, the electrode pads 24 are formed on the left and right of the magnetoresistive element 20 so as to face each other in the horizontal direction. FIG. 4A is a plan view, and FIG. 4B is a diagram illustrating the formed electrode pads 24.

Figure 5A:
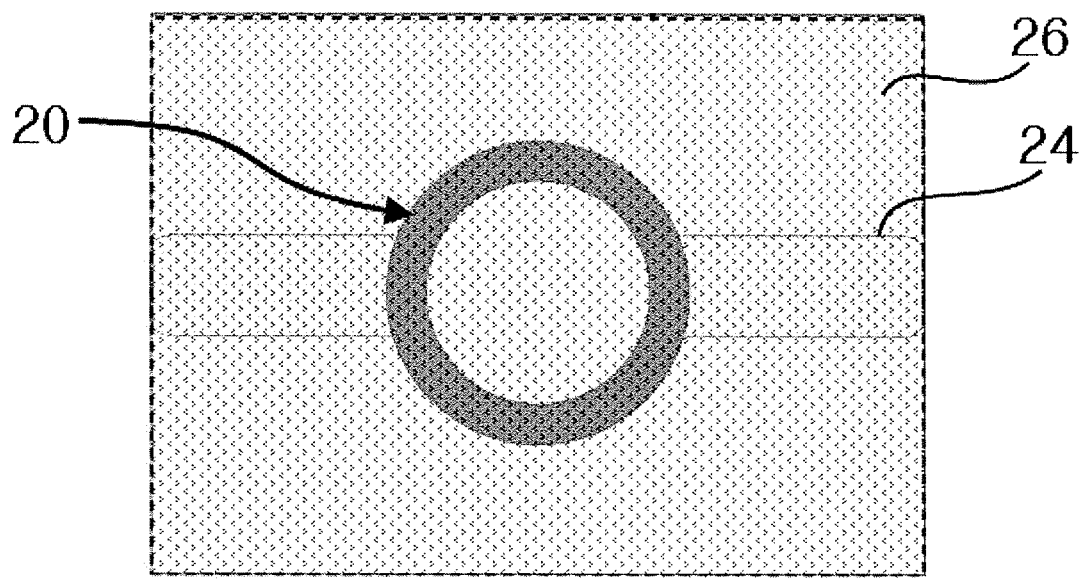
Figure 5B:
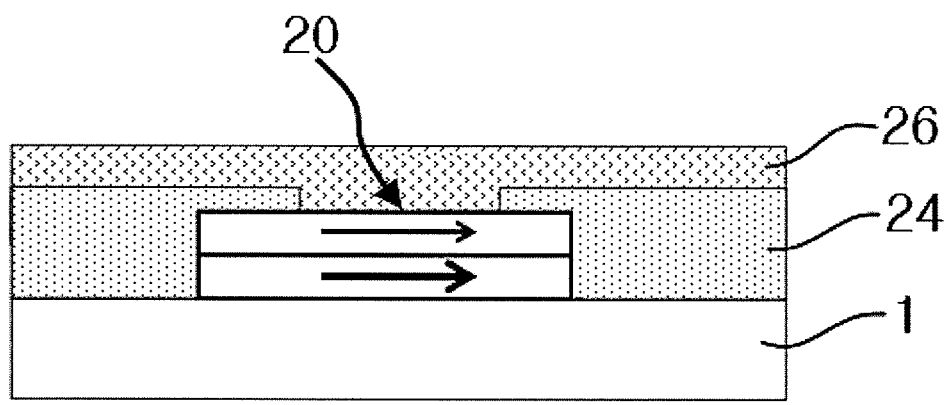

As shown in FIGS. 5A and 5B, an insulating thin film layer 26 is deposited on the substrate 1, the magnetoresistive element 20, and the electrode pads 24. The insulating thin film layer 26 is formed of $SiO_2$ or $Si_3N_4$. In order to prevent the magnetoresistive element 20 and the electrode pads 24 from being corroded by a solution for analyzing, for example, $SiO_2$ or $Si_3N_4$ is grown with a thickness of about 50 to 300 nm (preferably, 150 nm) by a sputtering deposition method under the conditions of an argon gas pressure of about $3 \times 10^{-4}$ Torr, a sputtering power of about 100 W, and room temperature, thereby forming the $SiO_2$ or $Si_3N_4$ insulating thin film layer 26. FIG. 5A is a plan view, and FIG. 5B is a diagram illustrating the formed insulating thin film layer 26.

Figure 6A:
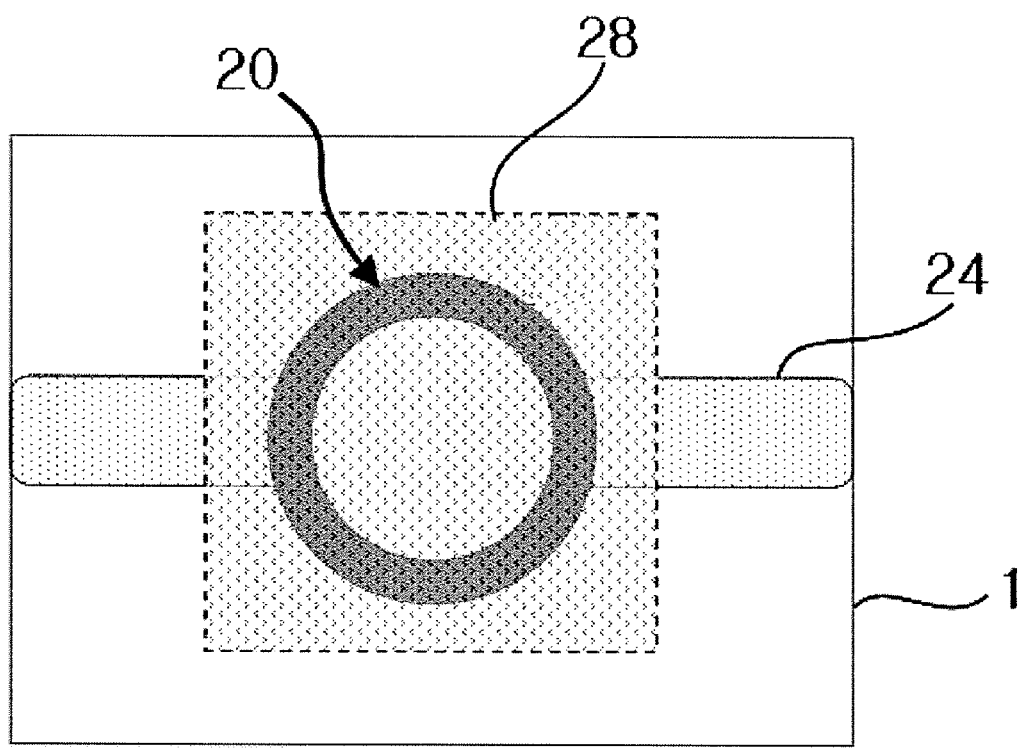
Figure 6B:
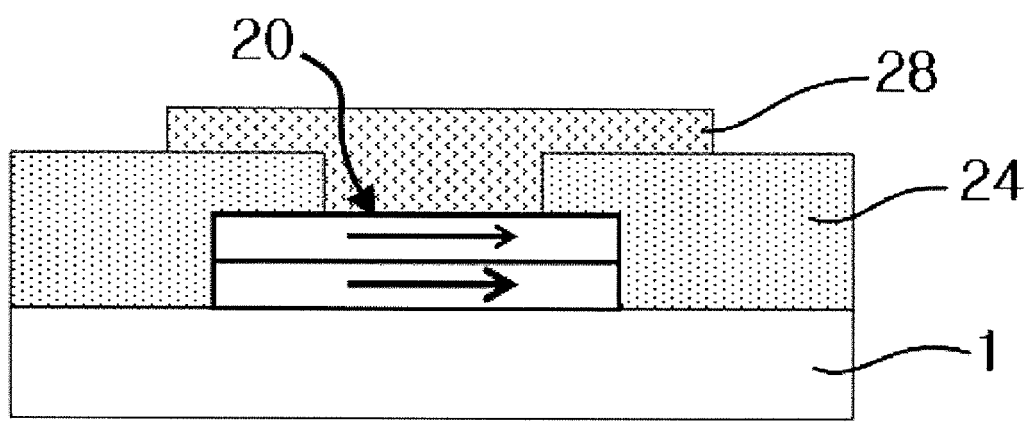

As shown in FIGS. 6A and 6B, the insulating thin film layer 26 is partially removed to form an insulating protective layer 28. All the portions of the insulating thin film layer 26 except a portion serving as the insulating protective layer are removed by a lift-up method, using dry etching, such as an Ar gas ion milling method, or a negative photosensitive mask, thereby forming the insulating protective layer 28. FIG. 6A is a plan view, and FIG. 6B is a diagram illustrating the formed insulating protective layer 28.

Figure 7A:
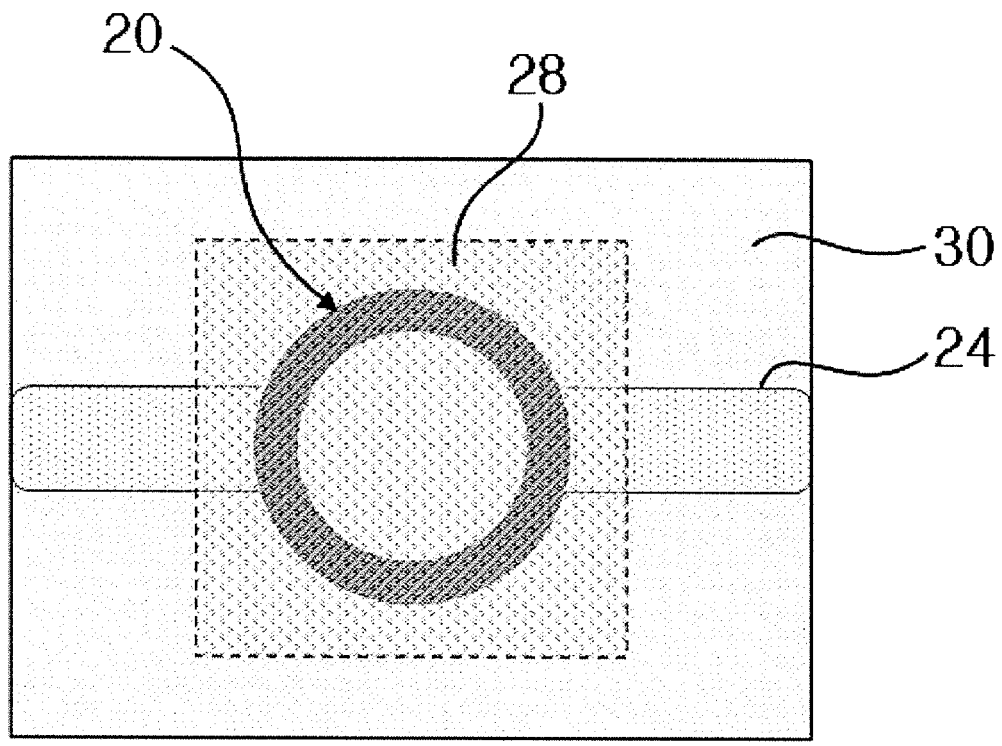
Figure 7B:
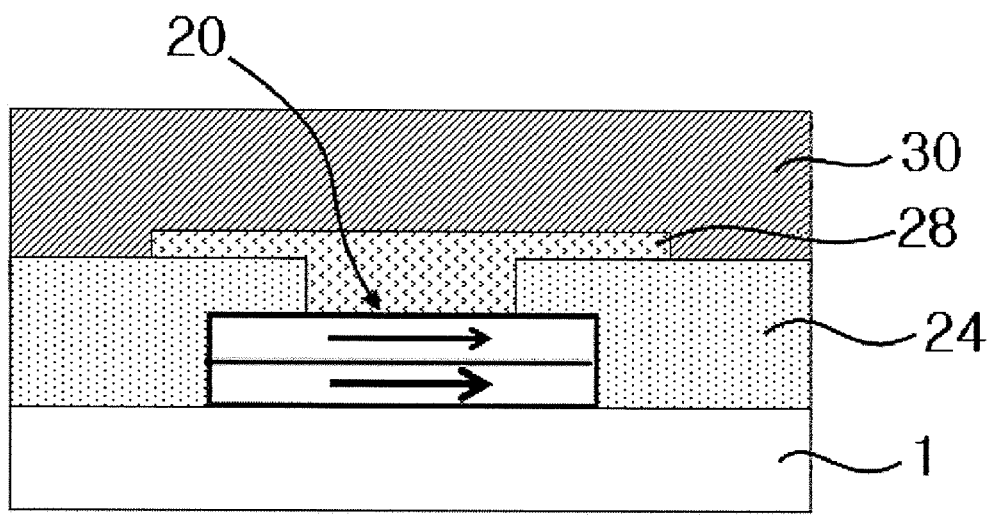

As shown in FIGS. 7A and 7B, a photosensitive magnetic bead thin film 30 is deposited on the substrate 1, the electrode pads 24, and the insulating protective layer 28. The photosensitive magnetic bead thin film 30 is formed with a thickness of about 1 to 2 μm (preferably, about 1.5 μm) at room temperature by spin coating at a speed of about 3000 to 5000 rpm. FIG. 7A is a plan view, and FIG. 7B is a diagram illustrating the deposited photosensitive magnetic bead thin film 30.

Figure 8A:
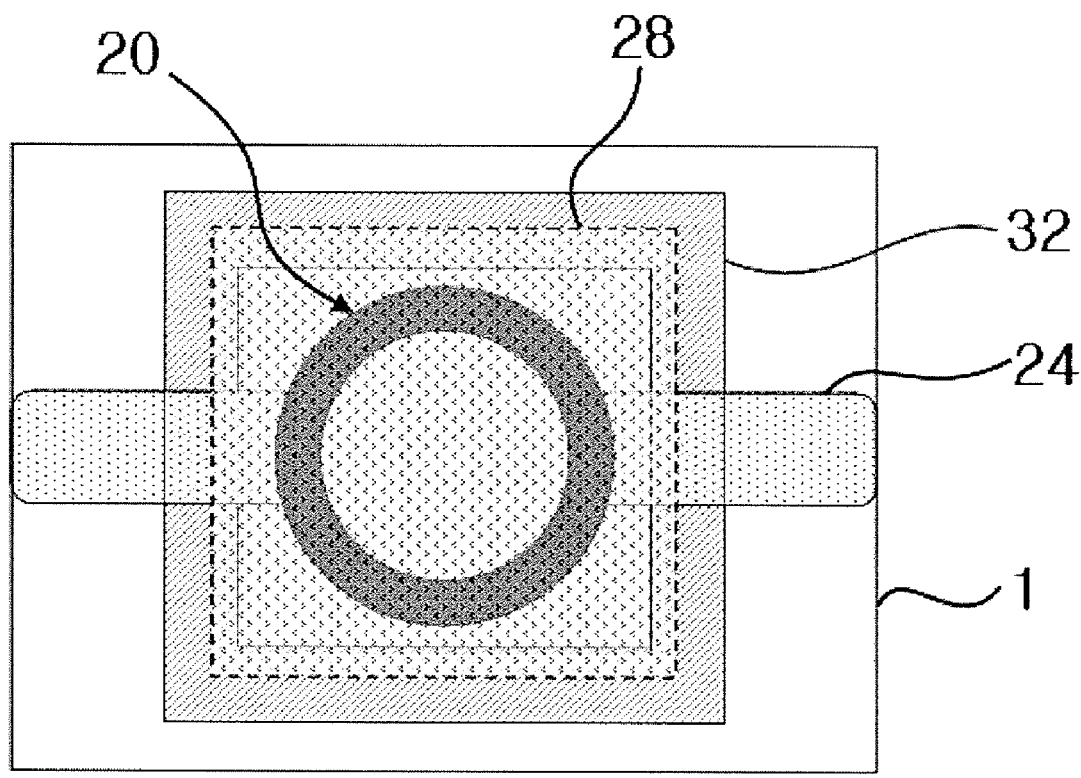
Figure 8B:
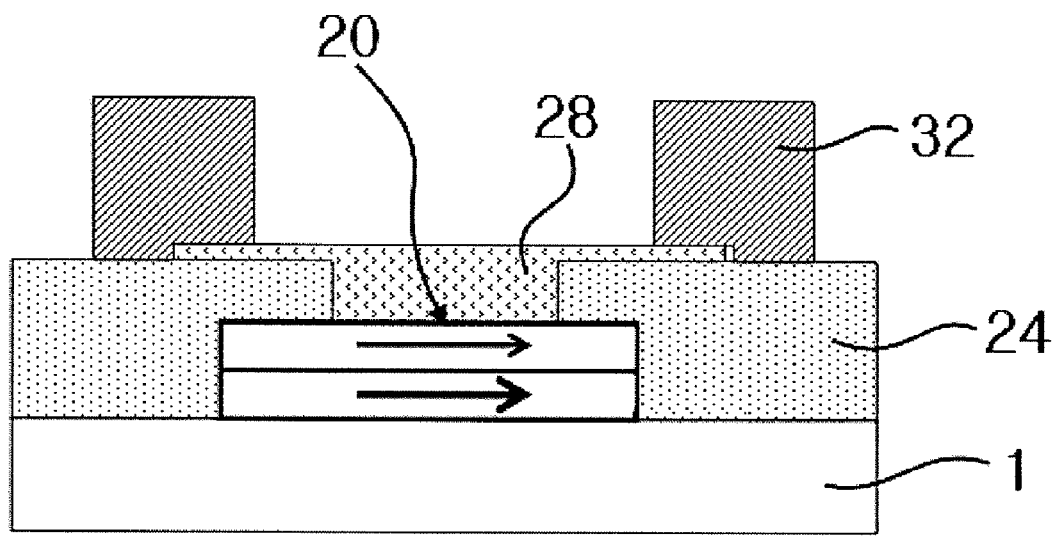

As shown in FIGS. 8A and 8B, the photosensitive magnetic bead thin film 30 is selectively removed to form a magnetic bead limiting layer 32. The magnetic bead limiting layer 32 is formed by removing all the portions of the photosensitive magnetic bead thin film 30 except a portion serving as the magnetic bead limiting layer 32, using a lift-up method and a negative photosensitive mask. The magnetic bead limiting layer 32 can impound a magnetic bead analysis solution therein such that the magnetic bead analysis solution is positioned close to the magnetoresistive element 20. FIG. 8A is a plan view and FIG. 8B is a diagram illustrating the formed magnetic bead limiting layer 32.

The magnetic field detector manufactured through the above-mentioned processes includes the magnetoresistive element 20 with a circular ring shape that is grown on the Si single crystal substrate 1, and the electrodes 24 for applying a current to the magnetoresistive element 20 and measuring a horizontal voltage, as shown in FIGS. 8A and 8B. The insulating protective layer 28 is deposited on the entire surface of the magnetoresistive element 20 and portions of the electrodes 24, and the magnetic bead limiting layer 32 is formed on the magnetoresistive element 20, the electrodes 24, and the insulating protective layer 28. The electrodes 24 mean the electrode pads described with reference to FIGS. 4A and 4B, and may be called horizontal electrodes.

FIGS. 9A to 11B are diagrams illustrating modifications of the first embodiment of the invention.

Figure 9A:
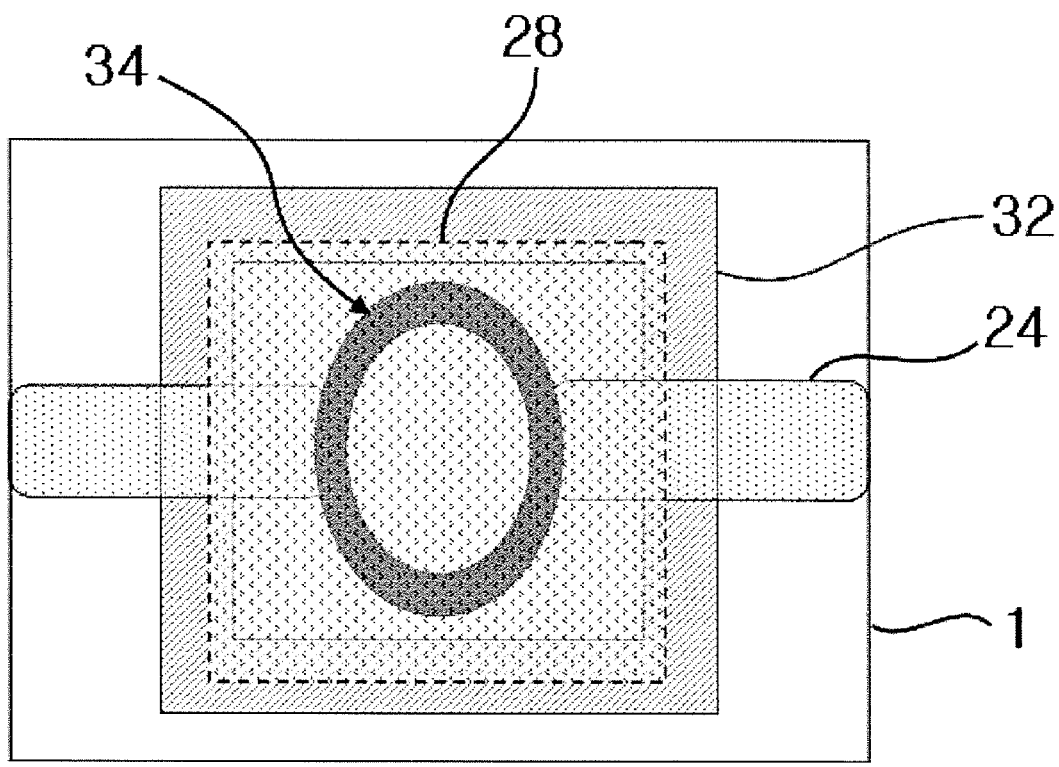
FIGS. 9A to 11B are diagrams illustrating modifications of the first embodiment.
Figure 9B:
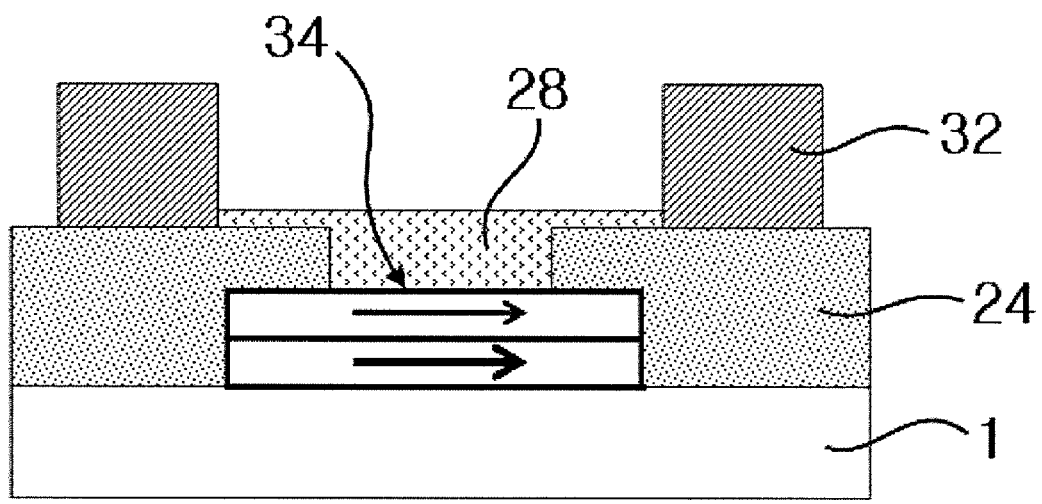

A magnetoresistive element shown in FIGS. 9A and 9B is similar to that shown in FIGS. 8A and 8B except that it has an elliptical ring shape, and the magnetoresistive element is manufactured by the same method as described above. In FIGS. 9A and 9B, reference numeral 34 denotes the magnetoresistive element with the elliptical ring shape. FIG. 9A is a plan view, and FIG. 9B is a diagram illustrating a magnetic field detector including the magnetoresistive element 34 with the elliptical ring shape. For example, the external diameter of the major axis of the magnetoresistive element 34 is in a range of about 100 nm to 30 μm, and the width of a ring of the magnetoresistive element 34 is in a range of about 100 nm to 5 μm. The ratio of the external diameter of the minor axis to the external diameter of the major axis of the magnetoresistive element 34 is in a range of about 1:2 to 1:3.

Figure 10A:
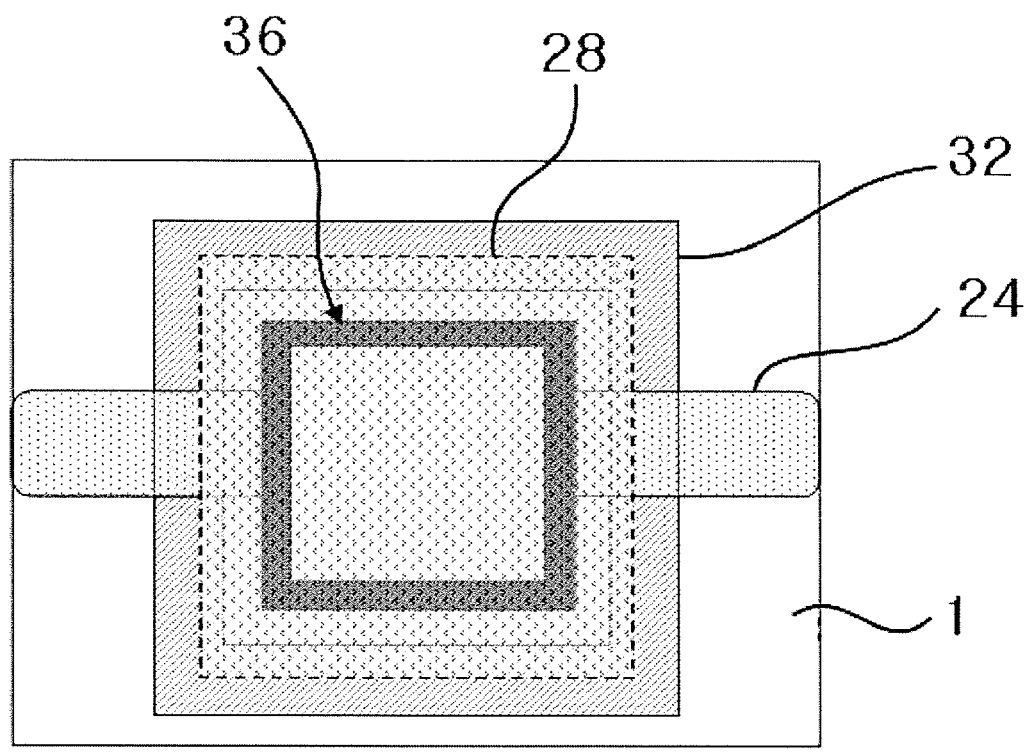
Figure 10B:
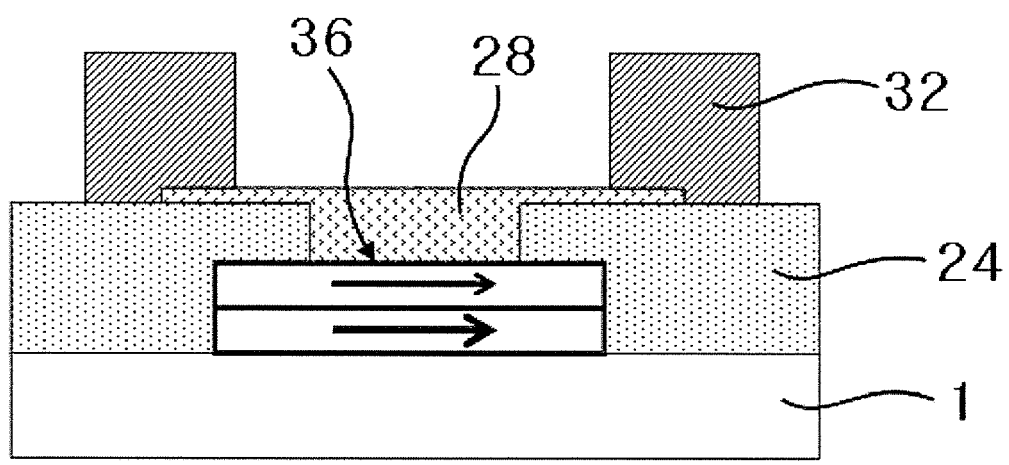

A magnetoresistive element shown in FIGS. 10A and 10B is similar to that shown in FIGS. 8A and 8B except that it has a square ring shape, and the magnetoresistive element is manufactured by the same method as described above. In FIGS. 10A and 10B, reference numeral 36 denotes the magnetoresistive element with the square ring shape. FIG. 10A is a plan view, and FIG. 10B is a diagram illustrating a magnetic field detector including the magnetoresistive element 36 with the square ring shape. For example, the length of one side of the magnetoresistive element 36 is in a range of about 100 nm to 30 μm, and the width of a ring of the magnetoresistive element 36 is in a range of about 100 nm to 5 μm.

Figure 11A:
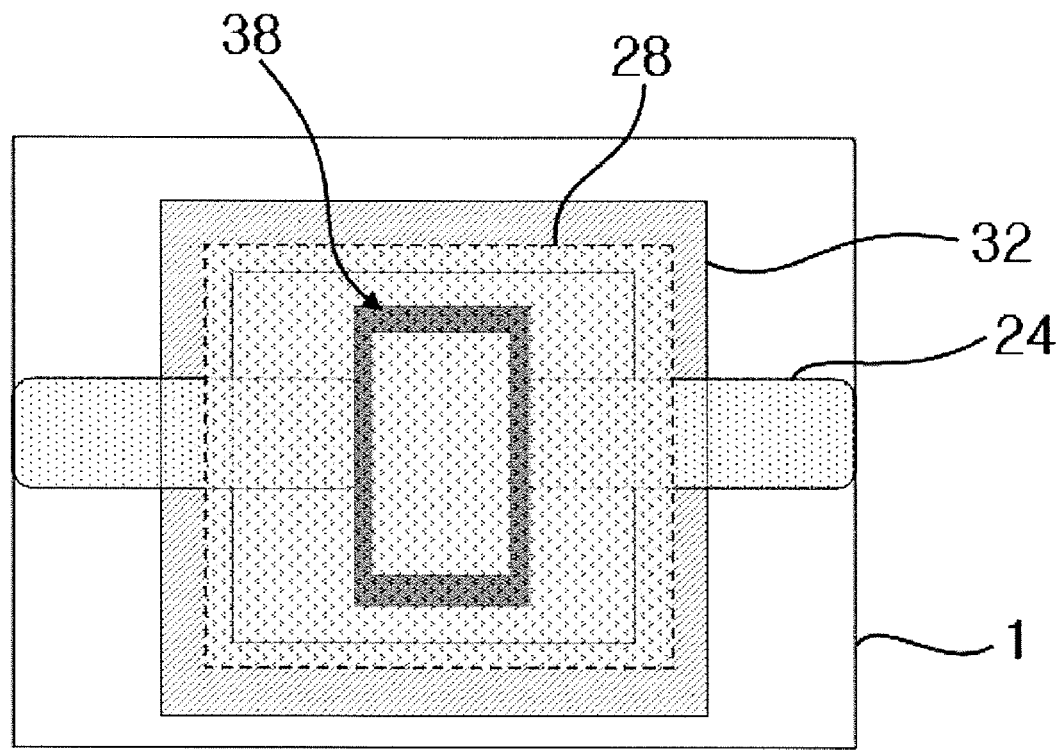
Figure 11B:
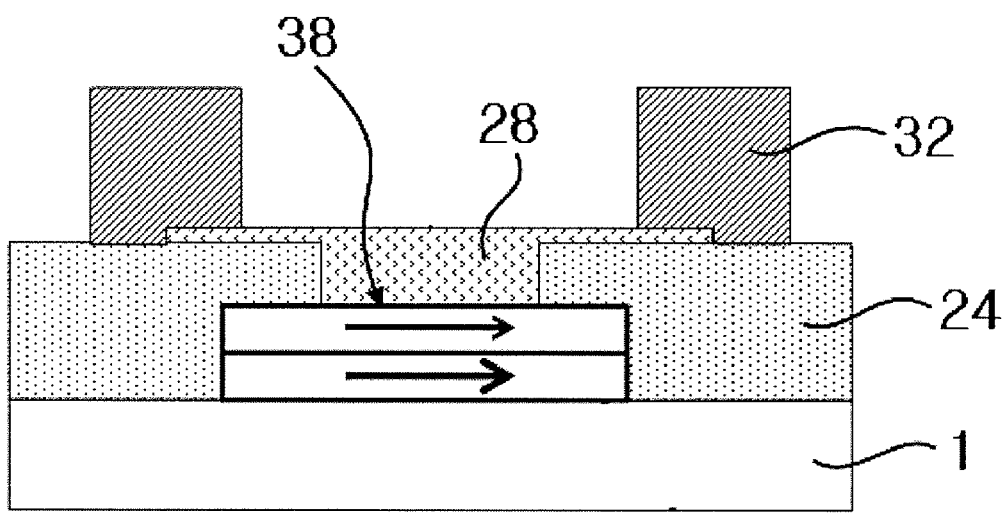

A magnetoresistive element shown in FIGS. 11A and 11B is similar to that shown in FIGS. 8A and 8B except that it has a rectangular ring shape, and the magnetoresistive element is manufactured by the same method as described above. In FIGS. 11A and 11B, reference numeral 38 denotes the magnetoresistive element with the rectangular ring shape. FIG. 11A is a plan view, and FIG. 11B is a diagram illustrating a magnetic field detector including the magnetoresistive element 38 with the rectangular ring shape. For example, the external diameter of the major axis (length) of the magnetoresistive element 38 is in a range of about 100 nm to 30 μm, and the external diameter of the minor axis (width) of a ring of the magnetoresistive element 38 is in a range of about 100 nm to 5 μm. The ratio of the width to the length of the magnetoresistive element 38 is in a range of about 1:2 to 1:3.

The dimensions of the magnetoresistive elements according to the first embodiment and the modifications may be applied to the following other embodiments and modifications thereof. Of course, the dimensions of the magnetoresistive elements according to the first embodiment and the modifications thereof are just illustrative, but the invention is not limited thereto.

In the magnetic field detectors manufactured according to the first embodiment and the modifications thereof, since a stray field is formed inside the magnetoresistive element having a circular ring shape, the stray field is circulated in the magnetoresistive element, and does not leak to the outside of the element. As a result, there is no mutual interference due to the stray field.

When the magnetic bead is magnetized by a magnetic field applied from the outside, a weak magnetic field is generated, and the generated magnetic field has an effect on the magnetization direction of the free layer, which causes a variation in the output voltage of the magnetoresistive element. The variation in the output voltage makes it possible to detect the magnetic bead.

Figure 12A:
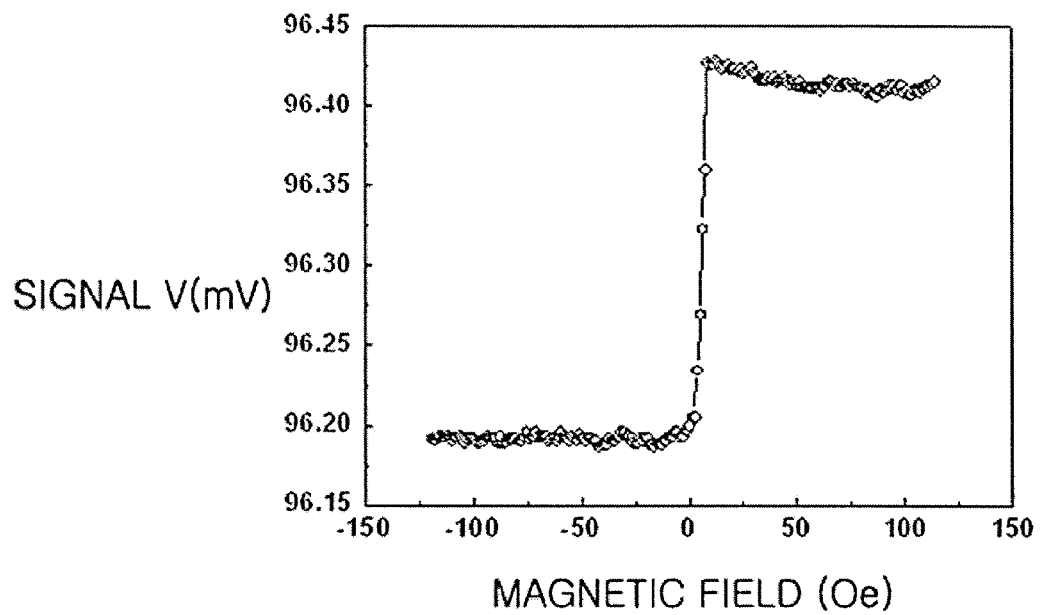
FIGS. 12A to 12C are graphs illustrating the relationships between voltages and magnetic fields applied to magnetic field detectors provided with magnetoresistive elements having a circular ring shape, an elliptical ring shape, and a square ring shape, respectively.
Figure 12B:
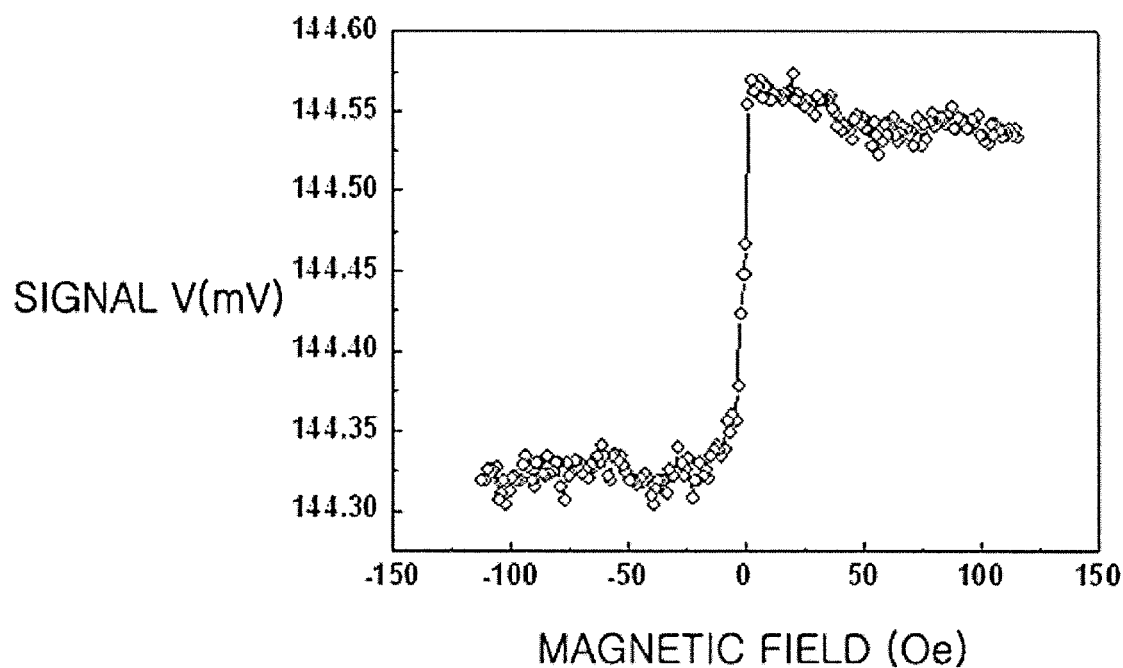
Figure 12C:
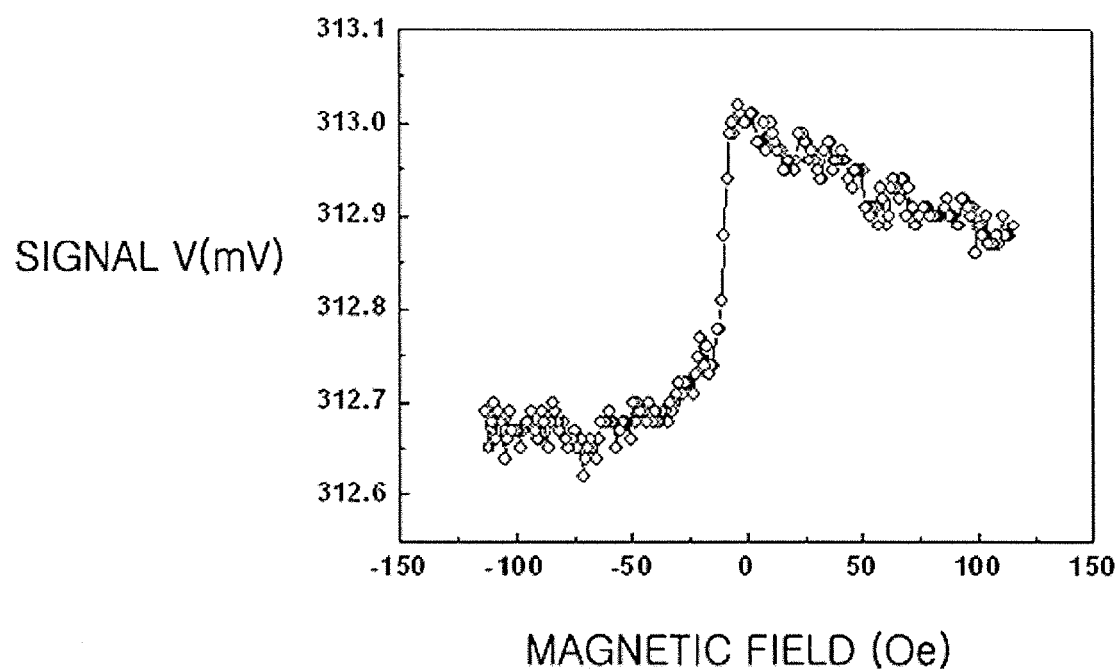

FIGS. 12A to 12C are graphs illustrating the relationships between output voltages and magnetic fields applied to the magnetic field detectors provided with the magnetoresistive elements having a circular ring shape, an elliptical ring shape, and a rectangular ring shape, respectively. As can be seen from FIGS. 12A to 12C, a rapid voltage variation occurs when the strength of the external magnetic field is around 0 (zero) oersted (Oe). These results prove that the magnetic field detector manufactured by the above-mentioned manufacturing method can detect a very weak magnetic field.

Second Embodiment

FIGS. 13A to 19B are diagrams sequentially illustrating a method of manufacturing a magnetic field detector according to a second embodiment of the invention. The magnetic field detector according to the second embodiment differs from the magnetic field detector according to the first embodiment in that it further includes vertical electrodes (vertical electrode pads).

Figure 13A:
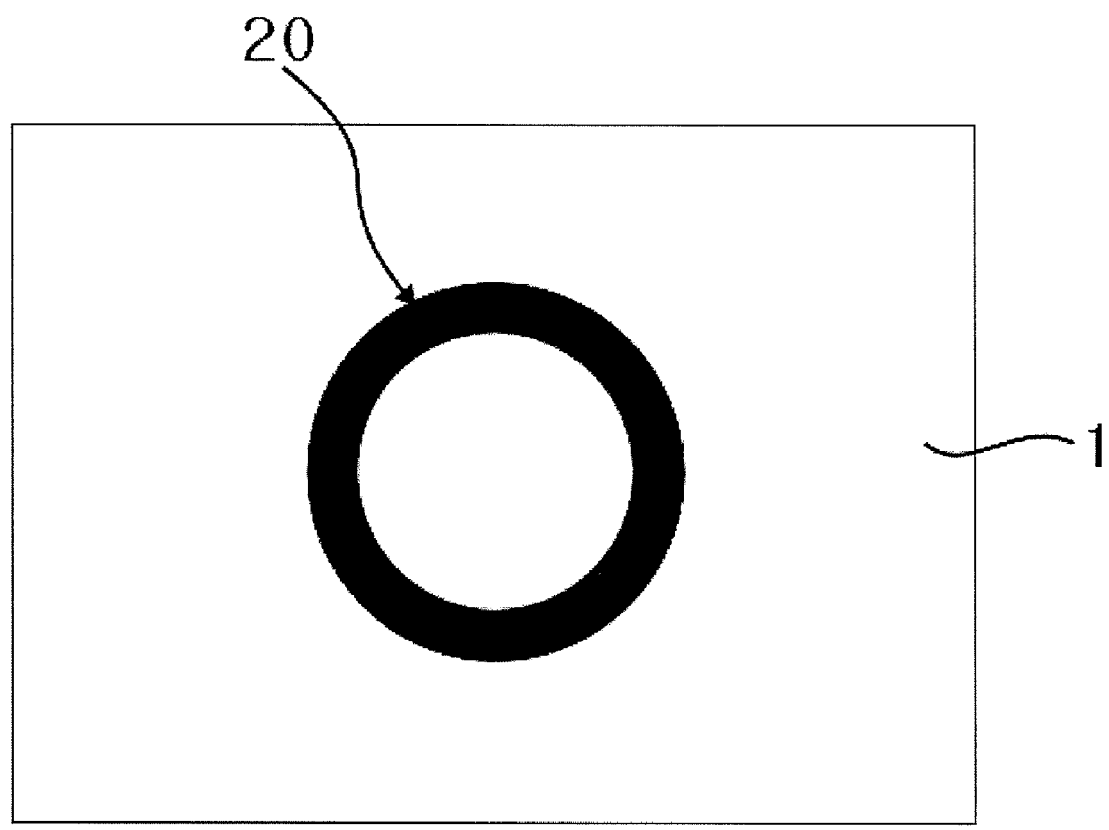
FIGS. 13A to 19B are diagrams sequentially illustrating a method of manufacturing a magnetic field detector according to a second embodiment of the invention.
Figure 13B:
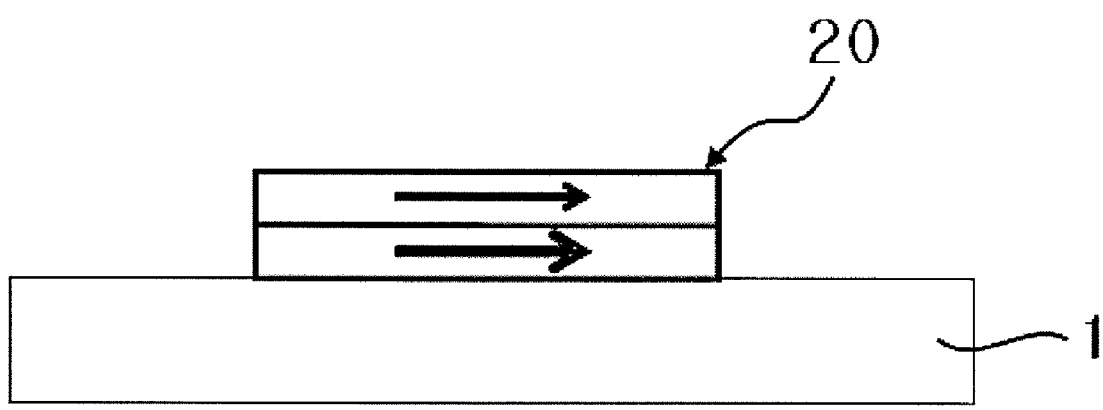

First, a giant magnetoresistive thin film 2 is formed on a substrate 1 by vapor deposition and then etched to form a magnetoresistive element 20 with a circular ring shape (see FIGS. 13A and 13B). In the etching process, dry etching, such as an Ar gas ion milling method, is performed on the giant magnetoresistive thin film 2 shown in FIG. 1C to etch all the portions of the film except a circular ring portion. FIG. 13A is a plan view, and FIG. 13B is a diagram illustrating the arrangement of the substrate 1 and the magnetoresistive element 20.

Figure 14A:
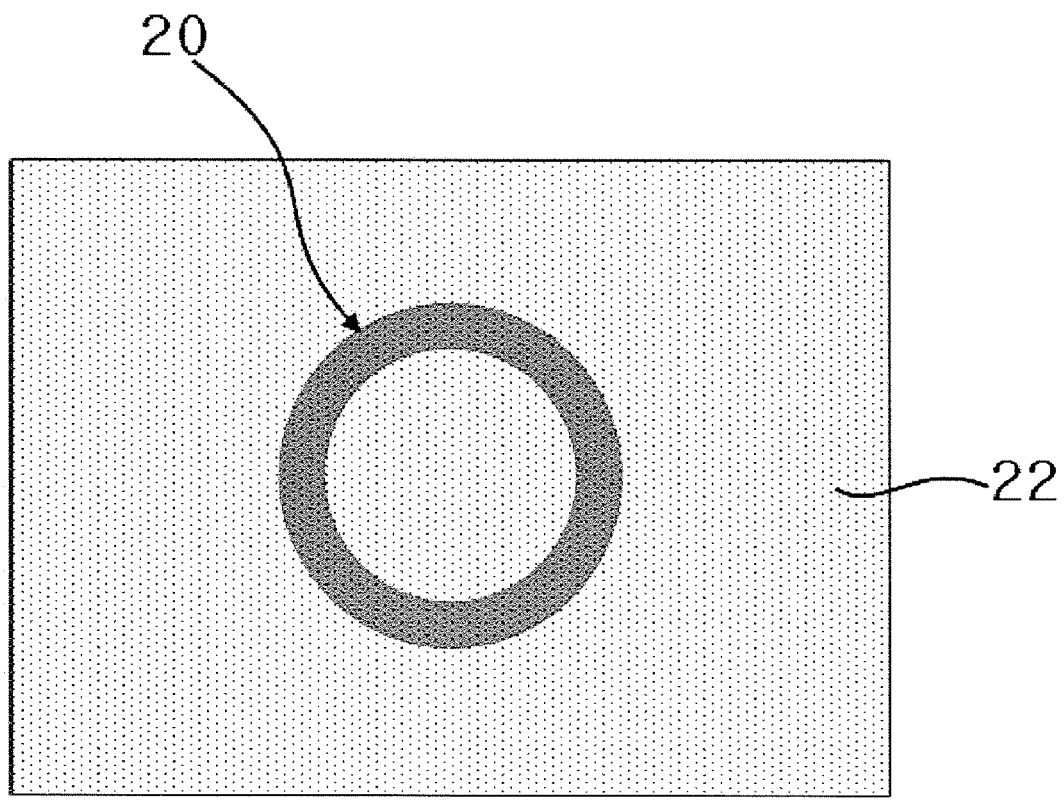
Figure 14B:
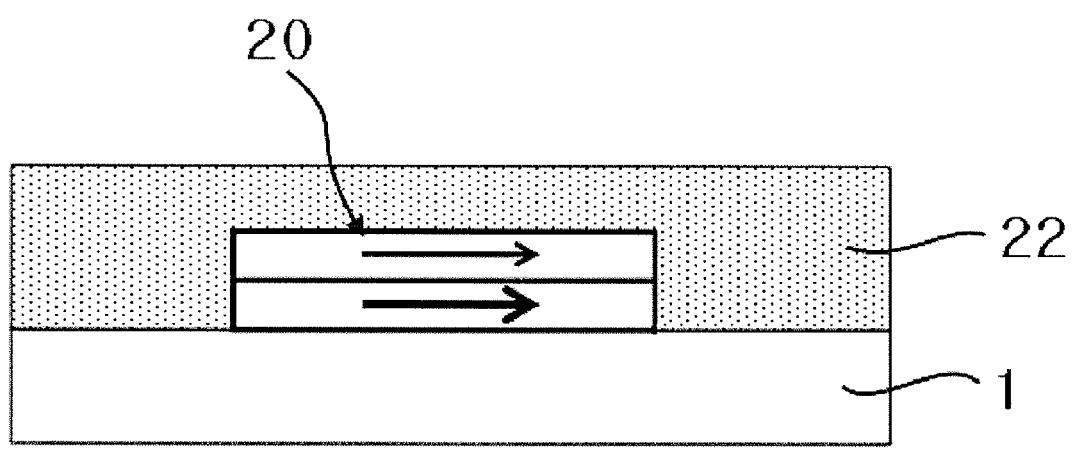

As shown in FIGS. 14A and 14B, a metal thin film layer 22 formed of Au is deposited on the substrate 1 and the magnetoresistive element 20. For example, Au is grown with a thickness of about 150 nm by a sputtering deposition method under the conditions of an argon gas pressure of about $3 \times 10^{-4}$ Torr, a sputtering power of about 60 W, and room temperature, thereby forming the metal thin film layer 22. FIG. 14A is a plan view, and FIG. 14B is a diagram illustrating the deposited metal thin film layer 22. The metal thin film layer 22 may be formed of Ta.

Figure 15A:
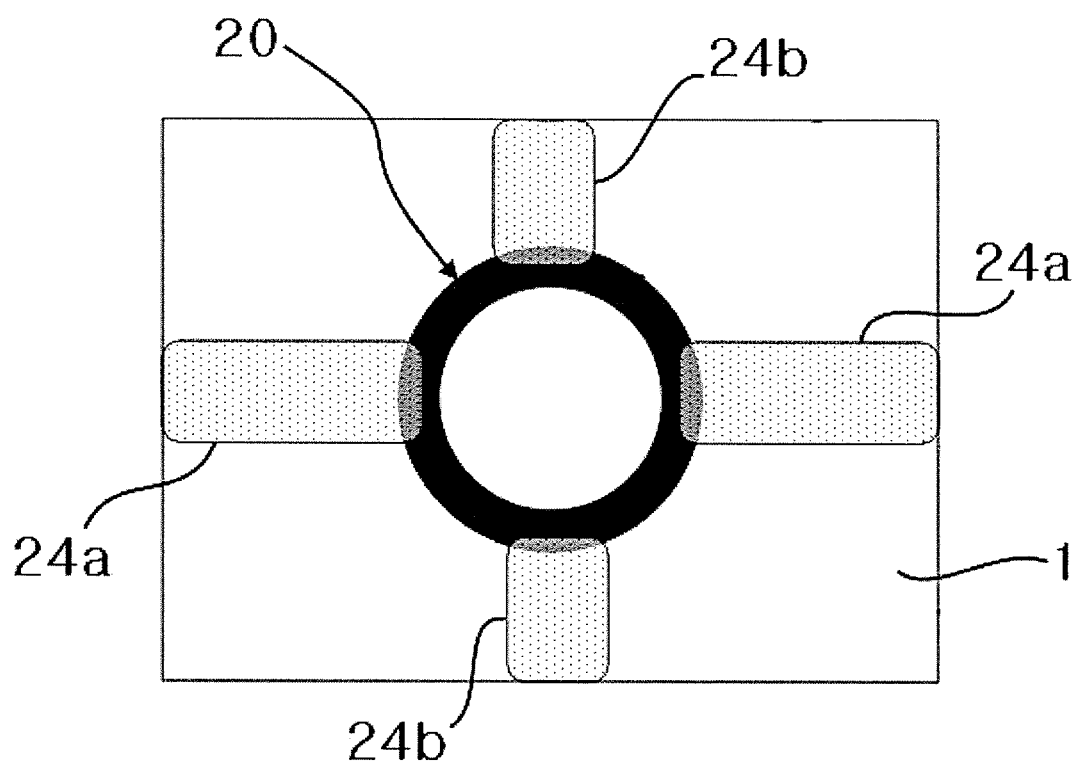
Figure 15B:
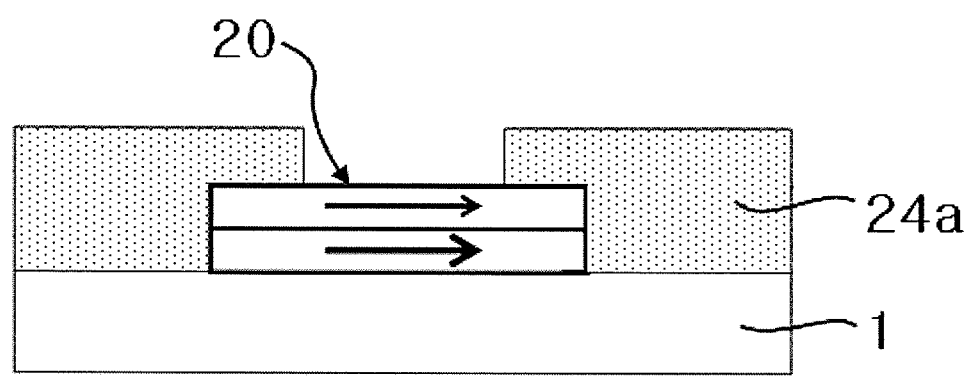

As shown in FIGS. 15A and 15B, horizontal electrode pads 24a and vertical electrode pads 24b are formed. The horizontal electrode pads 24a are used as electrodes for applying a current and measuring a horizontal voltage. The vertical electrode pads 24b are used as electrodes for measuring an output voltage (that is, a vertical voltage) in a direction orthogonal to the direction in which a current flows to the magnetoresistive element 20. The horizontal and vertical electrode pads 24a and 24b are formed by a lift-up method, using dry etching or a negative photosensitive mask. In this case, all the portions of the metal thin film layer 22 except for portions serving as the electrode pads 24a and 24b are selectively removed. For example, the horizontal electrode pads 24a are formed in the horizontal direction so as to face each other with the magnetoresistive element 20 interposed therebetween (that is, so as to be positioned on the left and right of the magnetoresistive element 20). The vertical electrode pads 24b are formed in the vertical direction so as to face each other with the magnetoresistive element 20 interposed therebetween (that is, so as to be positioned on the upper and lower sides of the magnetoresistive element 20). That is, a line lining the horizontal electrode pads 24a in the horizontal direction is orthogonal to a line linking the vertical electrode pads 24b in the vertical direction. FIG. 15A is a plan view, and FIG. 15B is a diagram illustrating the formed electrode pads 24a and 24b.

Figure 16A:
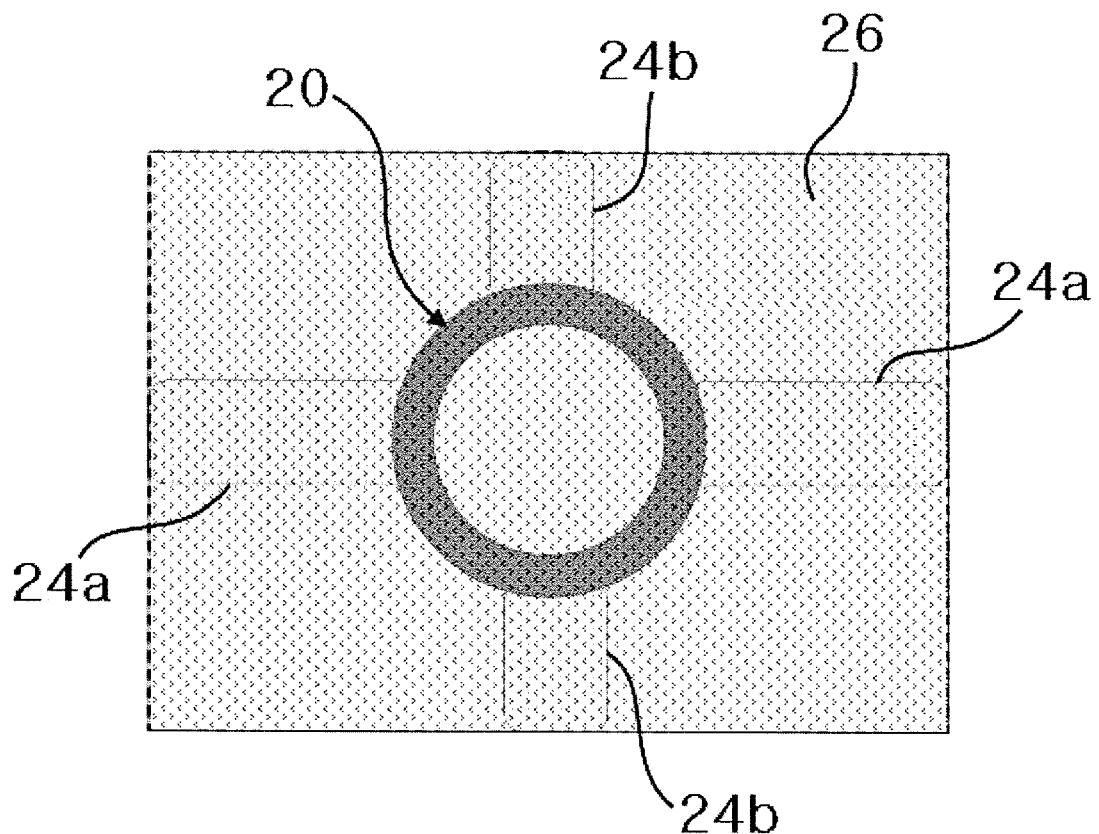
Figure 16B:
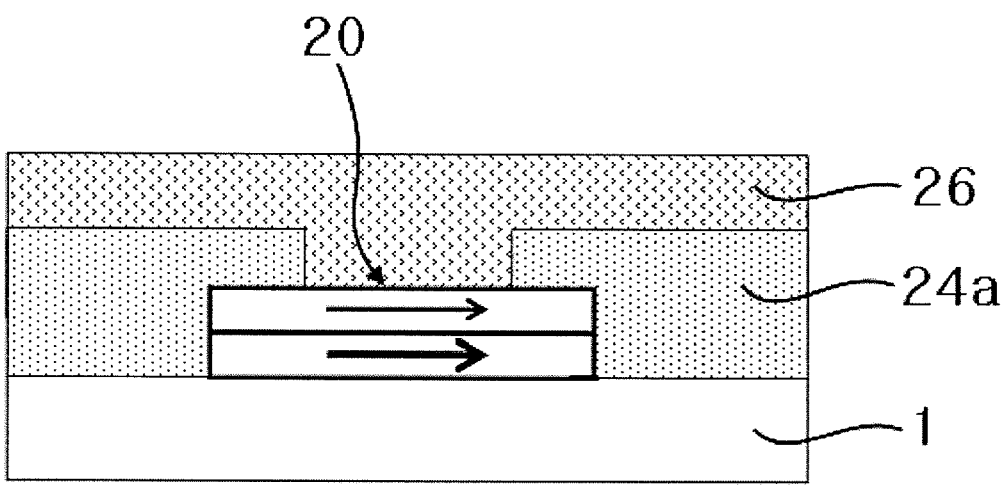

As shown in FIGS. 16A and 16B, an insulating thin film layer 26 is deposited on the substrate 1, the magnetoresistive element 20, and the electrode pads 24a and 24b. The insulating thin film layer 26 is formed of $SiO_2$ or $Si_3N_4$. In order to prevent the magnetoresistive element 20 and the electrode pads 24a and 24b from being corroded by an analytical solution, for example, $SiO_2$ or $Si_3N_4$ is grown with a thickness of about 50 to 300 nm (preferably, 150 nm) by a sputtering deposition method under the conditions of an argon gas pressure of about $3 \times 10^{-4}$ Torr, a sputtering power of about 100 W, and room temperature, thereby forming the $SiO_2$ or $Si_3N_4$ insulating thin film layer 26. FIG. 16A is a plan view, and FIG. 16B is a diagram illustrating the formed insulating thin film layer 26.

Figure 17A:
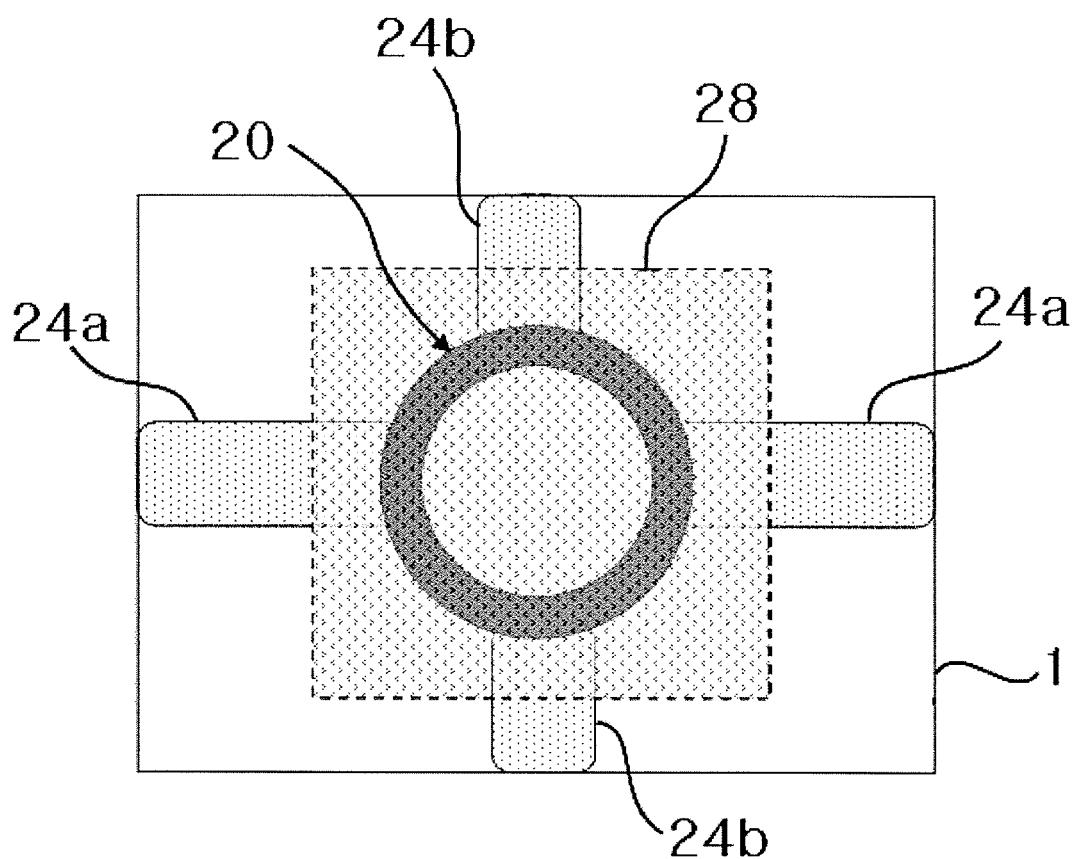
Figure 17B:
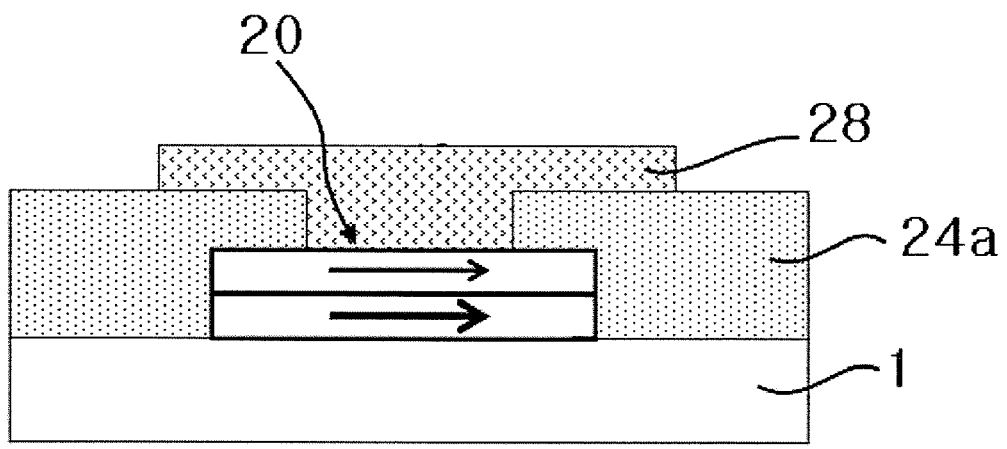

As shown in FIGS. 17A and 17B, the insulating thin film layer 26 is partially removed to form an insulating protective layer 28. All the portions of the insulating thin film layer 26 except a portion serving as the insulating protective layer are removed by a lift-up method, using dry etching, such as an Ar gas ion milling method, or a negative photosensitive mask, thereby forming the insulating protective layer 28. The insulating protective layer 28 covers the entire surface of the magnetoresistive element 20 and portions of the horizontal and vertical electrode pads 24a and 24b. FIG. 17A is a plan view, and FIG. 17B is a diagram illustrating the formed insulating protective layer 28.

Figure 18A:
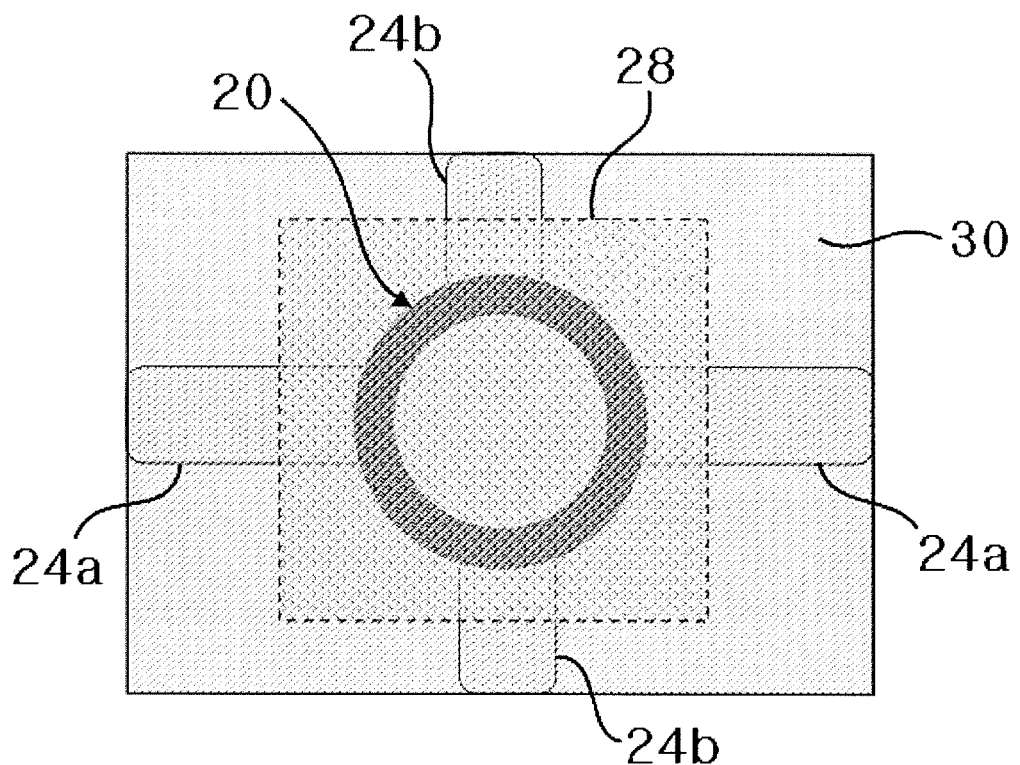
Figure 18B:
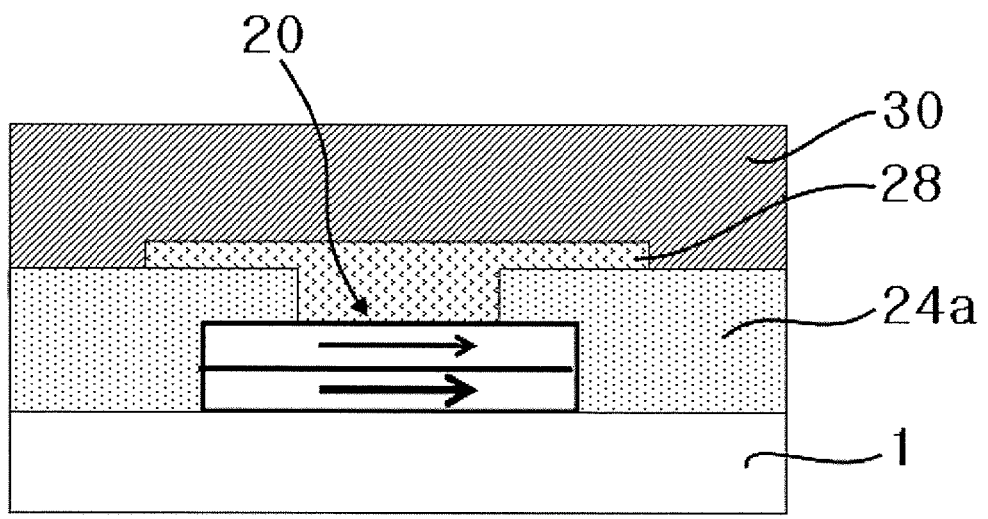

As shown in FIGS. 18A and 18B, a photosensitive magnetic bead thin film 30 is deposited on the substrate 1, the electrode pads 24a and 24b, and the insulating protective layer 28. The photosensitive magnetic bead thin film 30 is formed with a thickness of about 1 to 2 μm (preferably, about 1.5 μm) at room temperature by spin coating at a speed of about 3000 to 5000 rpm. FIG. 18A is a plan view, and FIG. 18B is a diagram illustrating the deposited photosensitive magnetic bead thin film 30.

Figure 19A:
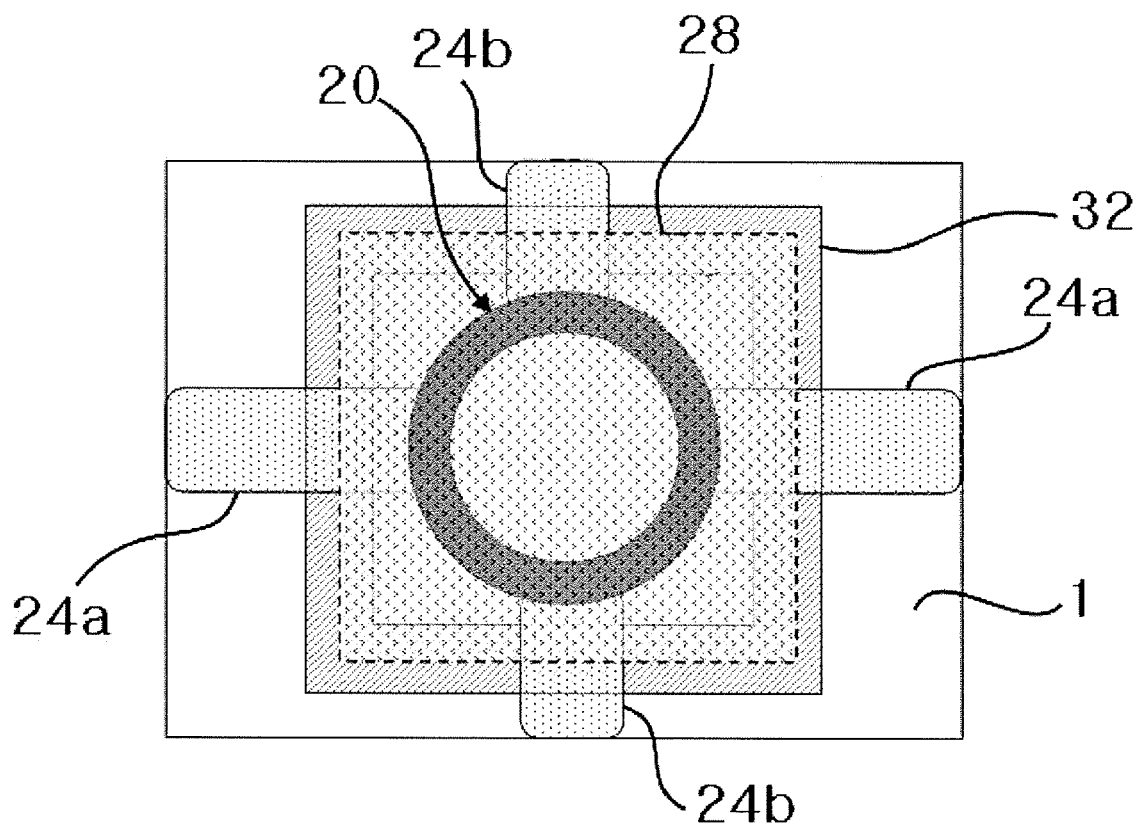
Figure 19B:
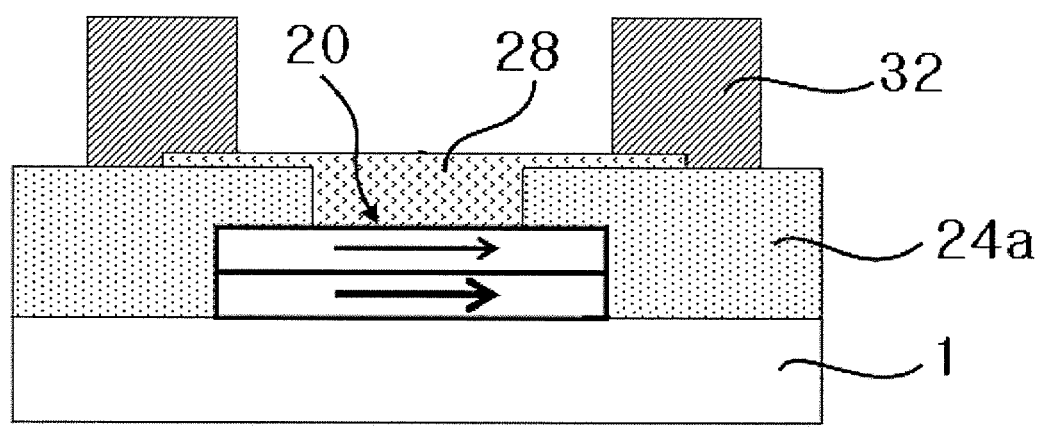

As shown in FIGS. 19A and 19B, the photosensitive magnetic bead thin film 30 is selectively removed to form a magnetic bead limiting layer 32. The magnetic bead limiting layer 32 is formed by removing all the portions of the photosensitive magnetic bead thin film 30 except a portion serving as the magnetic bead limiting layer 32, using a lift-up method and a negative photosensitive mask. The magnetic bead limiting layer 32 can impound a magnetic bead analysis solution therein such that the magnetic bead analysis solution is positioned close to the magnetoresistive element 20. FIG. 19A is a plan view and FIG. 19B is a diagram illustrating the formed magnetic bead limiting layer 32.

The magnetic field detector manufactured through the above-mentioned processes includes the magnetoresistive element 20 with a circular ring shape that is grown on the Si single crystal substrate 1, the horizontal electrodes 24a for applying a current to the magnetoresistive element 20 and measuring a horizontal voltage, and the vertical electrodes 24b for measuring a vertical voltage, as shown in FIGS. 19A and 19B. The insulating protective layer 28 is deposited on the entire surface of the magnetoresistive element 20 and portions of the electrodes 24a and 24b, and the magnetic bead limiting layer 32 is formed on the magnetoresistive element 20, the electrodes 24a and 24b, and the insulating protective layer 28. The horizontal electrodes 24a mean the horizontal electrode pads described with reference to FIGS. 15A and 15B, and the vertical electrodes 24b mean the vertical electrode pads described with reference to FIGS. 15A and 15B.

FIGS. 20A to 22B are diagrams illustrating modifications of the second embodiment of the invention.

Figure 20A:
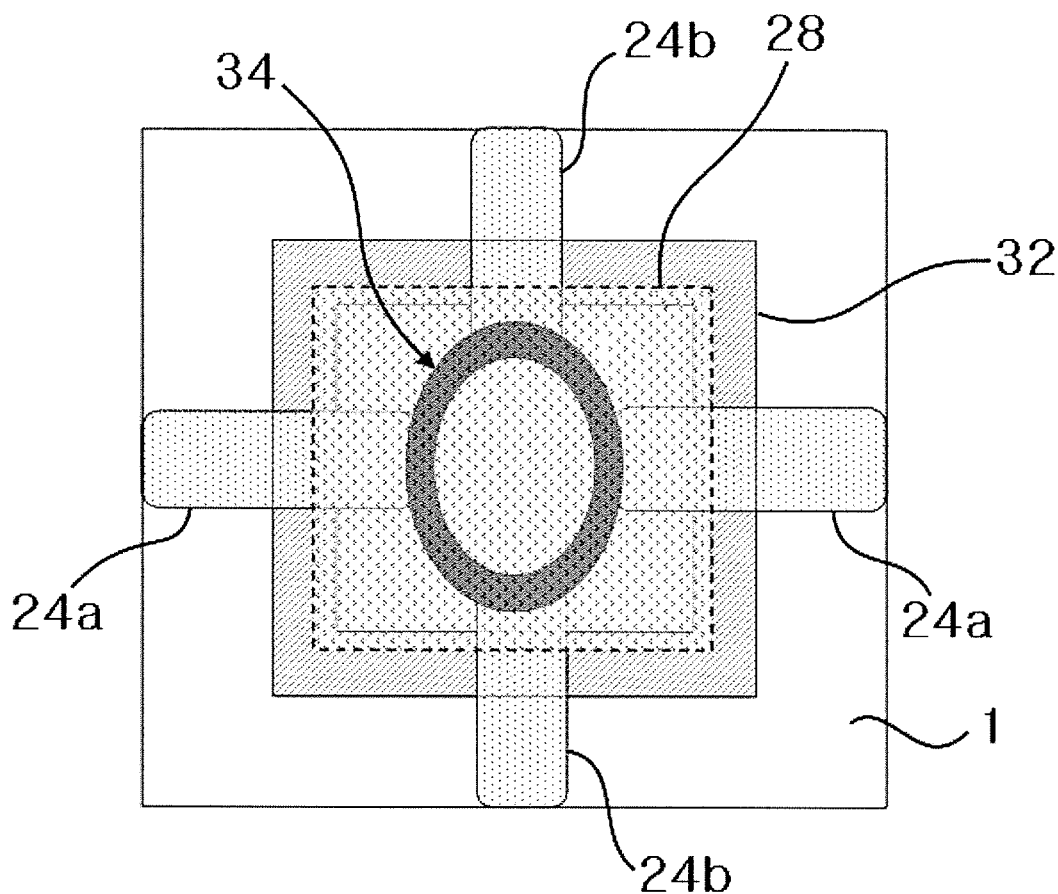
FIGS. 20A to 22B are diagrams illustrating modifications of the second embodiment.
Figure 20B:
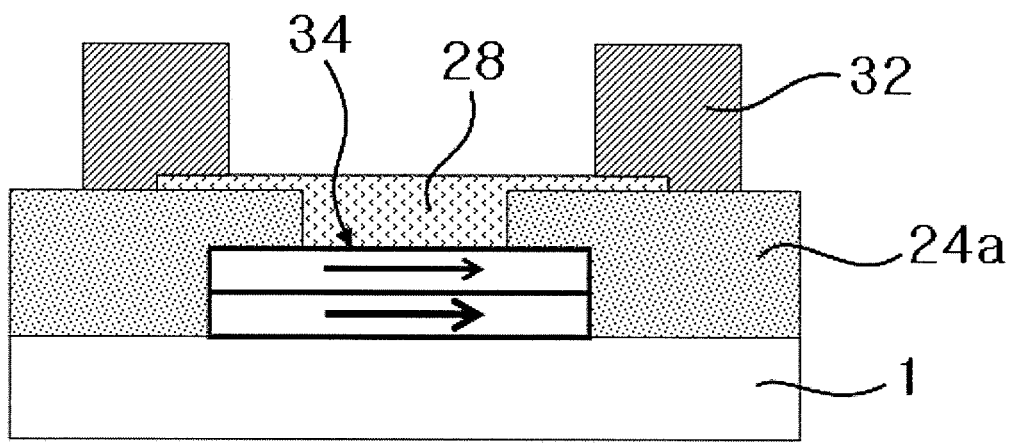

A magnetoresistive element shown in FIGS. 20A and 20B is similar to that shown in FIGS. 19A and 19B except that it has an elliptical ring shape, and the magnetoresistive element is manufactured by the same method as described above. In FIGS. 20A and 20B, reference numeral 34 denotes the magnetoresistive element with the elliptical ring shape. FIG. 20A is a plan view, and FIG. 20B is a diagram illustrating a magnetic field detector including the magnetoresistive element 34 with the elliptical ring shape.

Figure 21A:
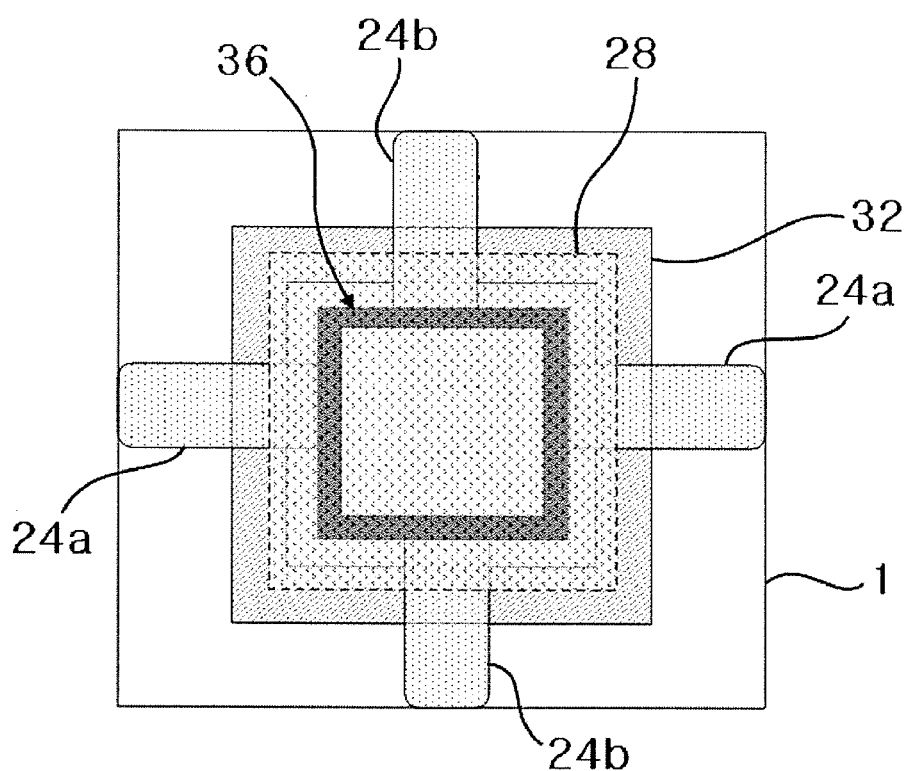
Figure 21B:
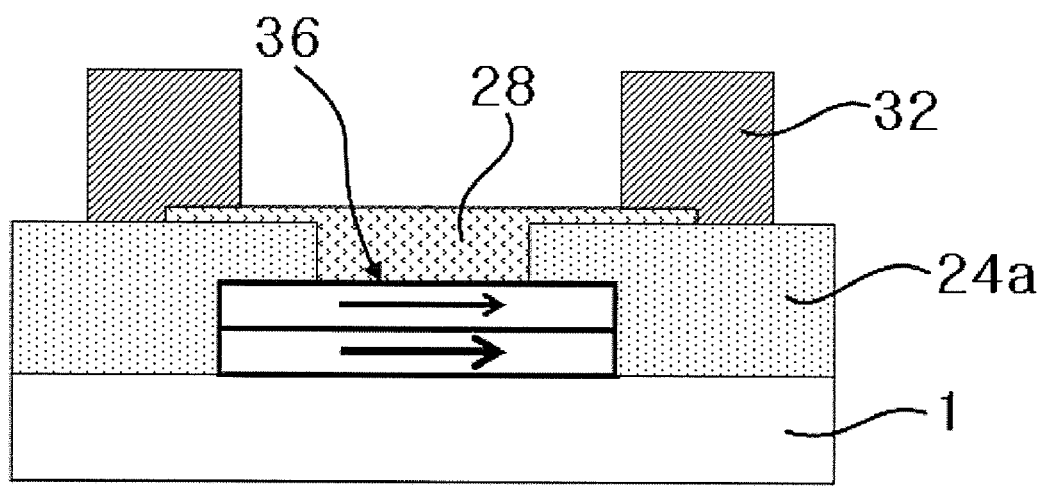

A magnetoresistive element shown in FIGS. 21A and 21B is similar to that shown in FIGS. 19A and 19B except that it has a square ring shape, and the magnetoresistive element is manufactured by the same method as described above. In FIGS. 21A and 21B, reference numeral 36 denotes the magnetoresistive element with the square ring shape. FIG. 21A is a plan view, and FIG. 21B is a diagram illustrating a magnetic field detector including the magnetoresistive element 36 with the square ring shape.

Figure 22A:
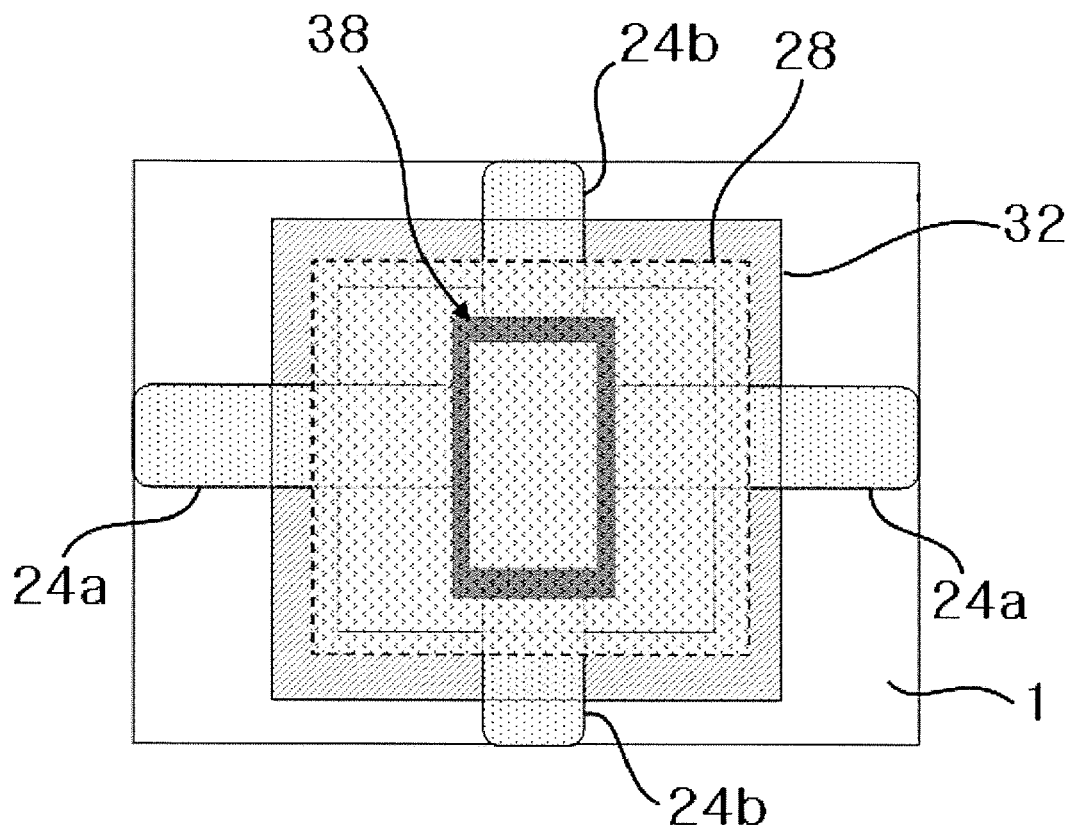
Figure 22B:
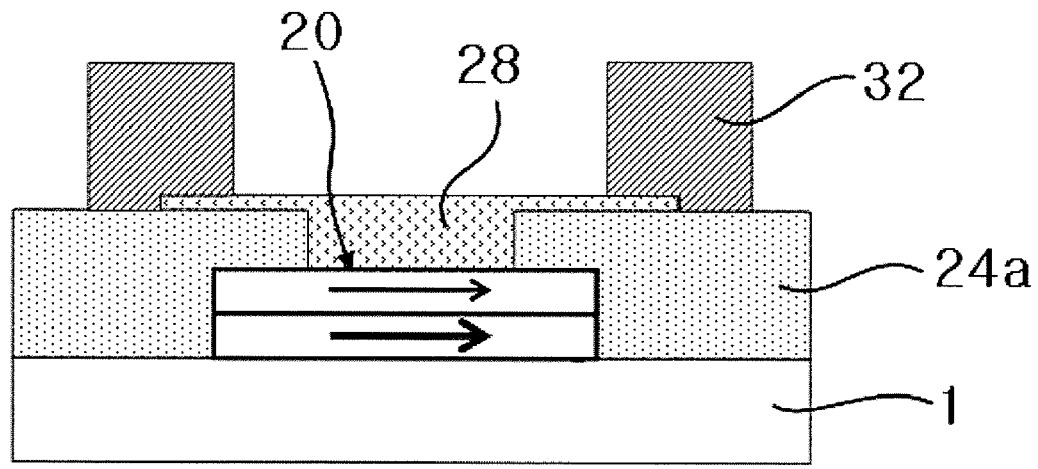

A magnetoresistive element shown in FIGS. 22A and 22B is similar to that shown in FIGS. 19A and 19B except that it has a rectangular ring shape, and the magnetoresistive element is manufactured by the same method as described above. In FIGS. 22A and 22B, reference numeral 38 denotes the magnetoresistive element with the rectangular ring shape. FIG. 22A is a plan view, and FIG. 22B is a diagram illustrating a magnetic field detector including the magnetoresistive element 38 with the rectangular ring shape.

In the magnetic field detectors manufactured according to the second embodiment and the modifications thereof, since a stray field is formed inside the magnetoresistive element having a circular ring shape, the stray field is circulated in the magnetoresistive element, but does not leak to the outside of the element. As a result, there is no mutual interference due to the stray field.

When the magnetic bead is magnetized by a magnetic field applied from the outside, a weak magnetic field is generated, and the generated magnetic field has an effect on the magnetization direction of the free layer, which causes a variation in the output voltage of the magnetoresistive element. The variation in the output voltage makes it possible to detect the magnetic bead.

Third Embodiment

FIGS. 23A to 29B are diagrams sequentially illustrating a method of manufacturing a magnetic field detector according to a third embodiment of the invention. The third embodiment differs from the first embodiment in that a plurality of magnetoresistive elements having circular ring shapes (that is, a one-dimensional array structure) are arranged in a line. Since a manufacturing method according to the third embodiment is most similar to that according to the first embodiment, those skilled in the art can easily understand the manufacturing method according to the third embodiment.

Figure 23A:
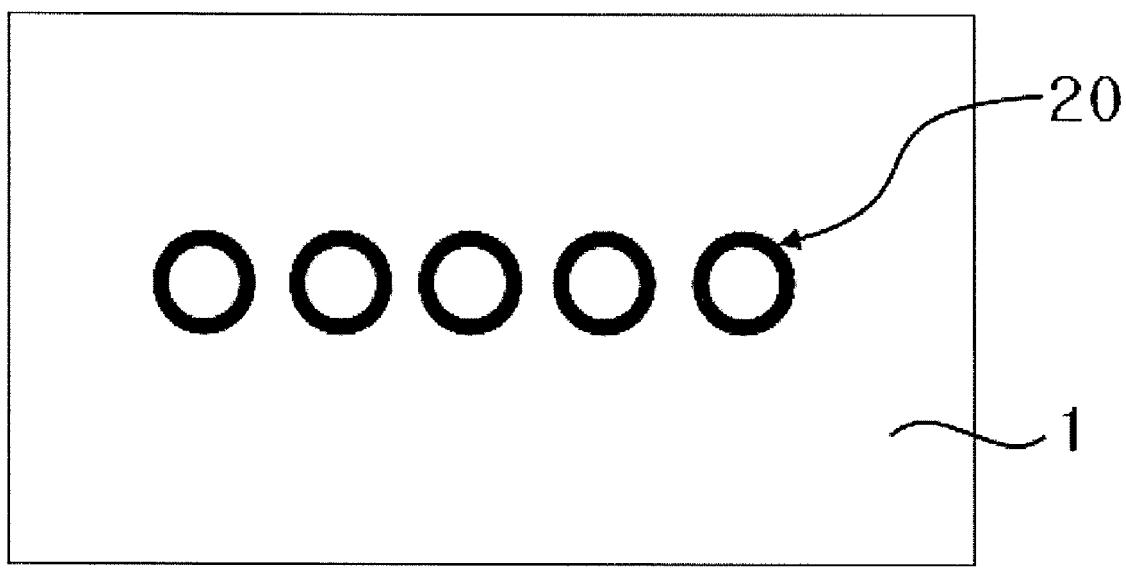
FIGS. 23A to 29B are diagrams sequentially illustrating a method of manufacturing a magnetic field detector according to a third embodiment of the invention.
Figure 23B:
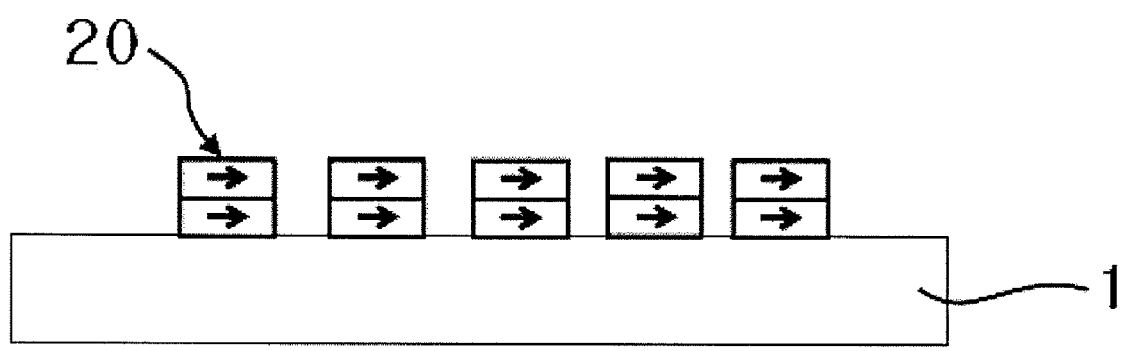

First, a giant magnetoresistive thin film 2 is formed on a substrate 1 by vapor deposition and then etched to form an array of a plurality of magnetoresistive elements 20 with circular ring shapes (see FIGS. 23A and 23B). The plurality of magnetoresistive elements 20 are arrayed in a line at equal distances. In the etching process, dry etching, such as an Ar gas ion milling method, is performed on the giant magnetoresistive thin film 2 shown in FIG. 1C to etch all the portions of the film except circular ring portions. FIG. 23A is a plan view, and FIG. 23B is a diagram illustrating the arrangement of the substrate 1 and the plurality of magnetoresistive elements 20.

Figure 24A:
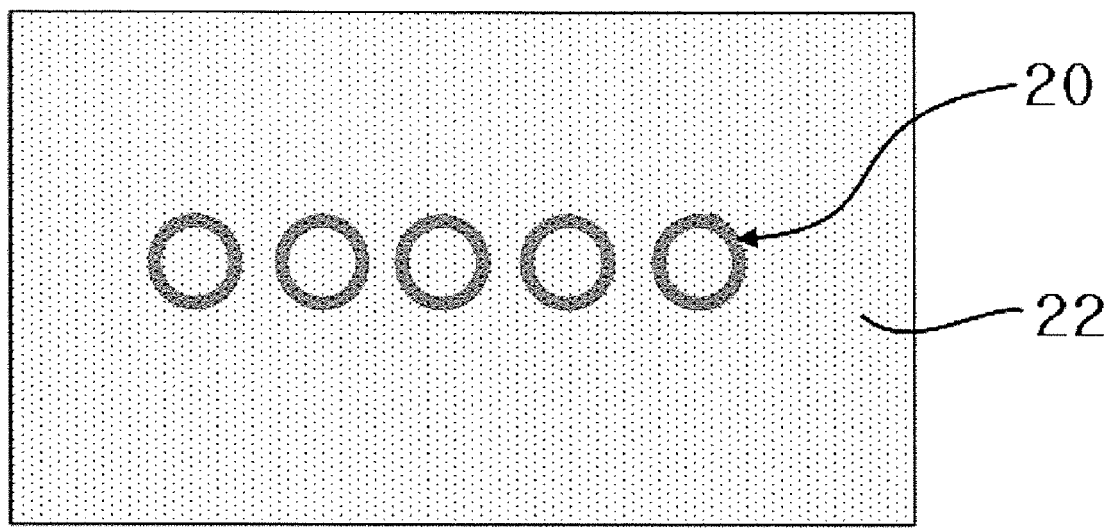
Figure 24B:
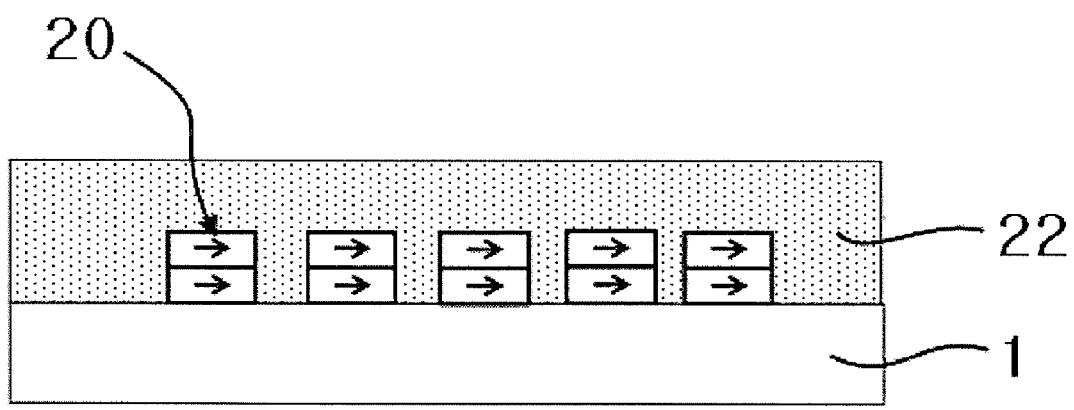

As shown in FIGS. 24A and 24B, a metal thin film layer 22 formed of Au is deposited on the substrate 1 and the plurality of magnetoresistive elements 20. For example, Au is grown with a thickness of about 150 nm by a sputtering deposition method under the conditions of an argon gas pressure of about $3 \times 10^{-4}$ Torr, a sputtering power of about 60 W, and room temperature, thereby forming the metal thin film layer 22. FIG. 24A is a plan view, and FIG. 24B is a diagram illustrating the deposited metal thin film layer 22. The metal thin film layer 22 may be formed of Ta.

Figure 25A:
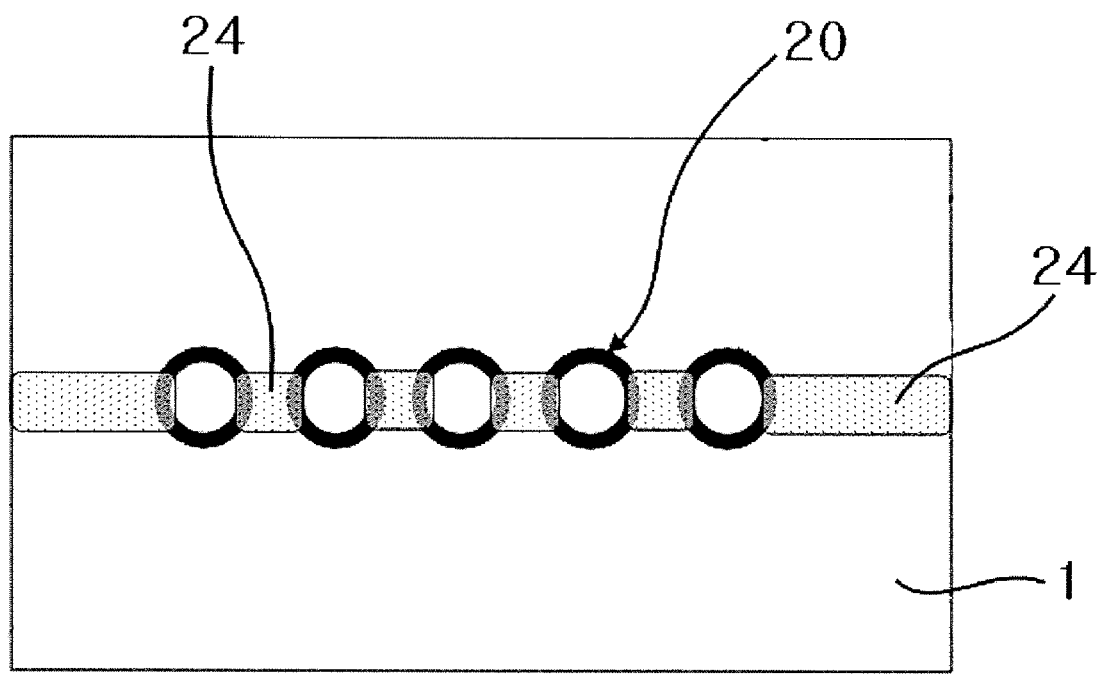
Figure 25B:
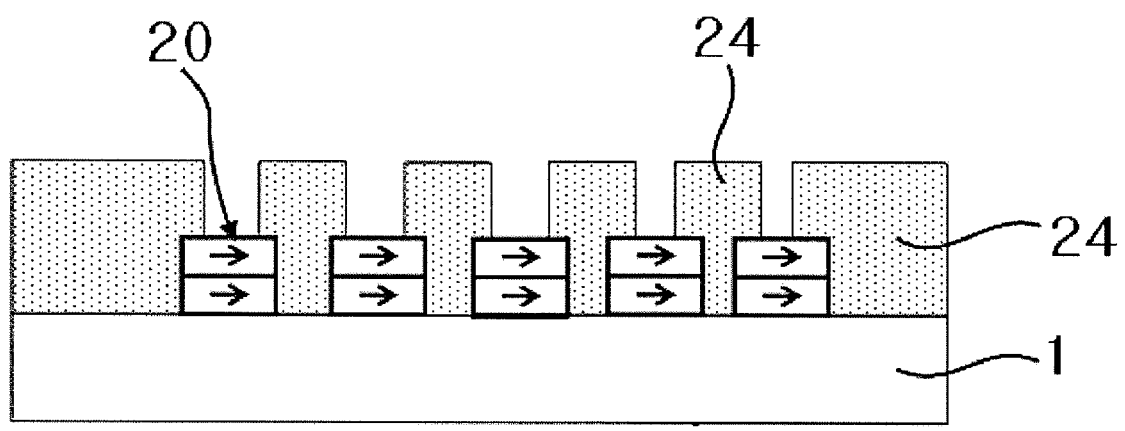

As shown in FIGS. 25A and 25B, electrode pads 24 are formed. The electrode pads 24 are used as electrodes for applying a current and measuring a horizontal voltage. The electrode pads 24 are formed by a lift-up method, using dry etching or a negative photosensitive mask. In this case, all the portions of the metal thin film layer 22 except for portions serving as the electrode pads 24 are removed. For example, the electrode pads 24 include electrode pads connecting the plurality of magnetoresistive elements 20 in the horizontal direction, and electrode pads extending from the rightmost and leftmost magnetoresistive elements 20 to the outside in the horizontal direction. FIG. 25A is a plan view, and FIG. 25B is a diagram illustrating the formed electrode pads 24.

Figure 26A:
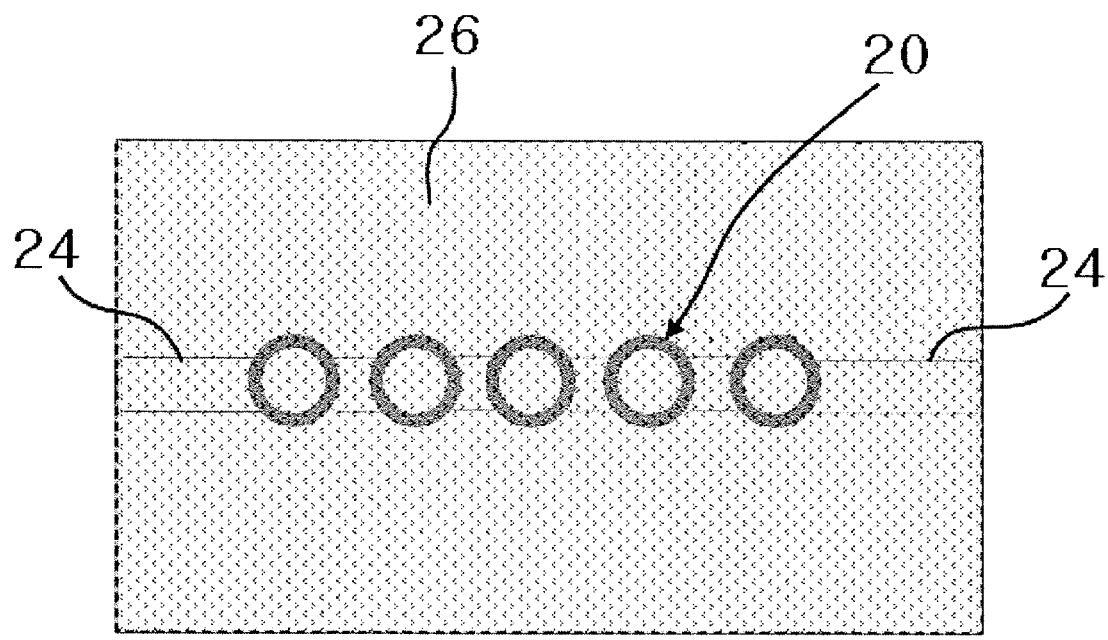
Figure 26B:
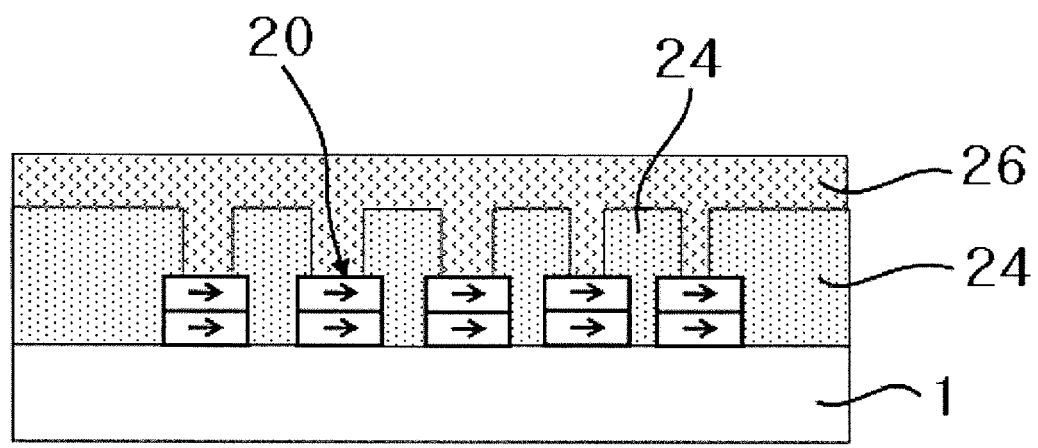

As shown in FIGS. 26A and 26B, an insulating thin film layer 26 is deposited on the substrate 1, the magnetoresistive elements 20, and the electrode pads 24. The insulating thin film layer 26 is formed of $SiO_2$ or $Si_3N_4$. In order to prevent the magnetoresistive elements 20 and the electrode pads 24 from corroded by an analytical solution, for example, $SiO_2$ or $Si_3N_4$ is grown with a thickness of about 50 to 300 nm (preferably, 150 nm) by a sputtering deposition method under the conditions of an argon gas pressure of about $3 \times 10^{-4}$ Torr, a sputtering power of about 100 W, and room temperature, thereby forming the $SiO_2$ or $Si_3N_4$ insulating thin film layer 26. FIG. 26A is a plan view, and FIG. 26B is a diagram illustrating the formed insulating thin film layer 26.

Figure 27A:
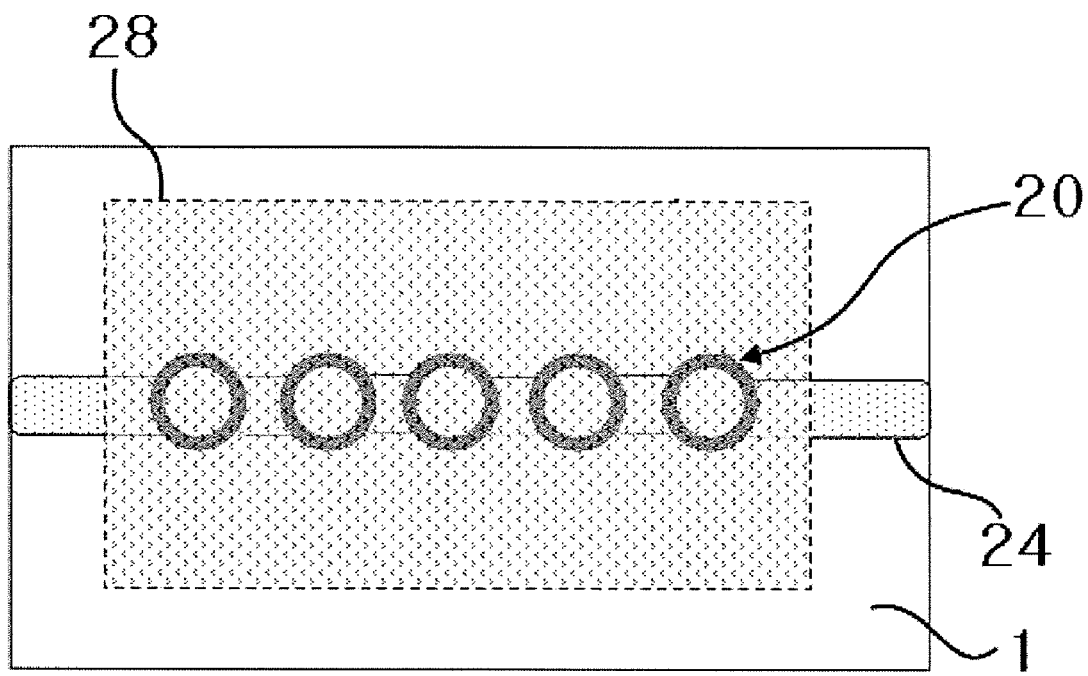
Figure 27B:
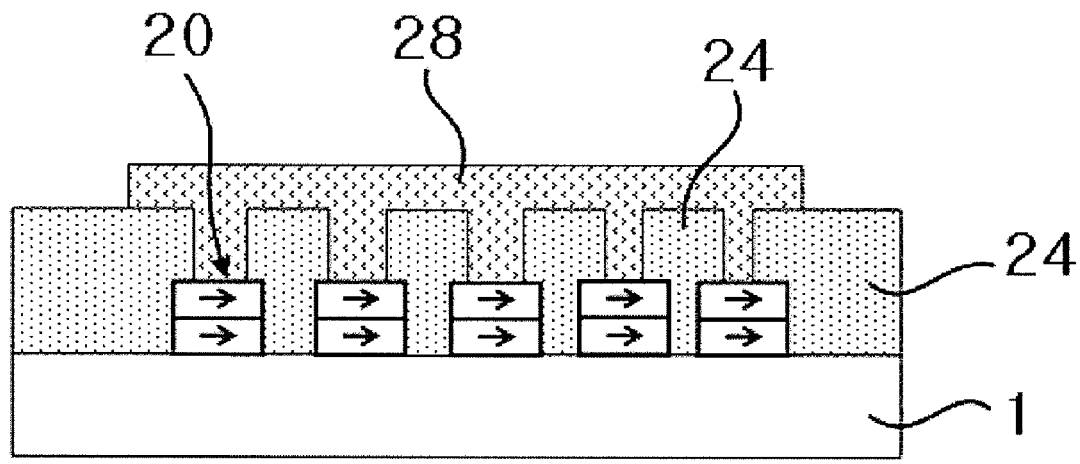

As shown in FIGS. 27A and 27B, the insulating thin film layer 26 is partially removed to form an insulating protective layer 28. All the portions of the insulating thin film layer 26 except a portion serving as the insulating protective layer are removed by a lift-up method, using dry etching, such as an Ar gas ion milling method, or a negative photosensitive mask, thereby forming the insulating protective layer 28. FIG. 27A is a plan view, and FIG. 27B is a diagram illustrating the formed insulating protective layer 28.

Figure 28A:
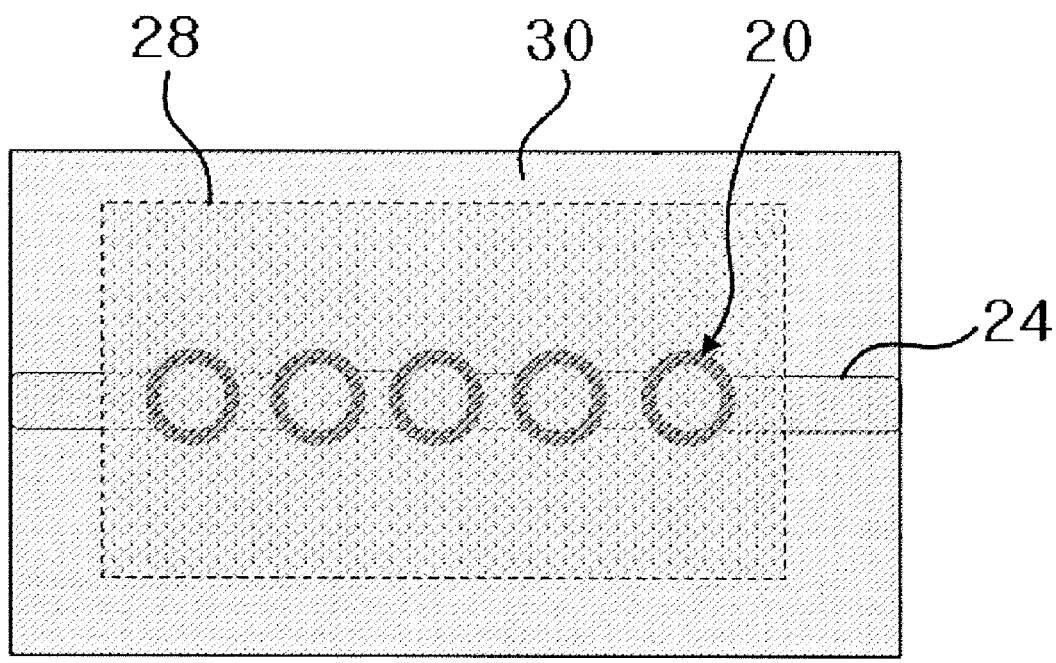
Figure 28B:
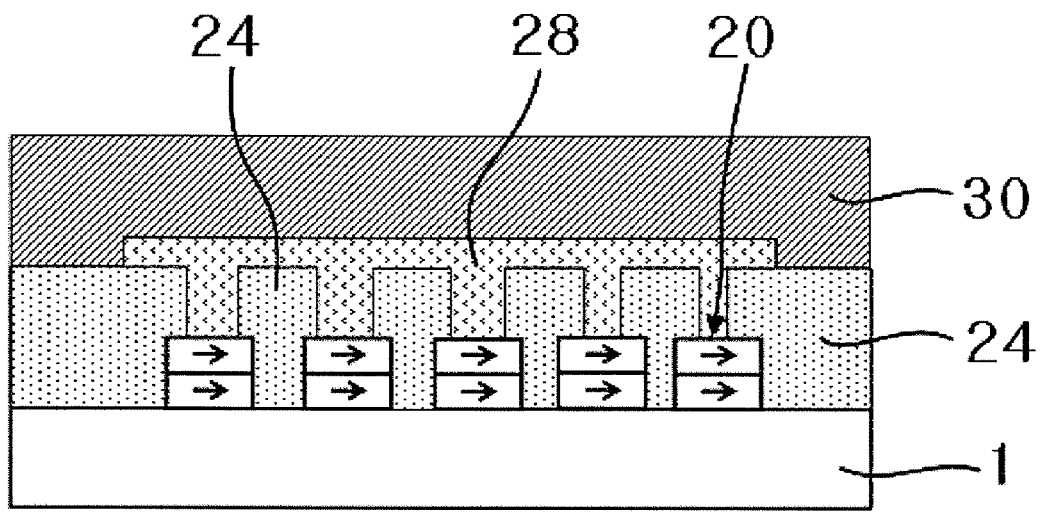

As shown in FIGS. 28A and 28B, a photosensitive magnetic bead thin film 30 is deposited on the substrate 1, the electrode pads 24, and the insulating protective layer 28. The photosensitive magnetic bead thin film 30 is formed with a thickness of about 1 to 2 µm (preferably, about 1.5 µm) at room temperature by spin coating at a speed of about 3000 to 5000 rpm. FIG. 28A is a plan view, and FIG. 28B is a diagram illustrating the deposited photosensitive magnetic bead thin film 30.

Figure 29A:
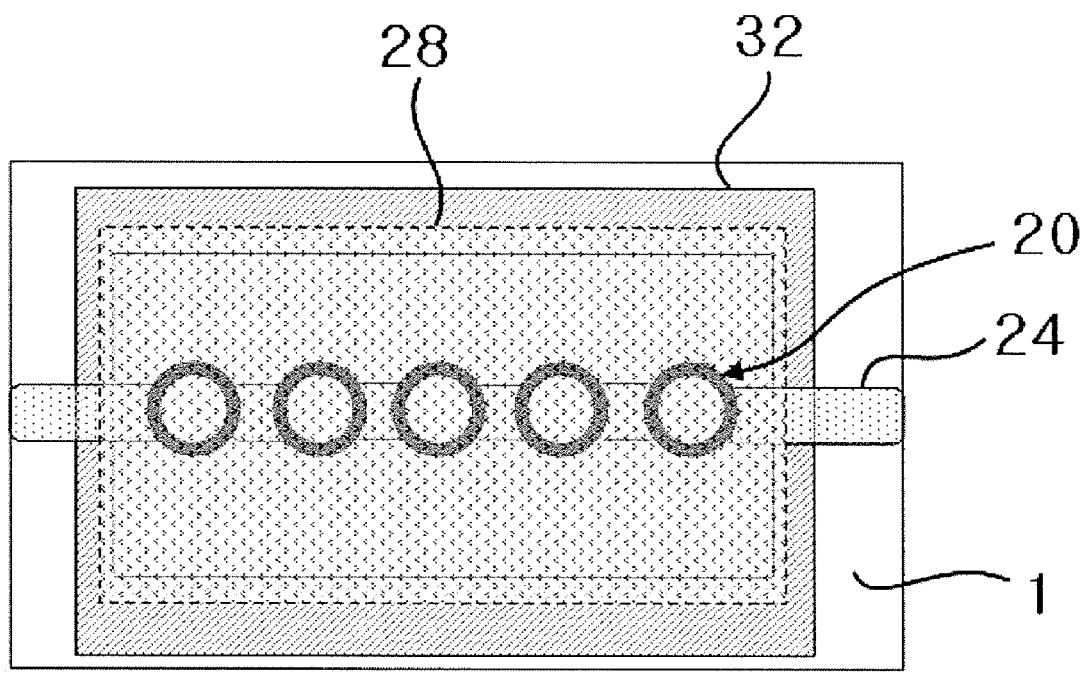
Figure 29B:
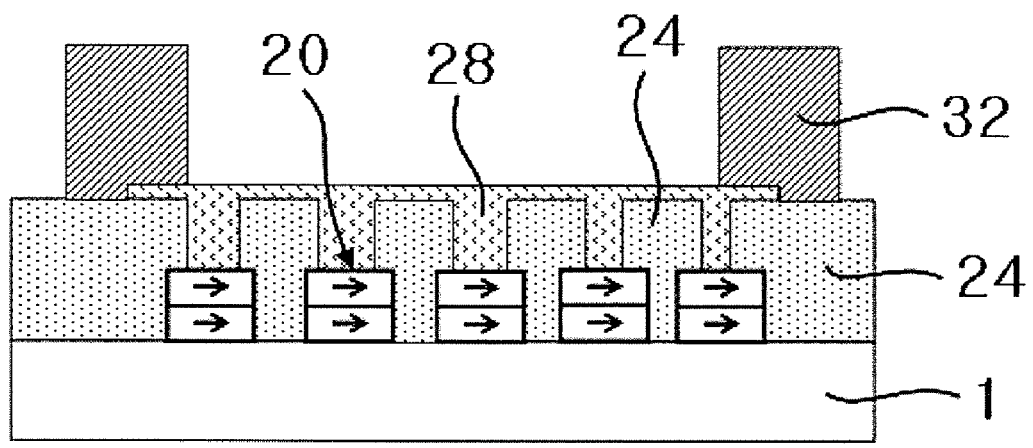

As shown in FIGS. 29A and 29B, the photosensitive magnetic bead thin film 30 is selectively removed to form a magnetic bead limiting layer 32. The magnetic bead limiting layer 32 is formed by removing all the portions of the photosensitive magnetic bead thin film 30 except a portion serving as the magnetic bead limiting layer 32, using a lift-up method and a negative photosensitive mask. The magnetic bead limiting layer 32 can impound a magnetic bead analysis solution therein such that the magnetic bead analysis solution is positioned close to the magnetoresistive element 20. FIG. 29A is a plan view, and FIG. 29B is a diagram illustrating the formed magnetic bead limiting layer 32.

The magnetic field detector manufactured through the above-mentioned processes includes the plurality of magnetoresistive elements 20 with circular ring shapes that are grown on the Si single crystal substrate 1, and the electrodes 24 for applying a current to the plurality of magnetoresistive elements 20 and measuring a horizontal voltage, as shown in FIGS. 29A and 29B. The insulating protective layer 28 is deposited on the entire surface of each of the plurality of magnetoresistive elements 20 and portions of the electrodes 24, and the magnetic bead limiting layer 32 is formed on the plurality of magnetoresistive elements 20, the electrodes 24, and the insulating protective layer 28. The electrodes 24 mean the electrode pads described with reference to FIGS. 25A and 25B, and may be called horizontal electrodes.

FIGS. 30A to 32B are diagrams illustrating modifications of the third embodiment of the invention.

Figure 30A:
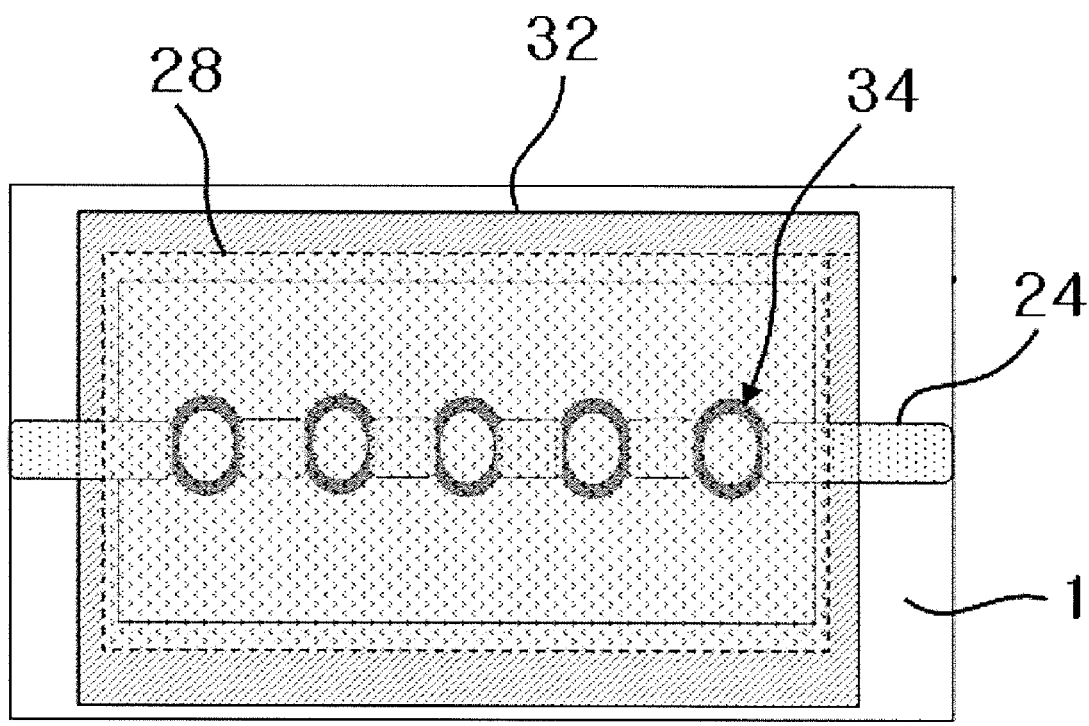
FIGS. 30A to 32B are diagrams illustrating modifications of the third embodiment.
Figure 30B:
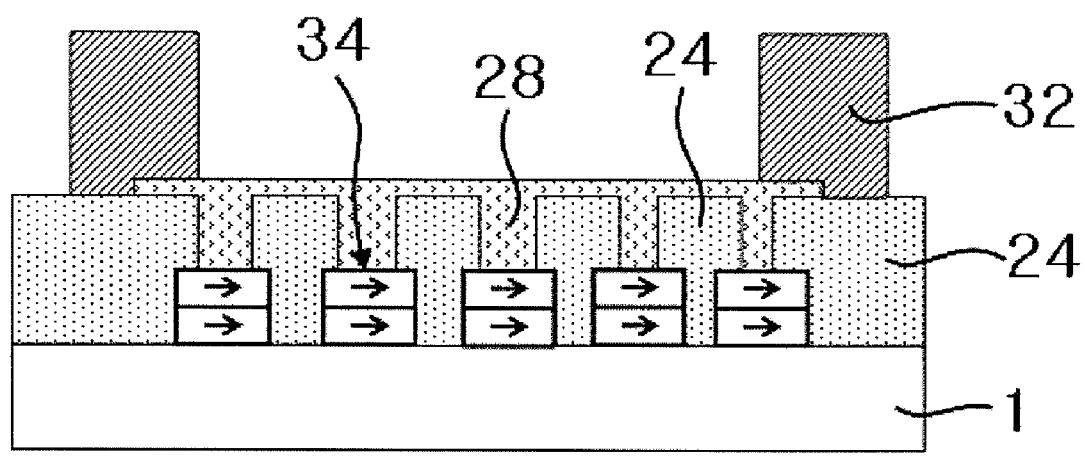

A magnetoresistive element shown in FIGS. 30A and 30B is similar to that shown in FIGS. 29A and 29B except that it has an elliptical ring shape, and the magnetoresistive element is manufactured by the same method as described above. In FIGS. 30A and 30B, reference numeral 34 denotes the magnetoresistive element with the elliptical ring shape. FIG. 30A is a plan view, and FIG. 30B is a diagram illustrating a magnetic field detector including a plurality of magnetoresistive elements 34 with the elliptical ring shapes.

Figure 31A:
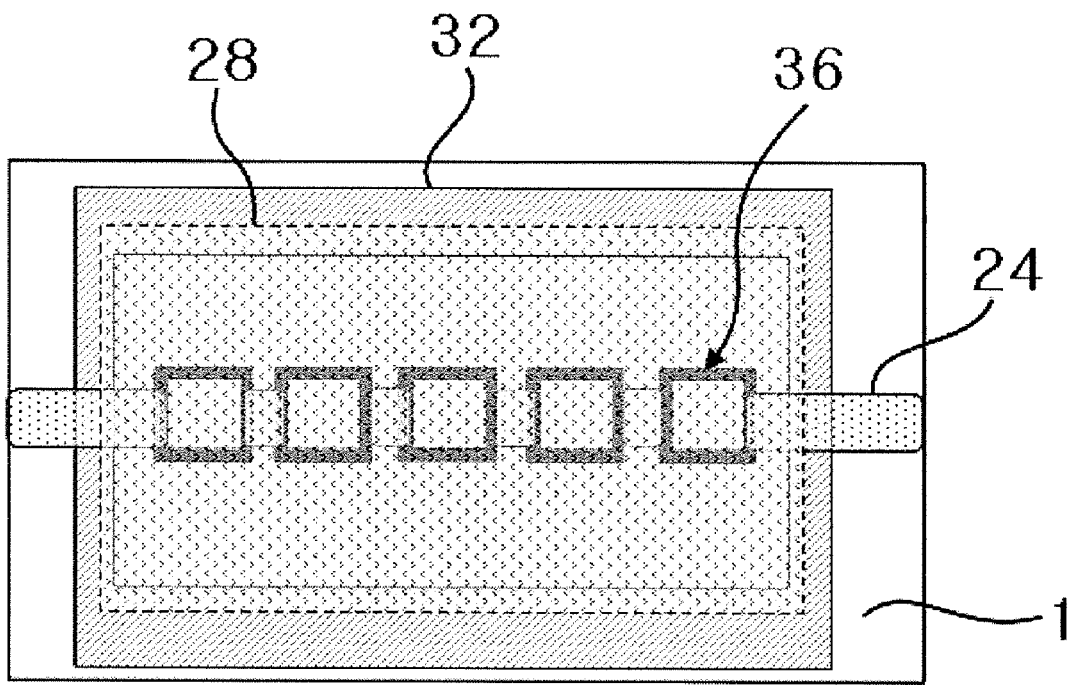
Figure 31B:
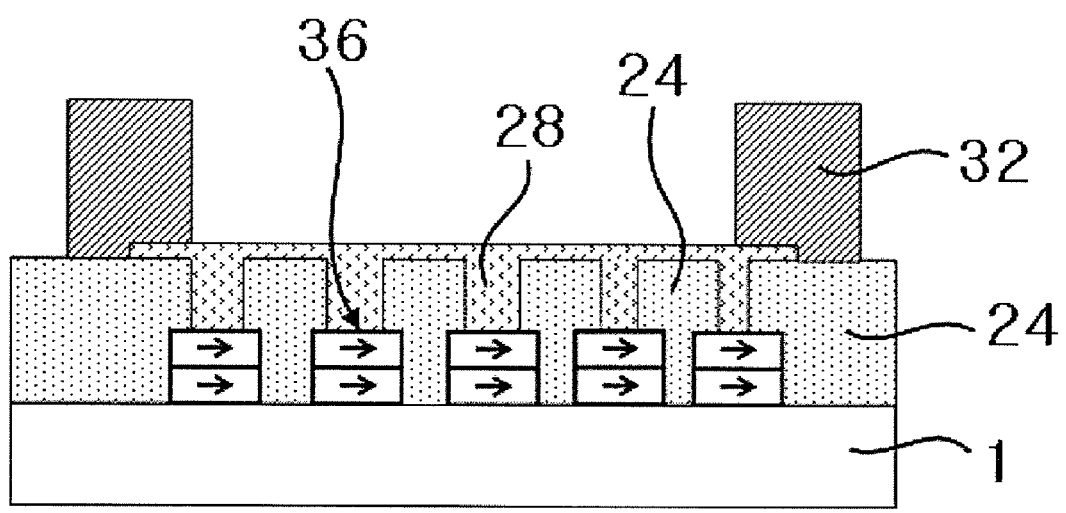

A magnetoresistive element shown in FIGS. 31A and 31B is similar to that shown in FIGS. 29A and 29B except that it has a square ring shape, and the magnetoresistive element is manufactured by the same method as described above. In FIGS. 31A and 31B, reference numeral 36 denotes the magnetoresistive element with the square ring shape. FIG. 31A is a plan view, and FIG. 31B is a diagram illustrating a magnetic field detector including a plurality of magnetoresistive elements 36 with the square ring shapes.

Figure 32A:
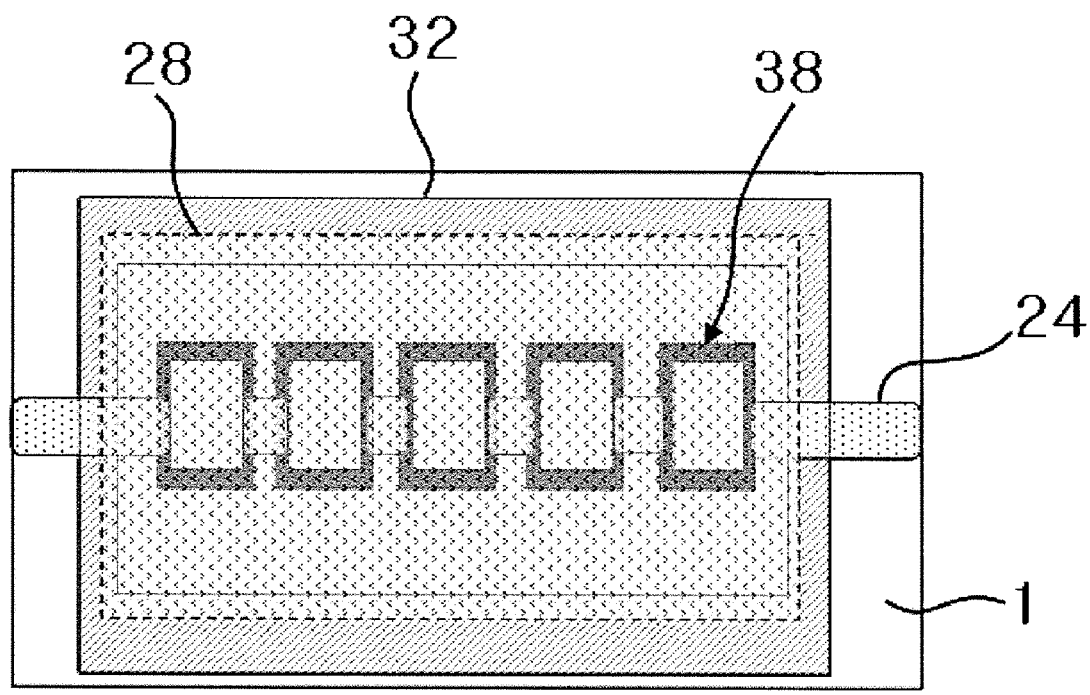
Figure 32B:
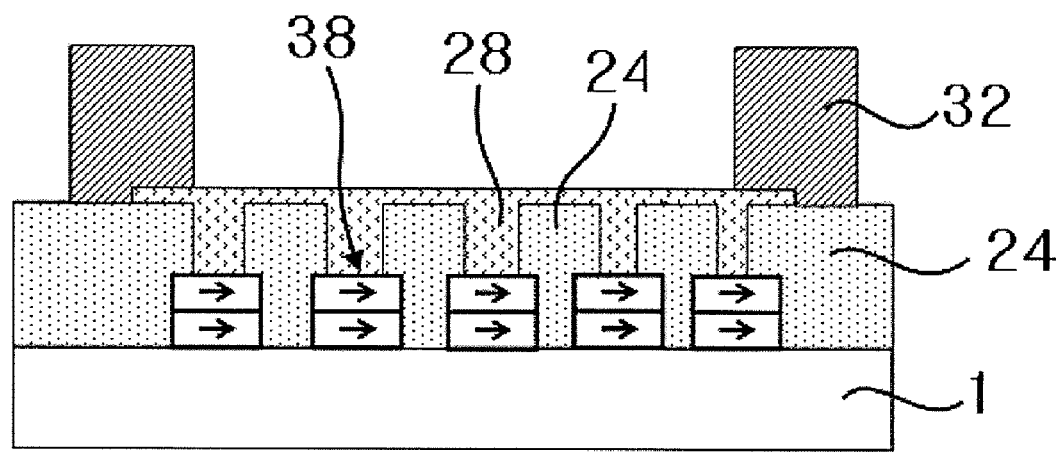

A magnetoresistive element shown in FIGS. 32A and 32B is similar to that shown in FIGS. 29A and 29B except that it has a rectangular ring shape, and the magnetoresistive element is manufactured by the same method as described above. In FIGS. 32A and 32B, reference numeral 38 denotes the magnetoresistive element with the rectangular ring shape. FIG. 32A is a plan view, and FIG. 32B is a diagram illustrating a magnetic field detector including a plurality of magnetoresistive elements 36 with the rectangular ring shapes.

In the magnetic field detectors manufactured according to the third embodiment and the modifications thereof, since a stray field is formed inside the magnetoresistive element having a circular ring shape, the stray field is circulated in the magnetoresistive element, and does not leak to the outside of the element. As a result, there is no mutual interference due to the stray field.

When the magnetic bead is magnetized by a magnetic field applied from the outside, a weak magnetic field is generated, and the generated magnetic field has an effect on the magnetization direction of the free layer, which causes a variation in the output voltage of the magnetoresistive element. The variation in the output voltage makes it possible to detect the magnetic bead.

Fourth Embodiment

FIGS. 33A to 39B are diagrams sequentially illustrating a method of manufacturing a magnetic field detector according to a fourth embodiment of the invention. The magnetic field detector according to the fourth embodiment differs from that according to the second embodiment in that a plurality of magnetoresistive elements having circular ring shapes are arranged in a line (that is, a one-dimensional array structure). Since a manufacturing method according to the fourth embodiment is most similar to that according to the second embodiment, those skilled in the art can easily understand the manufacturing method according to the fourth embodiment.

Figure 33A:
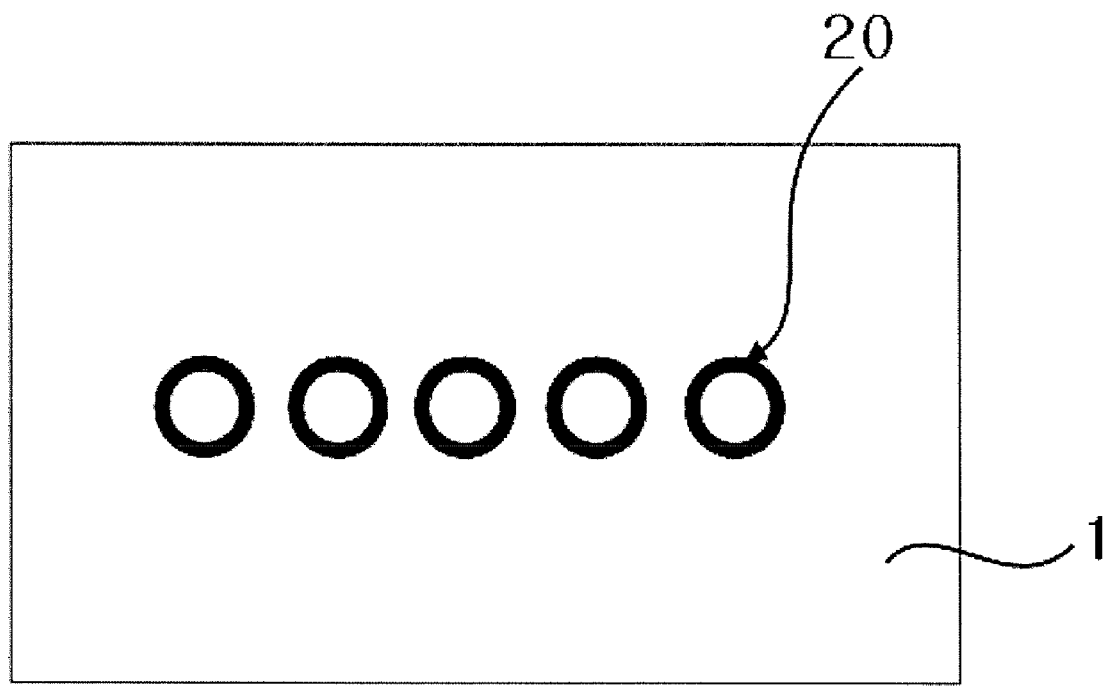
FIGS. 33A to 39B are diagrams sequentially illustrating a method of manufacturing a magnetic field detector according to a fourth embodiment of the invention.
Figure 33B:
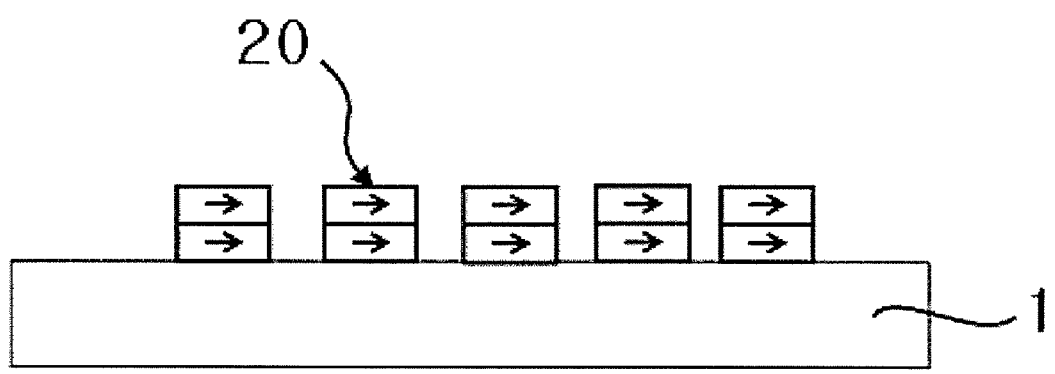

First, a giant magnetoresistive thin film 2 is formed on a substrate 1 by vapor deposition and then etched to form an array of a plurality of magnetoresistive elements 20 with circular ring shapes (see FIGS. 33A and 33B). The plurality of magnetoresistive elements 20 are arrayed in a line at equal distances (that is, a one-dimensional array structure). In the etching process, dry etching, such as an Ar gas ion milling method, is performed on the giant magnetoresistive thin film 2 shown in FIG. 1C to selectively etch all the portions of the film except circular ring portions. FIG. 33A is a plan view, and FIG. 33B is a diagram illustrating the arrangement of the substrate 1 and the plurality of magnetoresistive elements 20.

Figure 34A:
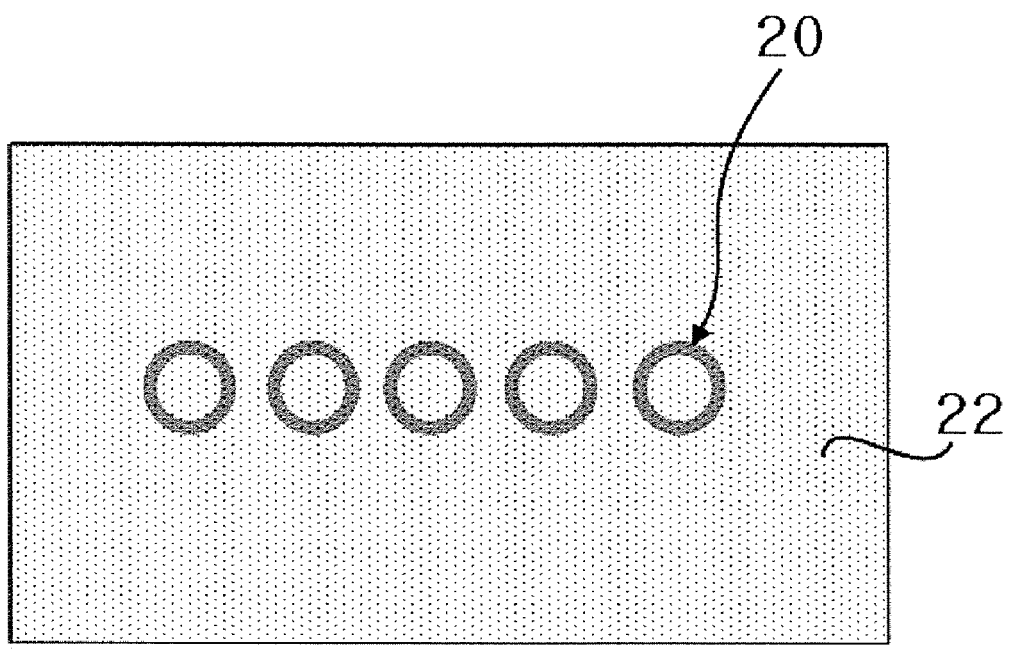
Figure 34B:
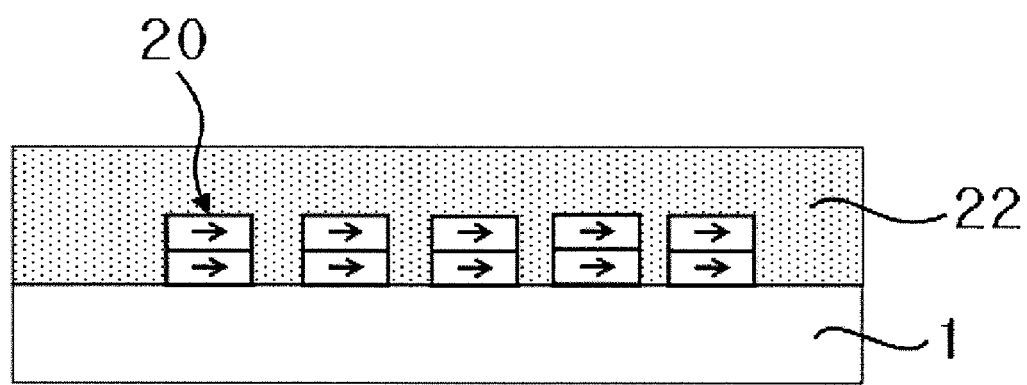

As shown in FIGS. 34A and 34B, a metal thin film layer 22 formed of Au is deposited on the substrate 1 and the plurality of magnetoresistive elements 20. For example, Au is grown with a thickness of about 150 nm by a sputtering deposition method under the conditions of an argon gas pressure of about $3 \times 10^{-4}$ Torr, a sputtering power of about 60 W, and room temperature, thereby forming the metal thin film layer 22. FIG. 34A is a plan view, and FIG. 34B is a diagram illustrating the deposited metal thin film layer 22. The metal thin film layer 22 may be formed of Ta.

Figure 35A:
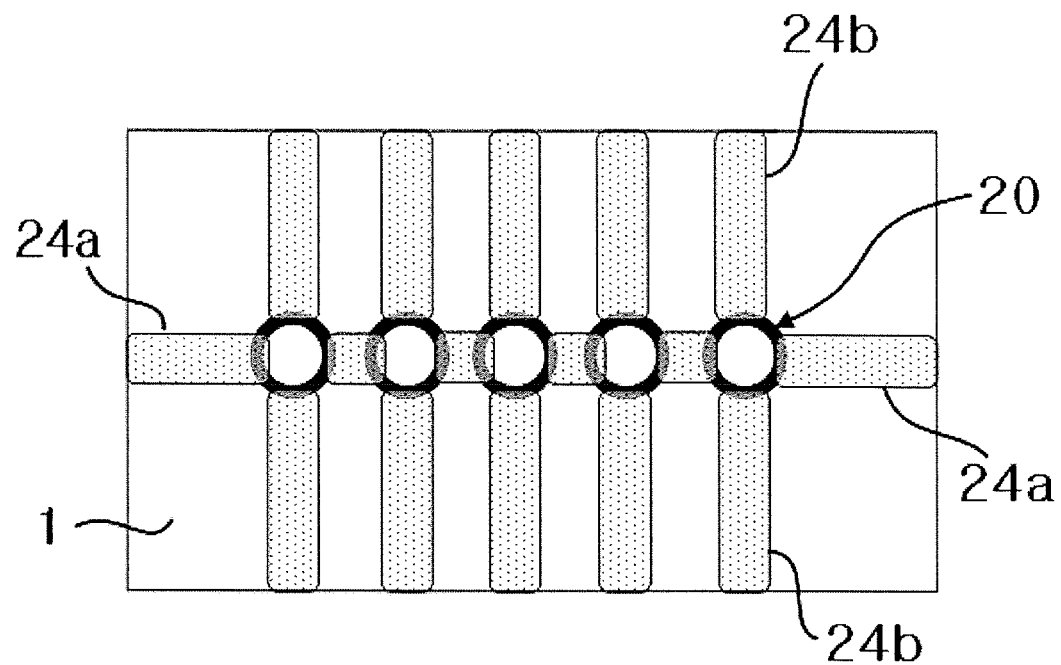
Figure 35B:
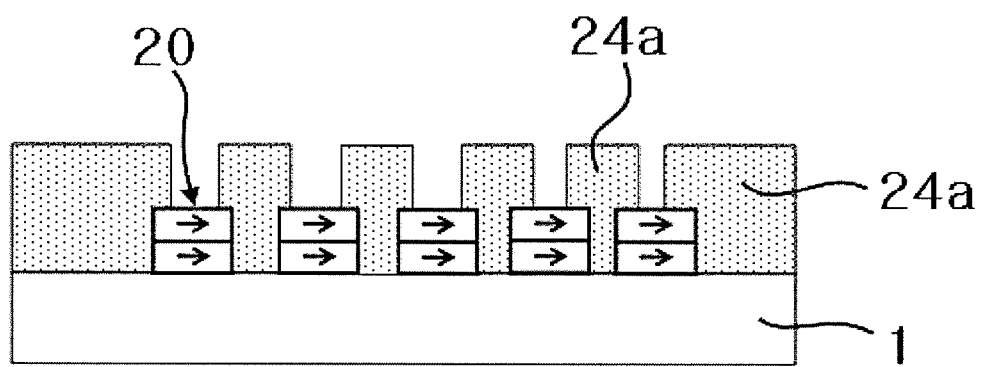

As shown in FIGS. 35A and 35B, horizontal electrode pads 24a and vertical electrode pads 24b are formed. The horizontal electrode pads 24a are used as electrodes for applying a current and measuring a horizontal voltage. The vertical electrode pads 24b are used as electrodes for measuring a vertical voltage. The horizontal and vertical electrode pads 24a and 24b are formed by a lift-up method, using dry etching or a negative photosensitive mask. In this case, all the portions of the metal thin film layer 22 except for portions serving as the electrode pads 24a and 24b are removed. For example, the electrode pads 24a include electrode pads connecting the plurality of magnetoresistive elements 20 in the horizontal direction, and electrode pads extending from the rightmost and leftmost magnetoresistive elements 20 to the outside in the horizontal direction. The vertical electrode pads 24b are formed for each of the magnetoresistive elements 20 so as to be orthogonal to the horizontal electrode pads 24a. That is, a line lining the horizontal electrode pads 24a in the horizontal direction is orthogonal to a line linking the vertical electrode pads 24b in the vertical direction. FIG. 35A is a plan view, and FIG. 35B is a diagram illustrating the formed electrode pads 24a and 24b.

Figure 36A:
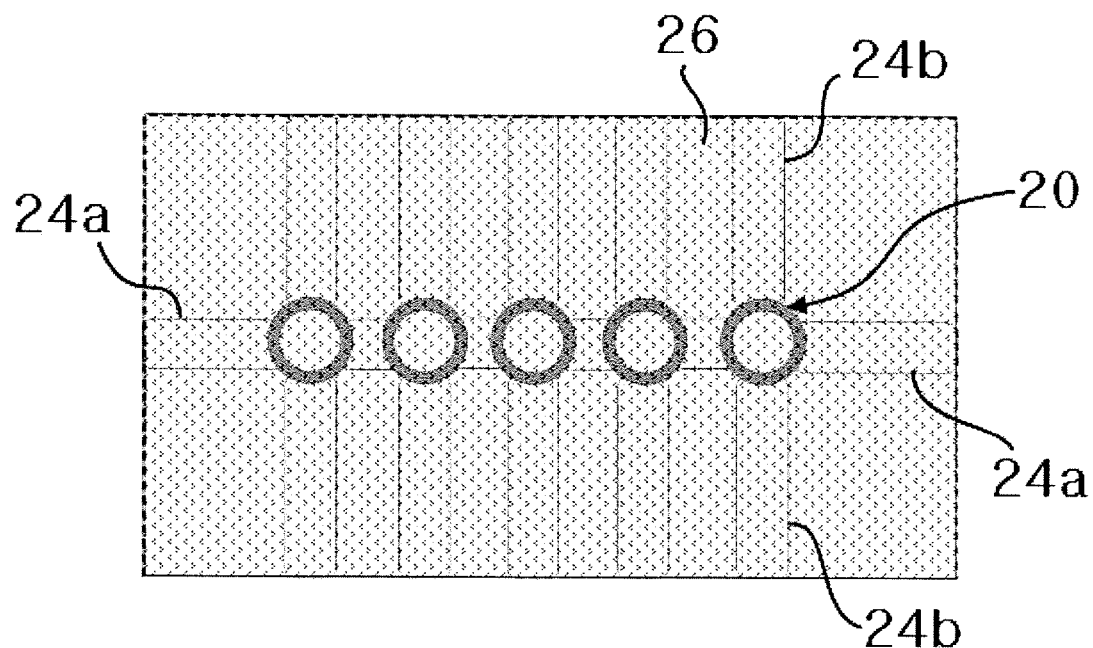
Figure 36B:
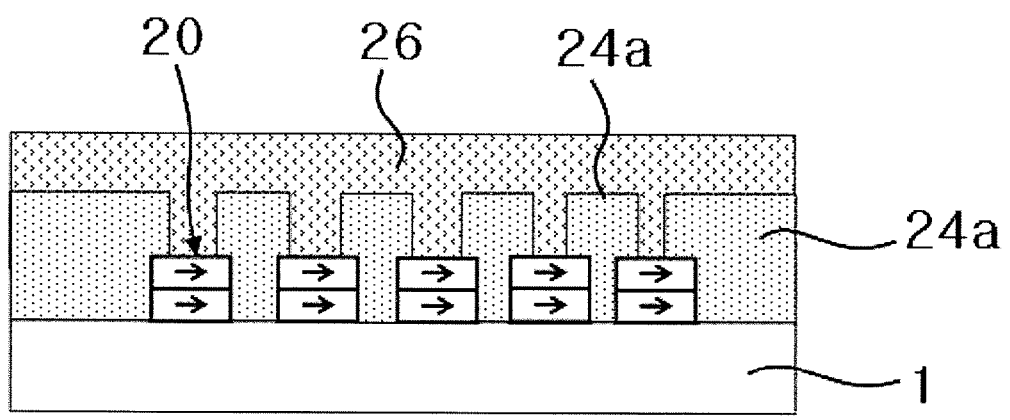

As shown in FIGS. 36A and 36B, an insulating thin film layer 26 is deposited on the substrate 1, the magnetoresistive elements 20, and the electrode pads 24a and 24b. The insulating thin film layer 26 is formed of $SiO_2$ or $Si_3N_4$. In order to prevent the magnetoresistive elements 20 and the electrode pads 24a and 24b from being corroded by an analytical solution, for example, $SiO_2$ or $Si_3N_4$ is grown with a thickness of about 50 to 300 nm (preferably, 150 nm) by a sputtering deposition method under the conditions of an argon gas pressure of about $3\times10^{-4}$ Torr, a sputtering power of about 100 W, and room temperature, thereby forming the $SiO_2$ or $Si_3N_4$ insulating thin film layer 26. FIG. 36A is a plan view, and FIG. 36B is a diagram illustrating the formed insulating thin film layer 26.

Figure 37A:
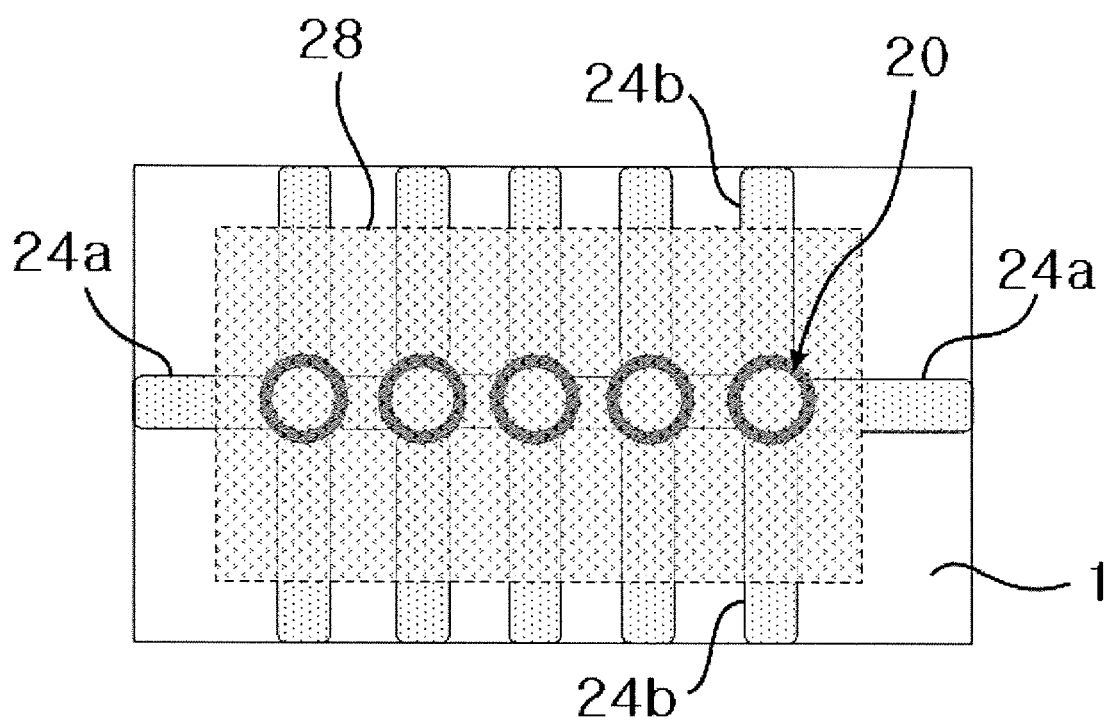
Figure 37B:
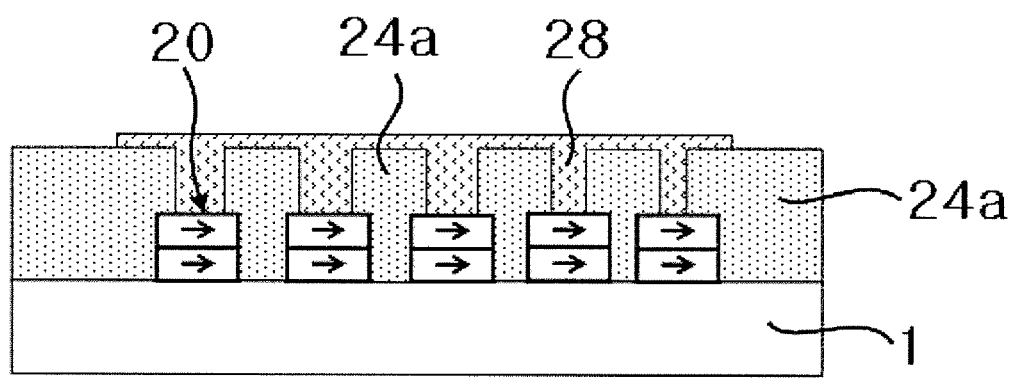

As shown in FIGS. 37A and 37B, the insulating thin film layer 26 is partially removed to form an insulating protective layer 28. All the portions of the insulating thin film layer 26 except a portion serving as the insulating protective layer are removed by a lift-up method, using dry etching, such as an Ar gas ion milling method, or a negative photosensitive mask, thereby forming the insulating protective layer 28. FIG. 37A is a plan view, and FIG. 37B is a diagram illustrating the formed insulating protective layer 28.

Figure 38A:
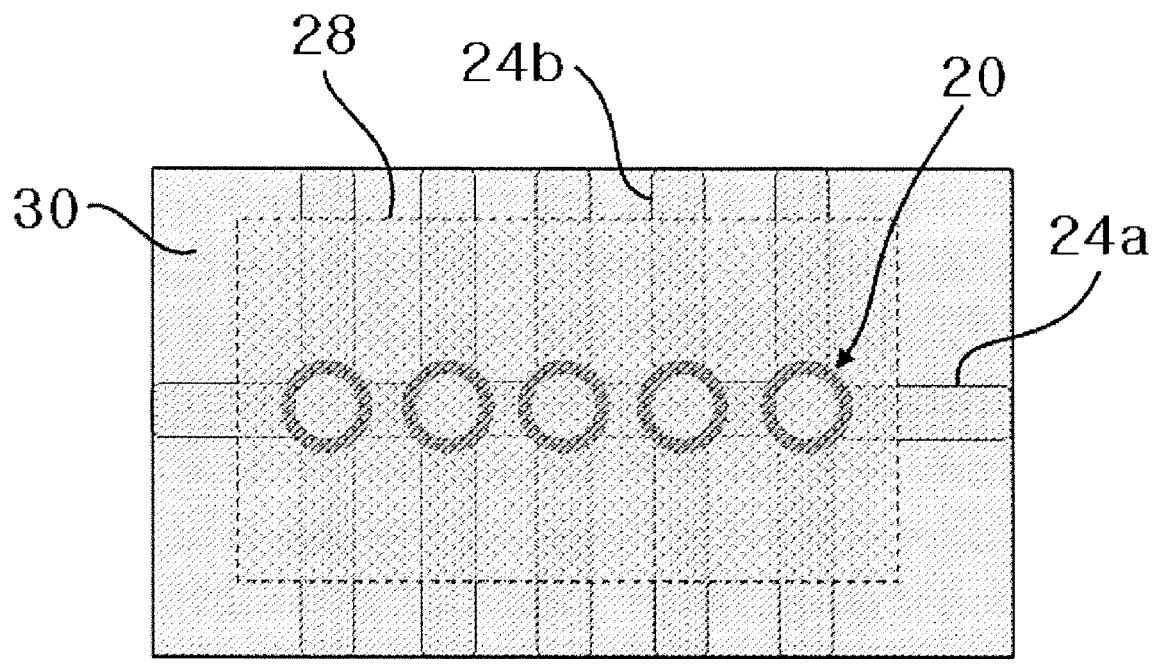
Figure 38B:
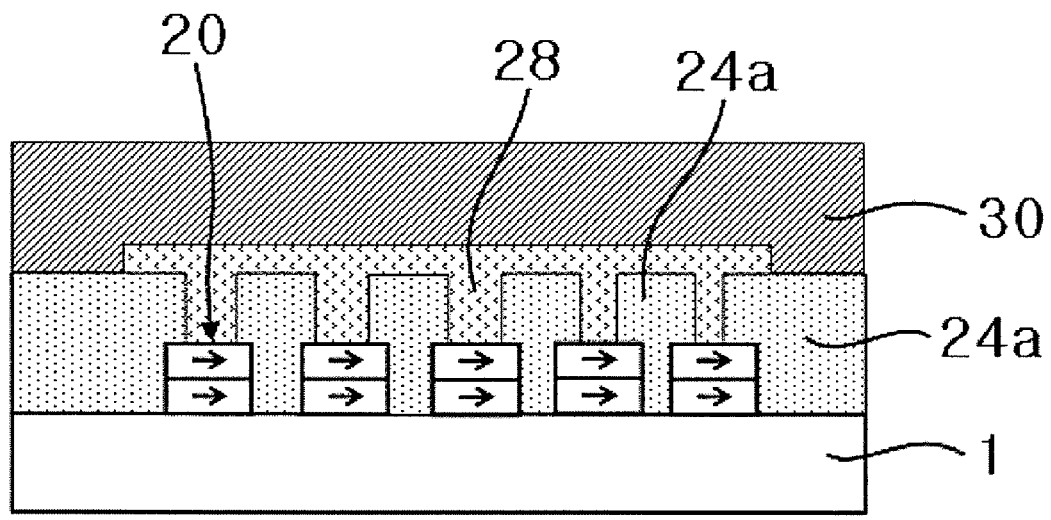

As shown in FIGS. 38A and 38B, a photosensitive magnetic bead thin film 30 is deposited on the substrate 1, the electrode pads 24a and 24b, and the insulating protective layer 28. The photosensitive magnetic bead thin film 30 is formed with a thickness of about 1 to 2 μm (preferably, about 1.5 μm) at room temperature by spin coating at a speed of about 3000 to 5000 rpm. FIG. 38A is a plan view, and FIG. 38B is a diagram illustrating the deposited photosensitive magnetic bead thin film 30.

Figure 39A:
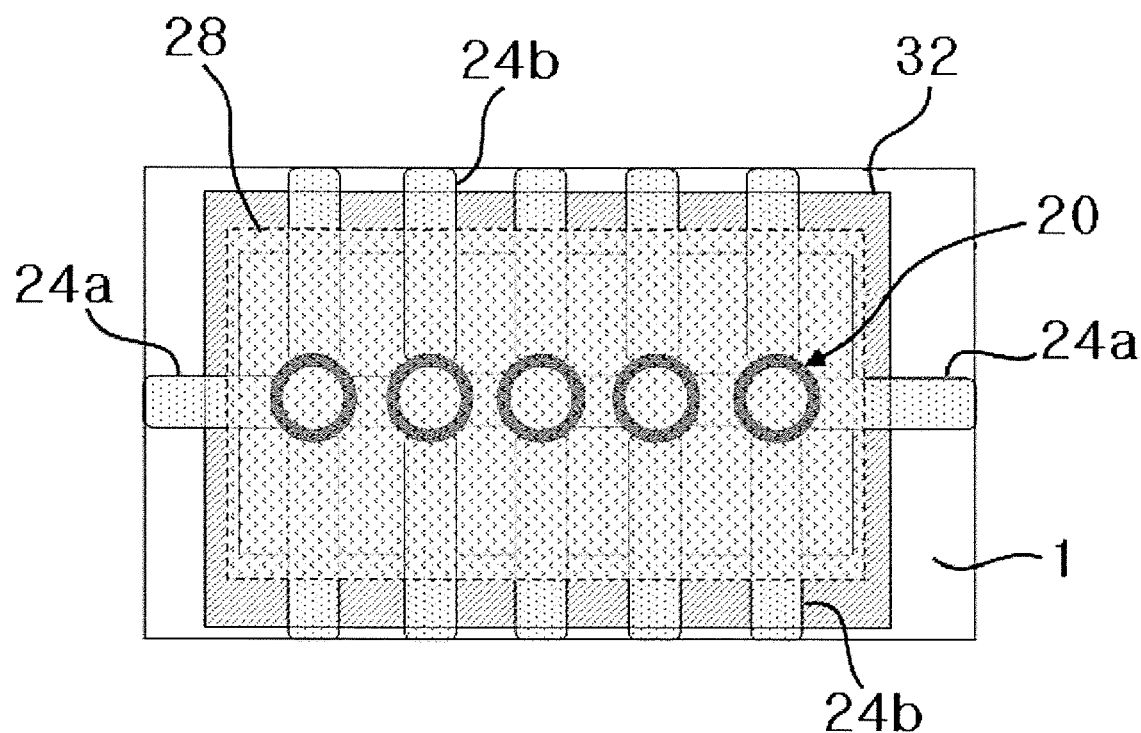
Figure 39B:
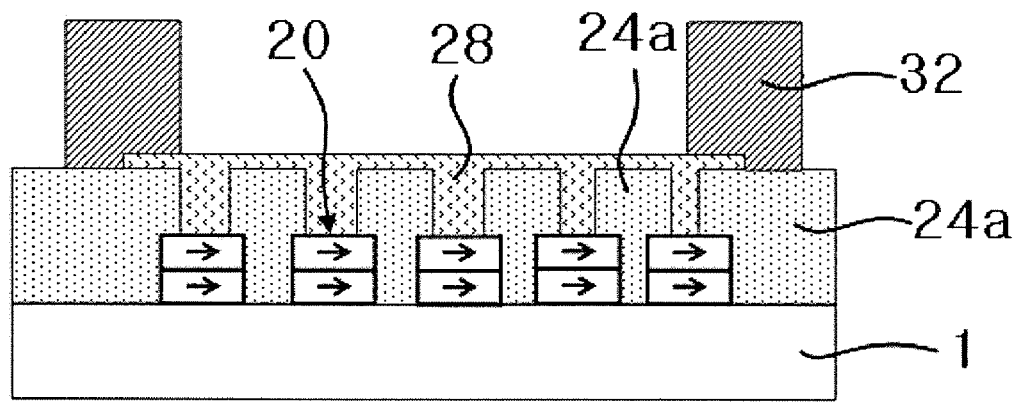

As shown in FIGS. 39A and 39B, the photosensitive magnetic bead thin film 30 is selectively removed to form a magnetic bead limiting layer 32. The magnetic bead limiting layer 32 is formed by removing all the portions of the photosensitive magnetic bead thin film 30 except a portion serving as the magnetic bead limiting layer 32, using a lift-up method and a negative photosensitive mask. The magnetic bead limiting layer 32 can impound a magnetic bead analysis solution therein such that the magnetic bead analysis solution is positioned close to the magnetoresistive element 20. FIG. 39A is a plan view and FIG. 39B is a diagram illustrating the formed magnetic bead limiting layer 32.

The magnetic field detector manufactured through the above-mentioned processes includes the plurality of magnetoresistive elements 20 with circular ring shapes that are grown on the Si single crystal substrate 1, the horizontal electrodes 24a for applying a current to the plurality of magnetoresistive elements 20 and measuring a horizontal voltage, and the vertical electrodes 24b for measuring a vertical voltage, as shown in FIGS. 39A and 39B. The insulating protective layer 28 is deposited on the entire surface of each of the plurality of magnetoresistive elements 20 and portions of the electrodes 24a and 24b, and the magnetic bead limiting layer 32 is formed on the plurality of magnetoresistive elements 20, the electrodes 24a and 24b, and the insulating protective layer 28. The horizontal electrodes 24a mean the horizontal electrode pads described with reference to FIGS. 35A and 35B, and the vertical electrodes 24b mean the vertical electrode pads described with reference to FIGS. 35A and 35B.

FIGS. 40A to 42B are diagrams illustrating modifications of the fourth embodiment of the invention.

Figure 40A:
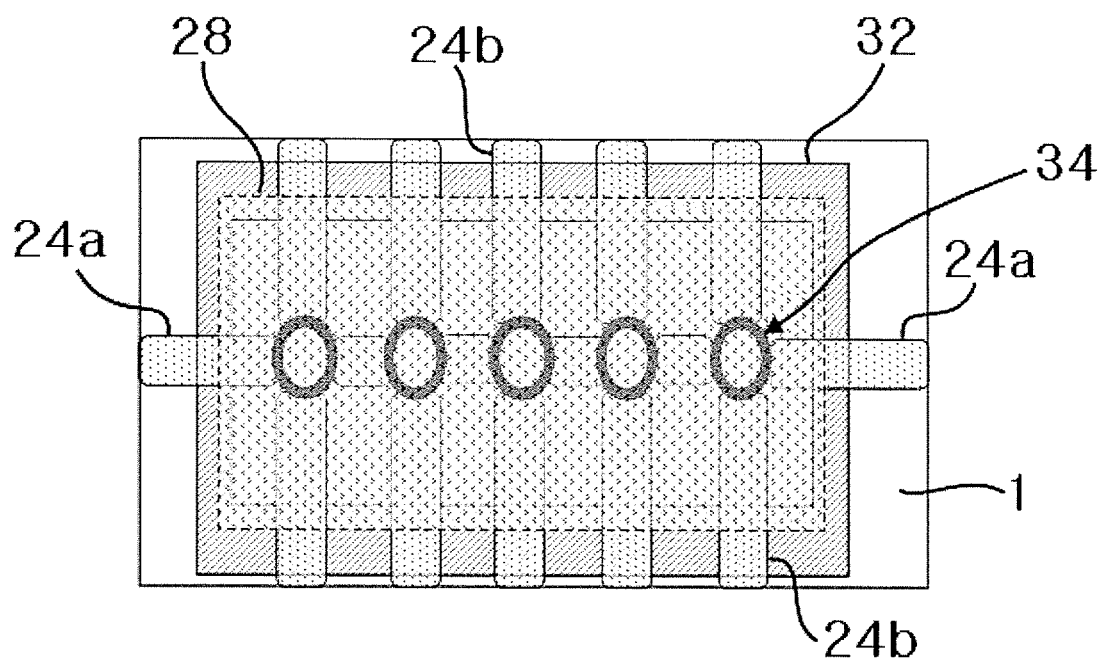
FIGS. 40A to 42B are diagrams illustrating modifications of the fourth embodiment.
Figure 40B:
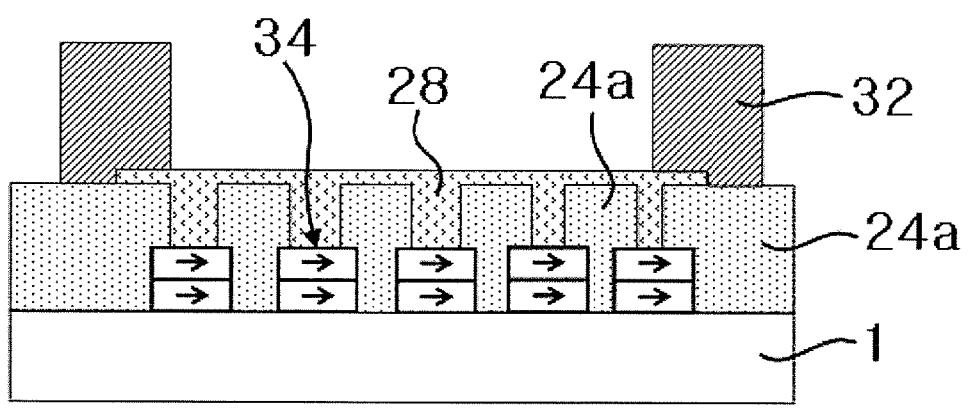

A magnetoresistive element shown in FIGS. 40A and 40B is similar to that shown in FIGS. 39A and 39B except that it has an elliptical ring shape, and the magnetoresistive element is manufactured by the same method as described above. In FIGS. 40A and 40B, reference numeral 34 denotes the magnetoresistive element with the elliptical ring shape. FIG. 40A is a plan view, and FIG. 40B is a diagram illustrating a magnetic field detector including a plurality of magnetoresistive elements 34 with the elliptical ring shapes.

Figure 41A:
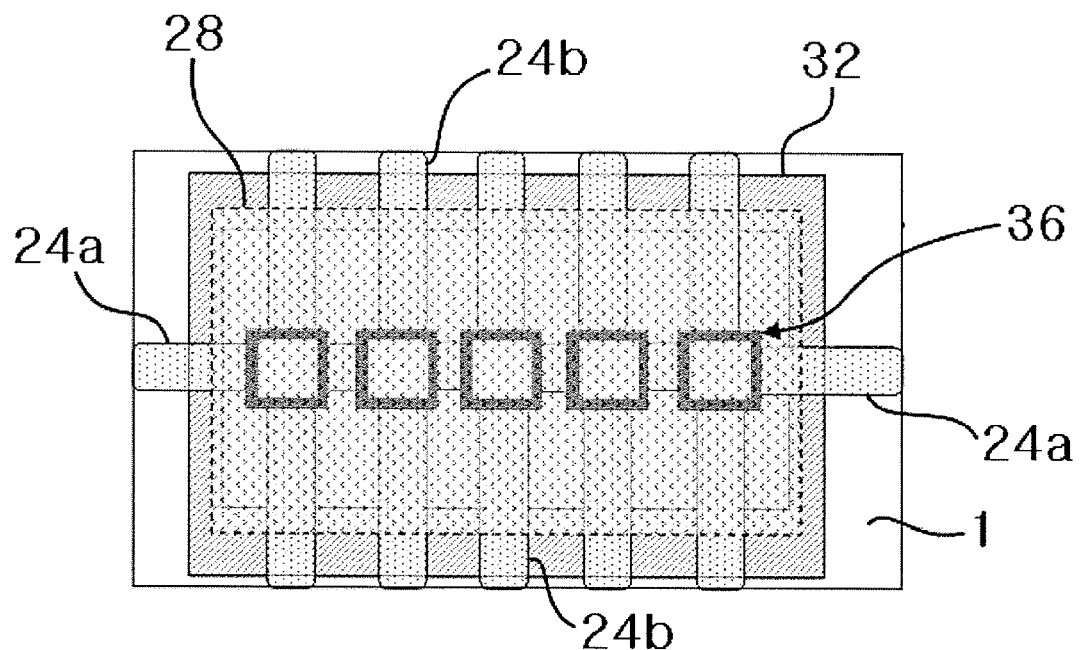
Figure 41B:
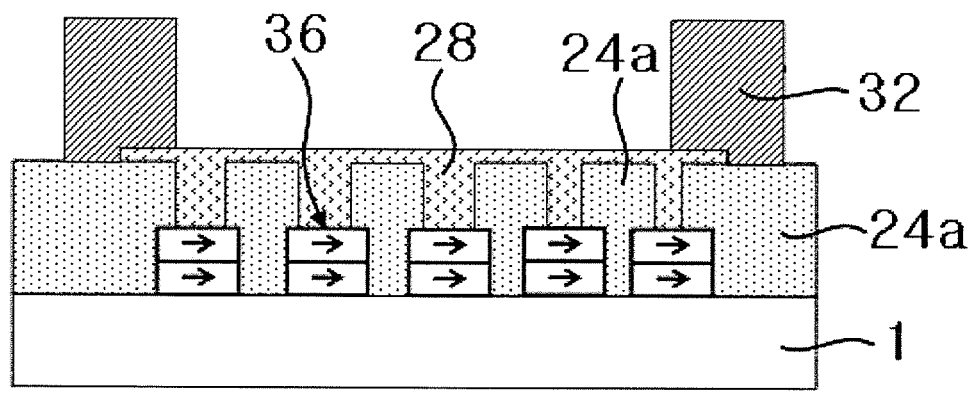

A magnetoresistive element shown in FIGS. 41A and 41B is similar to that shown in FIGS. 39A and 39B except that it has a square ring shape, and the magnetoresistive element is manufactured by the same method as described above. In FIGS. 41A and 41B, reference numeral 36 denotes the magnetoresistive element with the square ring shape. FIG. 41A is a plan view, and FIG. 41B is a diagram illustrating a magnetic field detector including a plurality of magnetoresistive elements 36 with the square ring shapes.

Figure 42A:
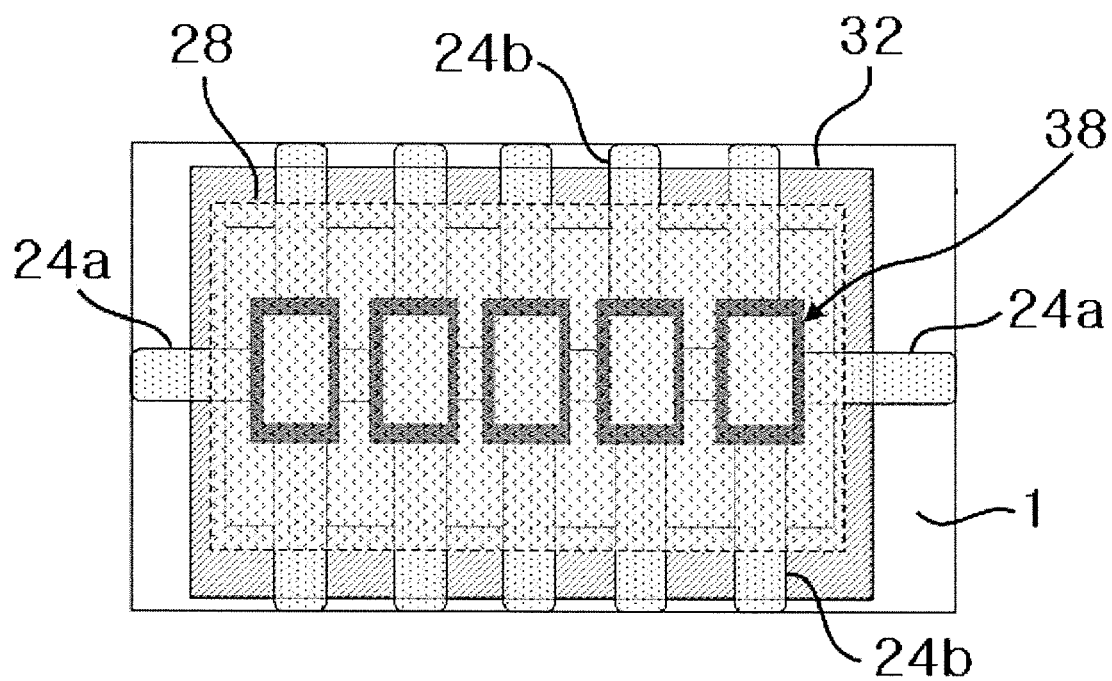
Figure 42B:
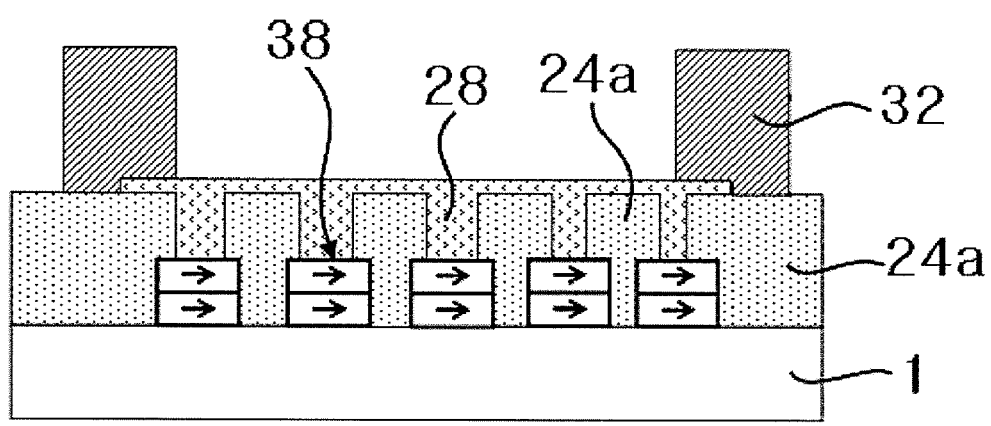

A magnetoresistive element shown in FIGS. 42A and 42B is similar to that shown in FIGS. 39A and 39B except that it has a rectangular ring shape, and the magnetoresistive element is manufactured by the same method as described above. In FIGS. 42A and 42B, reference numeral 38 denotes the magnetoresistive element with the rectangular ring shape. FIG. 42A is a plan view, and FIG. 42B is a diagram illustrating a magnetic field detector including a plurality of magnetoresistive elements 38 with the rectangular ring shapes.

In the magnetic field detectors manufactured according to the fourth embodiment and the modifications thereof, since a stray field is formed inside the magnetoresistive element having a circular ring shape, the stray field is circulated in the magnetoresistive element, but does not leak to the outside of the element. As a result, there is no mutual interference due to the stray field.

When the magnetic bead is magnetized by a magnetic field applied from the outside, a weak magnetic field is generated, and the generated magnetic field has an effect on the magnetization direction of the free layer, which causes a variation in the output voltage of the magnetoresistive element. The variation in the output voltage makes it possible to detect the magnetic bead.

Fifth Embodiment

FIGS. 43A to 49B are diagrams sequentially illustrating a method of manufacturing a magnetic field detector according to a fifth embodiment of the invention. The fifth embodiment differs from the third embodiment in that a plurality of magnetoresistive elements having circular ring shapes are arranged in a two-dimensional array (that is, in a matrix). Since a manufacturing method according to the fifth embodiment is most similar to that according to the third embodiment, those skilled in the art can easily understand the manufacturing method according to the fifth embodiment.

Figure 43A:
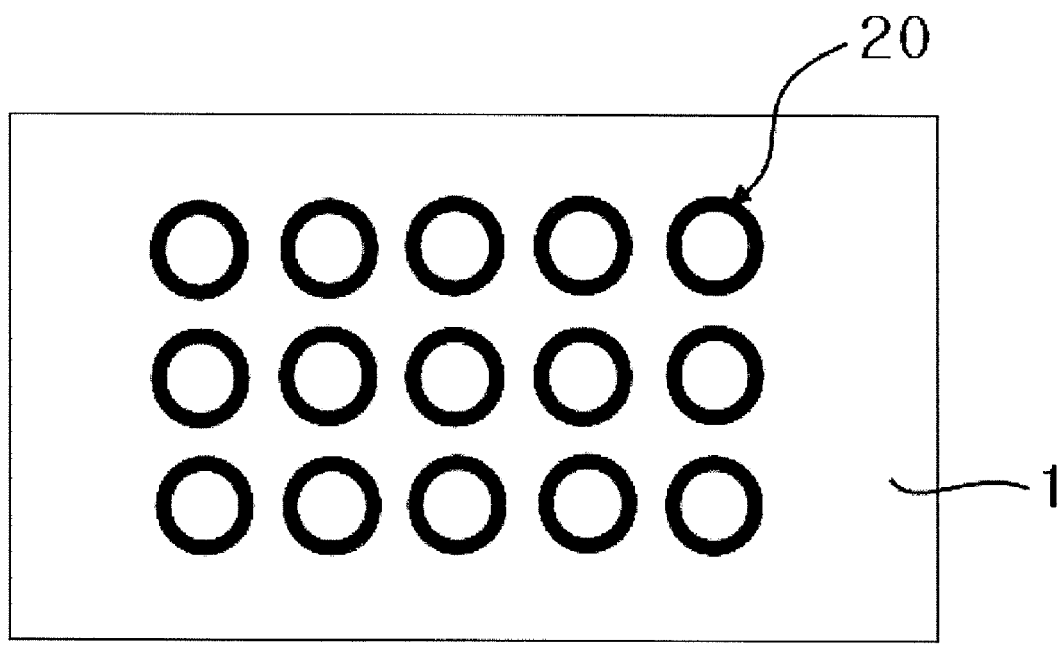
FIGS. 43A to 49B are diagrams sequentially illustrating a method of manufacturing a magnetic field detector according to a fifth embodiment of the invention.
Figure 43B:
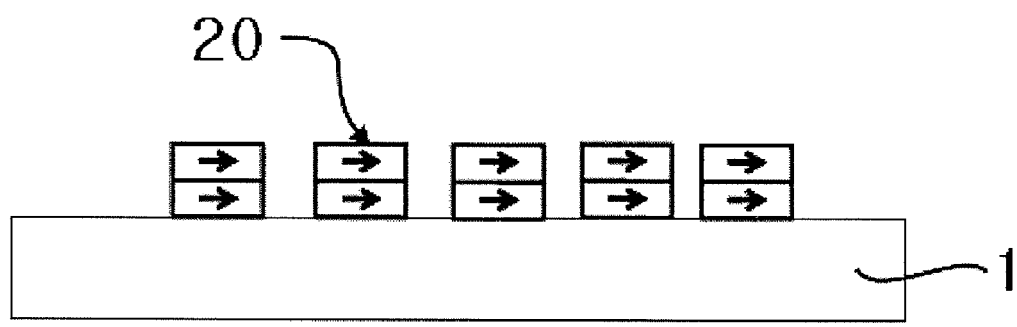

First, a giant magnetoresistive thin film 2 is formed on a substrate 1 by vapor deposition and then etched to form a plurality of magnetoresistive elements 20 with circular ring shapes in a matrix (see FIGS. 43A and 43B). The plurality of magnetoresistive elements 20 are arrayed in a matrix at equal distances. In the etching process, dry etching, such as an Ar gas ion milling method, is performed on the giant magnetoresistive thin film 2 shown in FIG. 1C to etch all the portions of the film except circular ring portions. FIG. 43A is a plan view, and FIG. 43B is a diagram illustrating the arrangement of the substrate 1 and the plurality of magnetoresistive elements 20.

Figure 44A:
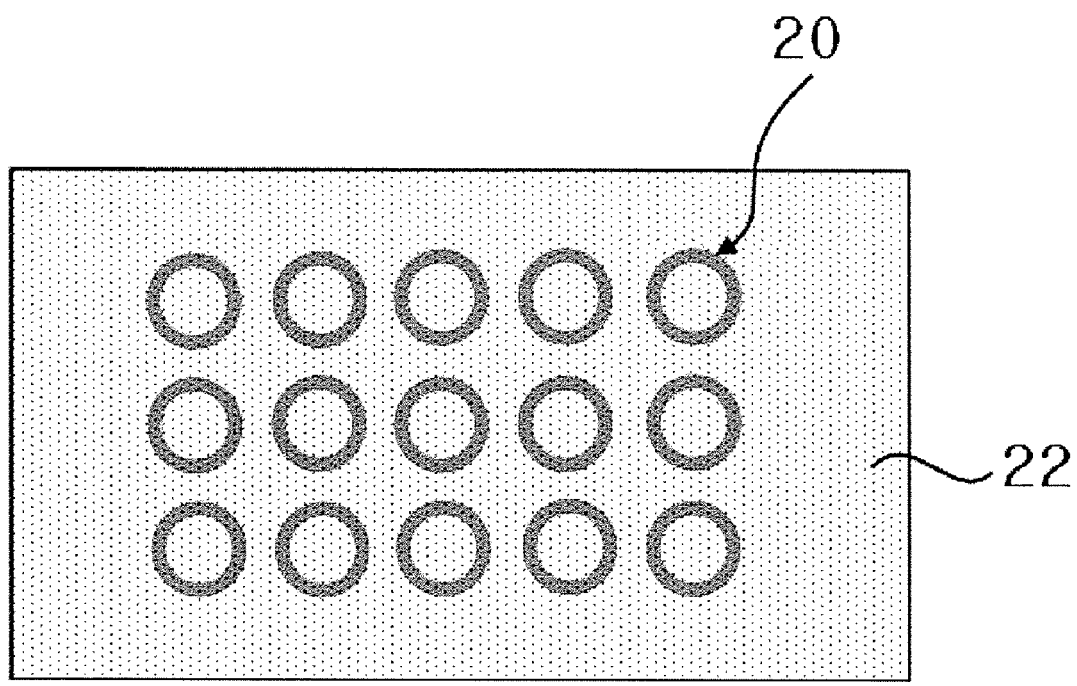
Figure 44B:
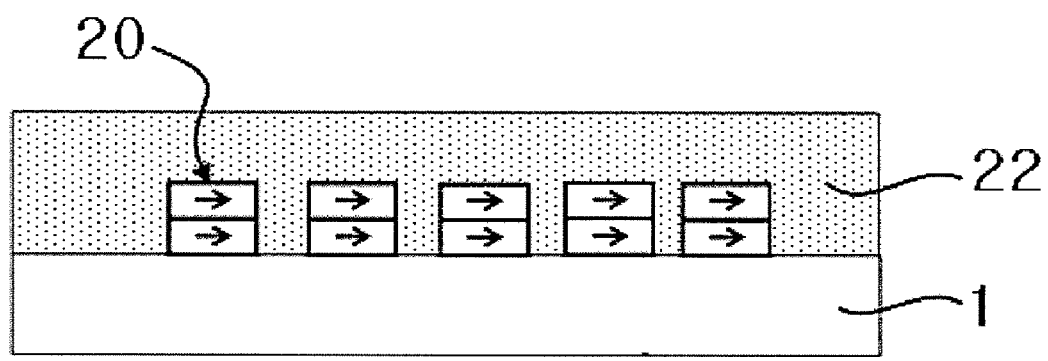

As shown in FIGS. 44A and 44B, a metal thin film layer 22 formed of Au is deposited on the substrate 1 and the plurality of magnetoresistive elements 20. For example, Au is grown with a thickness of about 50 to 300 nm (preferably 150 nm) by a sputtering deposition method under the conditions of an argon gas pressure of about $3\times10^{-4}$ Torr, a sputtering power of about 60 W, and room temperature, thereby forming the metal thin film layer 22. FIG. 44A is a plan view, and FIG. 44B is a diagram illustrating the deposited metal thin film layer 22. The metal thin film layer 22 may be formed of Ta.

Figure 45A:
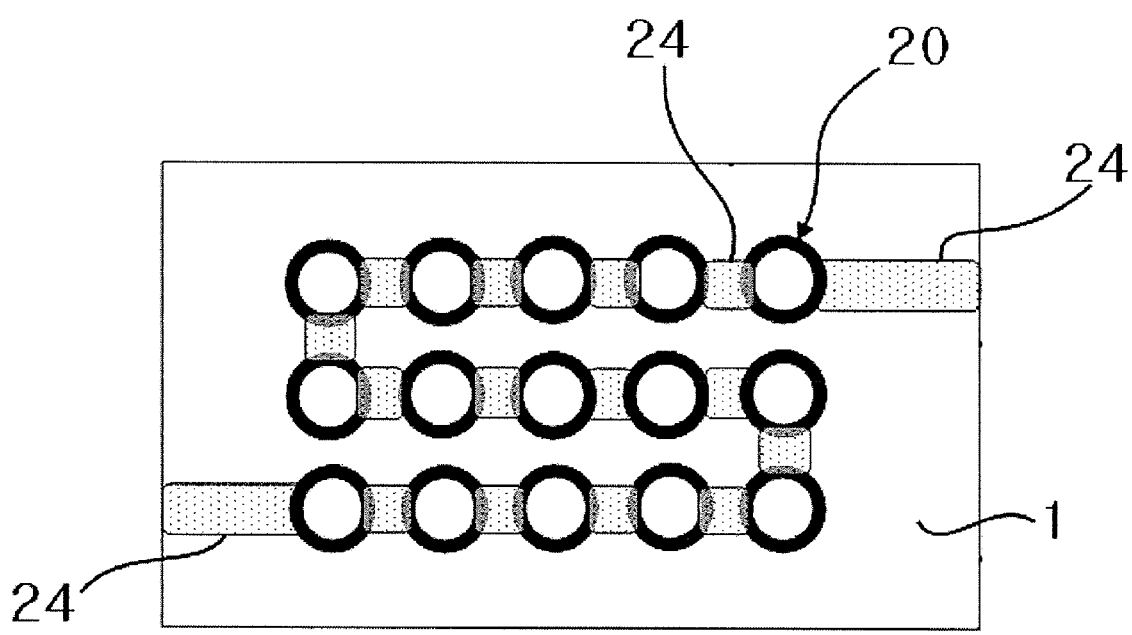
Figure 45B:
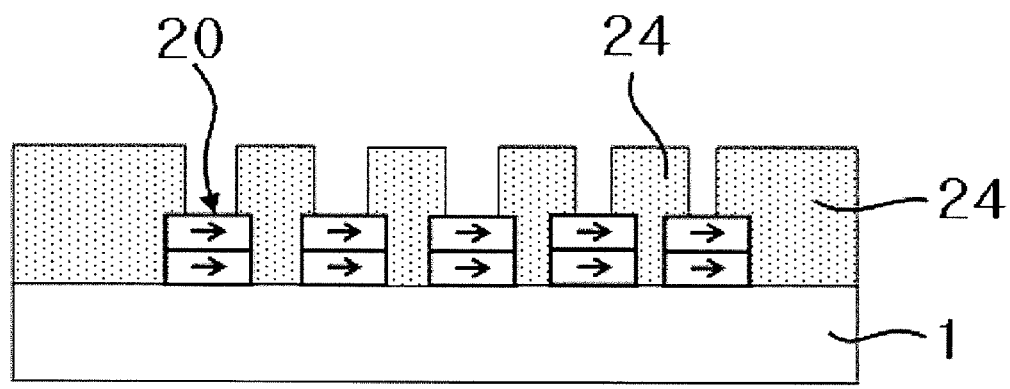

As shown in FIGS. 45A and 45B, electrode pads 24 are formed. The electrode pads 24 are used as electrodes for applying a current and measuring a horizontal voltage. The electrode pads 24 are formed by a lift-up method, using dry etching or a negative photosensitive mask. In this case, all the portions of the metal thin film layer 22 except for portions serving as the electrode pads 24 are removed. For example, the electrode pads 24 are linearly formed with the magnetoresistive elements 20 interposed therebetween. FIG. 45A is a plan view, and FIG. 45B is a diagram illustrating the formed electrode pads 24. Of course, the arrangement of the electrode pads 24 is not limited to that shown in FIGS. 45A and 45B, but the electrode pads 24 extending to the outside in FIGS. 45A and 45B may be disposed at different positions as long as the electrode pads 24 can be linearly arranged.

Figure 46A:
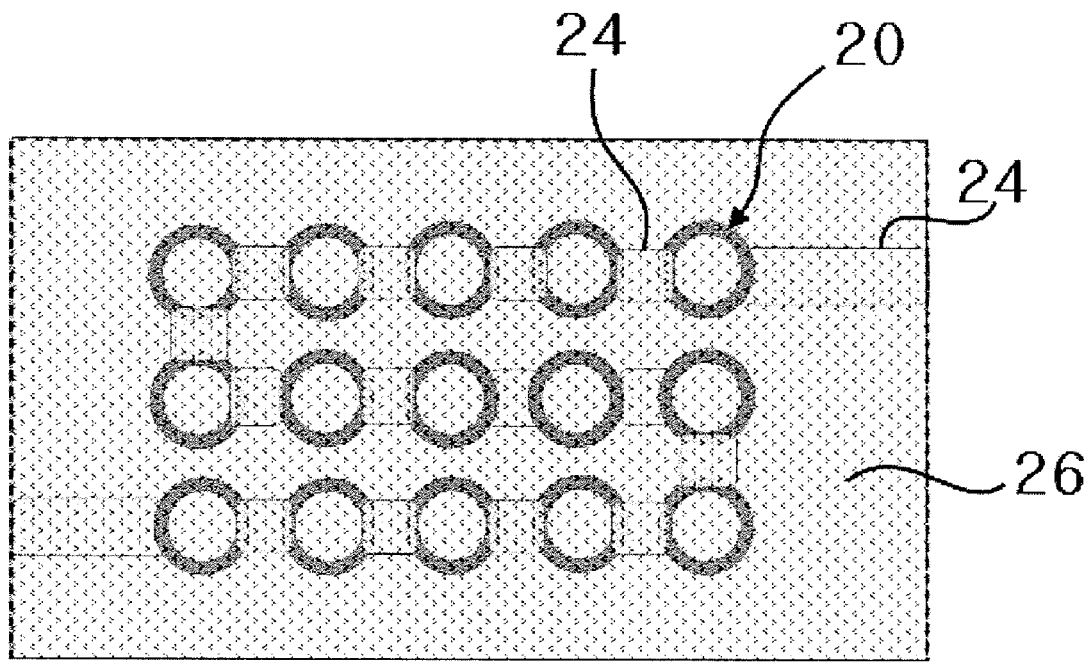
Figure 46B:
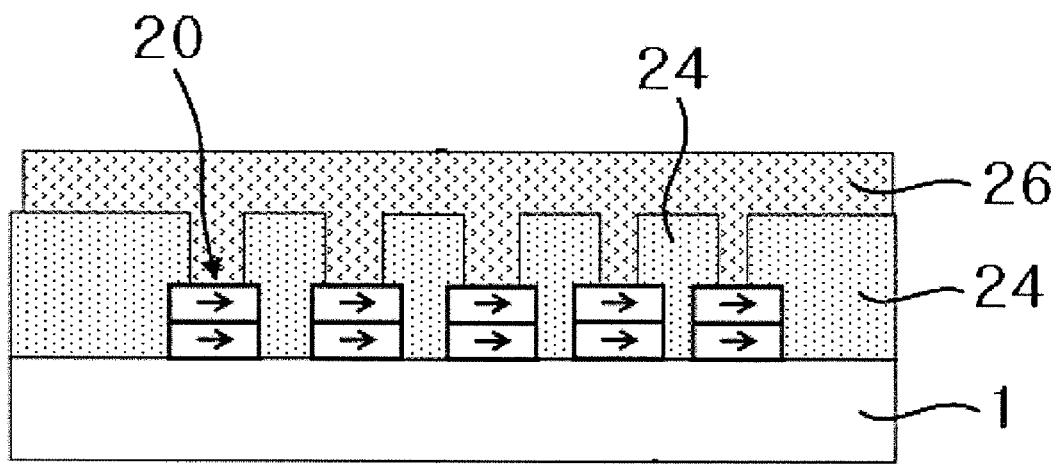

As shown in FIGS. 46A and 46B, an insulating thin film layer 26 is deposited on the substrate 1, the plurality of magnetoresistive elements 20, and the electrode pads 24. The insulating thin film layer 26 is formed of $SiO_2$ or $Si_3N_4$. In order to prevent the magnetoresistive elements 20 and the electrode pads 24 from corroded by an analytical solution, for example, $SiO_2$ or $Si_3N_4$ is grown with a thickness of about 50 to 300 nm (preferably, 150 nm) by a sputtering deposition method under the conditions of an argon gas pressure of about $3 \times 10^{-4}$ Torr, a sputtering power of about 100 W, and room temperature, thereby forming the $SiO_2$ or $Si_3N_4$ insulating thin film layer 26. FIG. 46A is a plan view, and FIG. 46B is a diagram illustrating the formed insulating thin film layer 26.

Figure 47A:
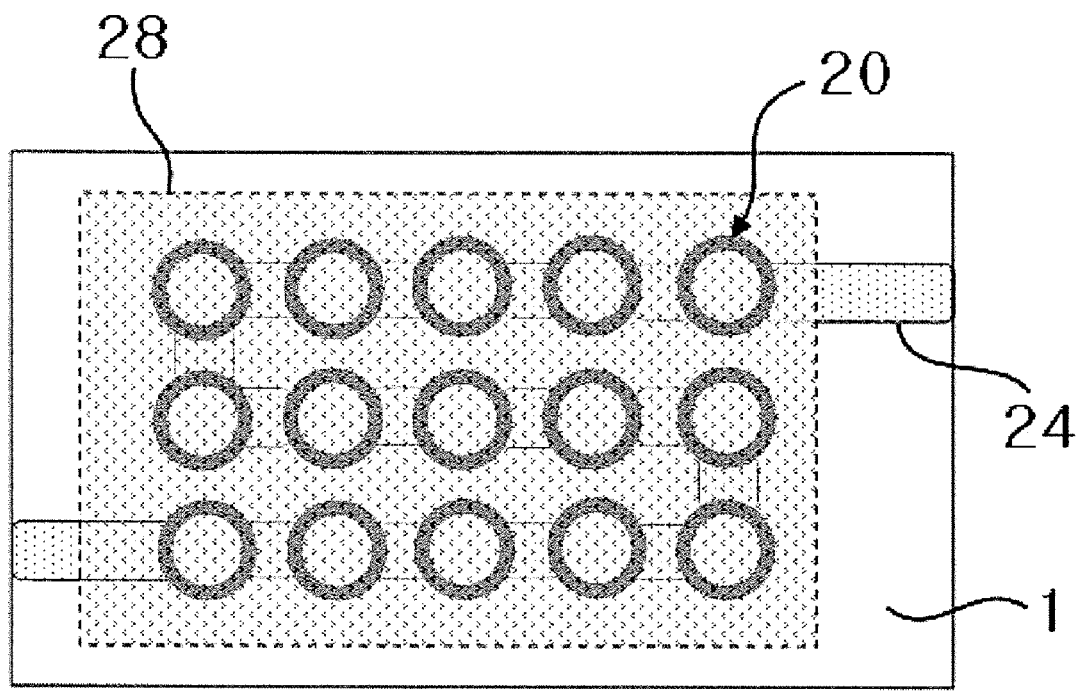
Figure 47B:
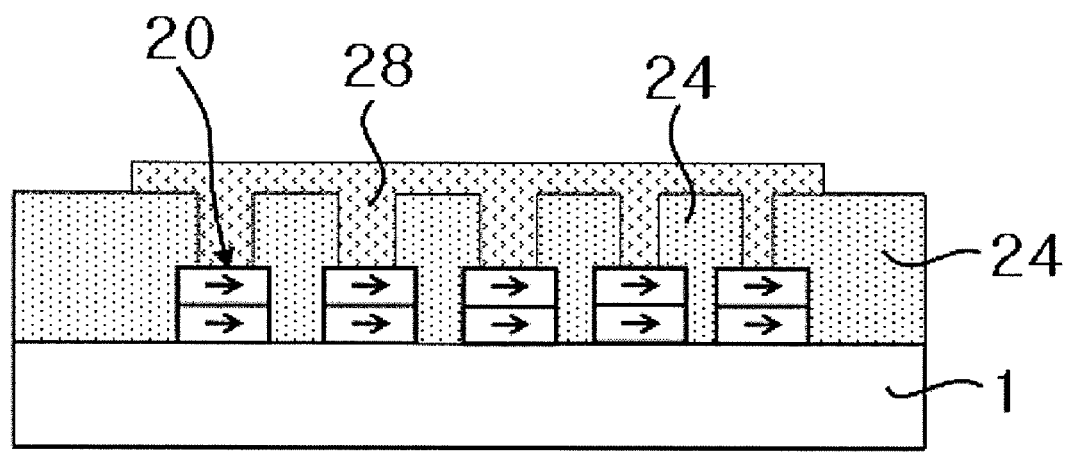

As shown in FIGS. 47A and 47B, the insulating thin film layer 26 is partially removed to form an insulating protective layer 28. All the portions of the insulating thin film layer 26 except a portion serving as the insulating protective layer are removed by a lift-up method, using dry etching, such as an Ar gas ion milling method, or a negative photosensitive mask, thereby forming the insulating protective layer 28. FIG. 47A is a plan view, and FIG. 47B is a diagram illustrating the formed insulating protective layer 28.

Figure 48A:
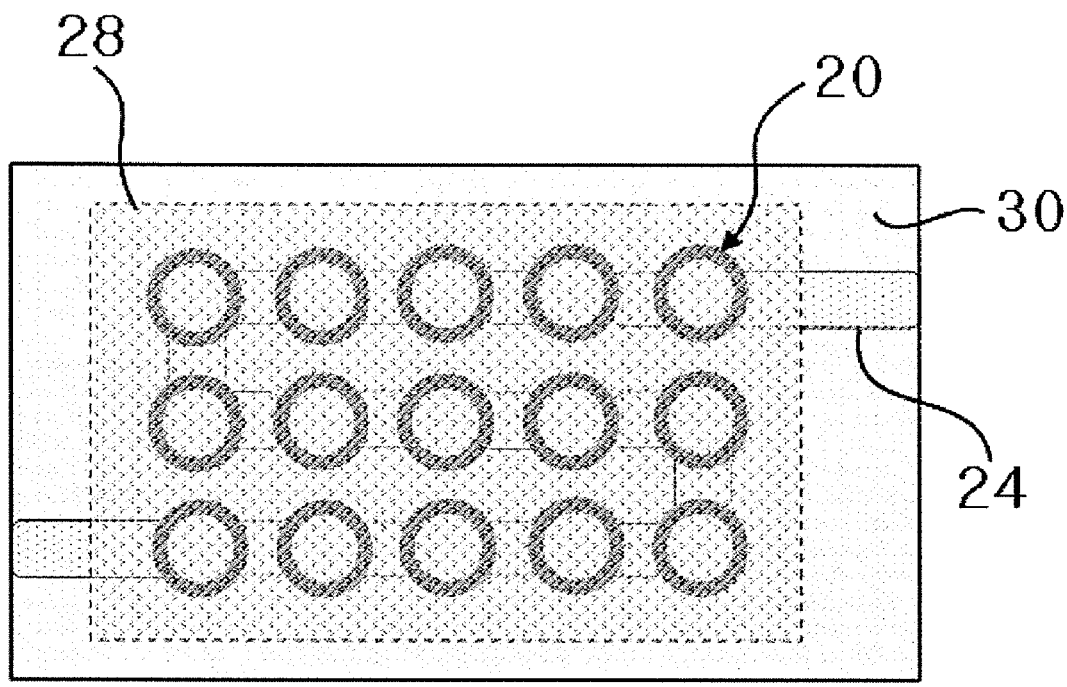
Figure 48B:
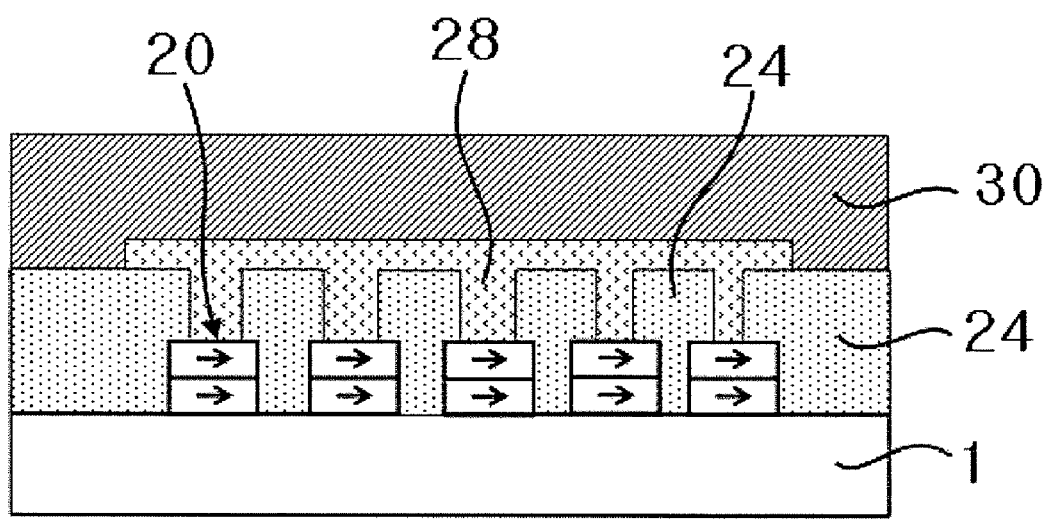

As shown in FIGS. 48A and 48B, a photosensitive magnetic bead thin film 30 is deposited on the substrate 1, the electrode pads 24, and the insulating protective layer 28. The photosensitive magnetic bead thin film 30 is formed with a thickness of about 1 to 2 μm (preferably, about 1.5 μm) at room temperature by spin coating at a speed of about 3000 to 5000 rpm. FIG. 48A is a plan view, and FIG. 48B is a diagram illustrating the deposited photosensitive magnetic bead thin film 30.

Figure 49A:
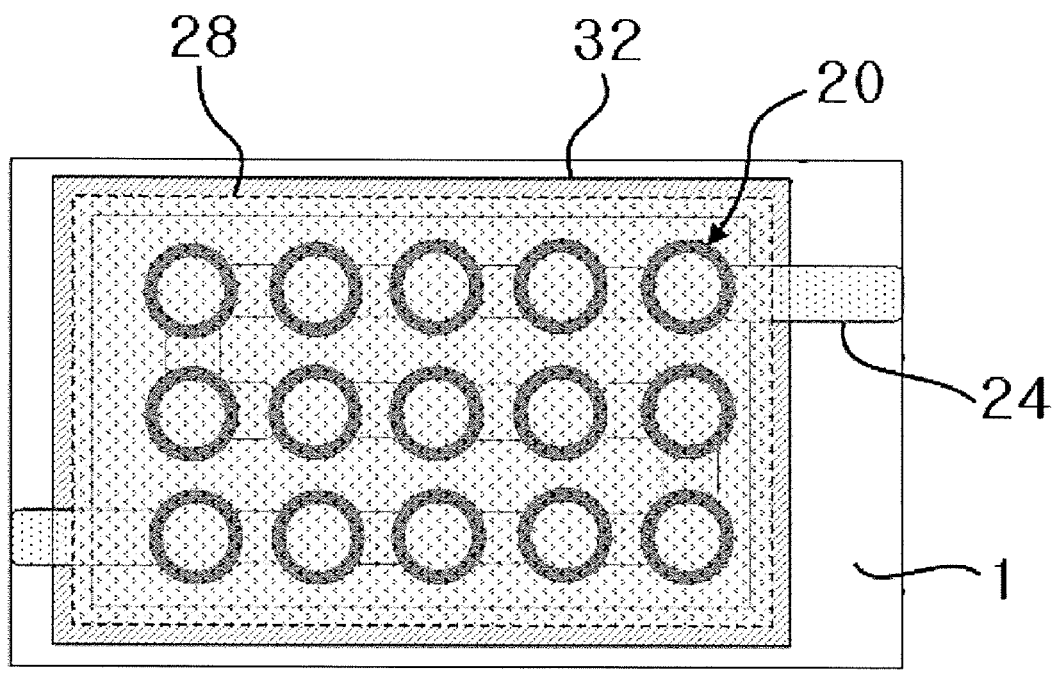
Figure 49B:
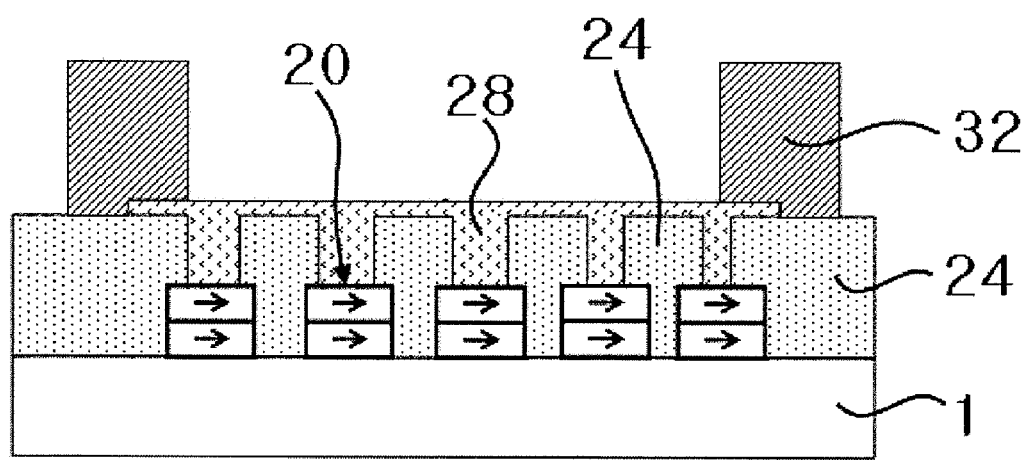

As shown in FIGS. 49A and 49B, the photosensitive magnetic bead thin film 30 is selectively removed to form a magnetic bead limiting layer 32. The magnetic bead limiting layer 32 is formed by removing all the portions of the photosensitive magnetic bead thin film 30 except a portion serving as the magnetic bead limiting layer 32, using a lift-up method and a negative photosensitive mask. The magnetic bead limiting layer 32 can impound a magnetic bead analysis solution therein such that the magnetic bead analysis solution is positioned close to the magnetoresistive element 20. FIG. 49A is a plan view, and FIG. 49B is a diagram illustrating the formed magnetic bead limiting layer 32.

The magnetic field detector manufactured through the above-mentioned processes includes the plurality of magnetoresistive elements 20 with circular ring shapes that are grown on the Si single crystal substrate 1, and the electrodes 24 for applying a current to the plurality of magnetoresistive elements 20 and measuring a horizontal voltage, as shown in FIGS. 49A and 49B. The insulating protective layer 28 is deposited on the entire surface of each of the plurality of magnetoresistive elements 20 and portions of the electrodes 24, and the magnetic bead limiting layer 32 is formed on the plurality of magnetoresistive elements 20, the electrodes 24, and the insulating protective layer 28. The electrodes 24 mean the electrode pads described with reference to FIGS. 45A and 45B, and may be called horizontal electrodes.

FIGS. 50A to 52B are diagrams illustrating modifications of the fifth embodiment of the invention.

Figure 50A:
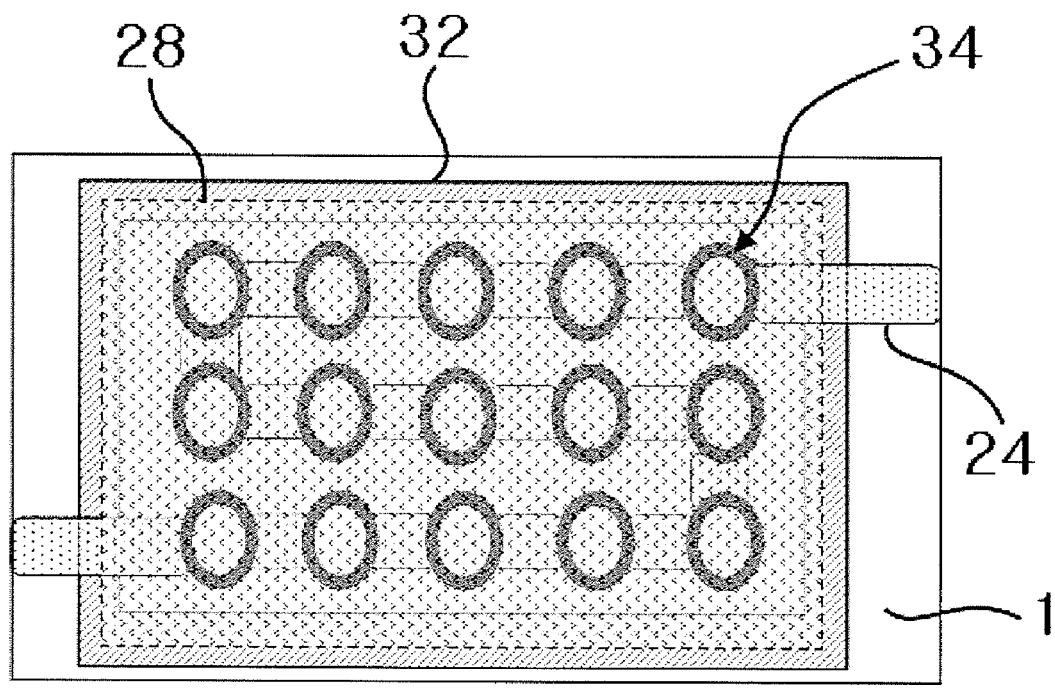
FIGS. 50A to 52B are diagrams illustrating modifications of the fifth embodiment.
Figure 50B:
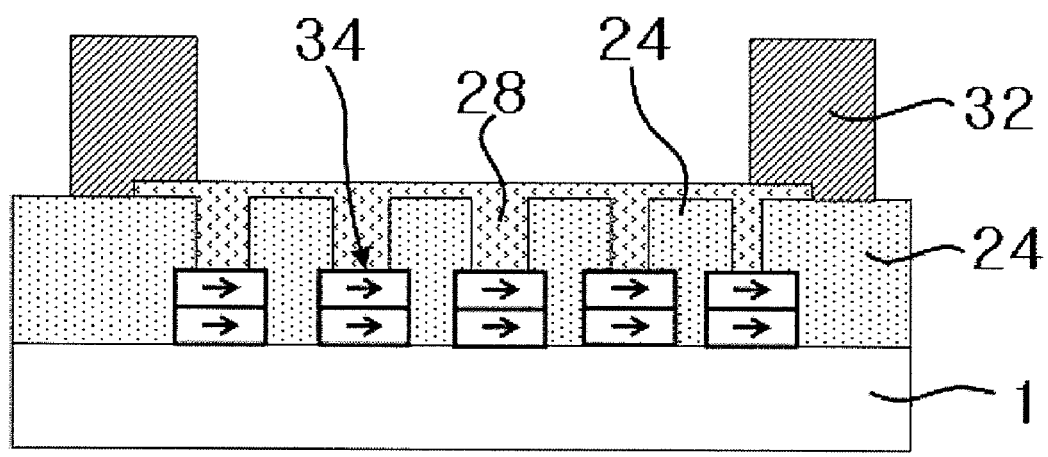

A magnetoresistive element shown in FIGS. 50A and 50B is similar to that shown in FIGS. 49A and 49B except that it has an elliptical ring shape, and the magnetoresistive element is manufactured by the same method as described above. In FIGS. 50A and 50B, reference numeral 34 denotes the magnetoresistive element with the elliptical ring shape. FIG. 50A is a plan view, and FIG. 50B is a diagram illustrating a magnetic field detector including a plurality of magnetoresistive elements 34 with the elliptical ring shapes.

Figure 51A:
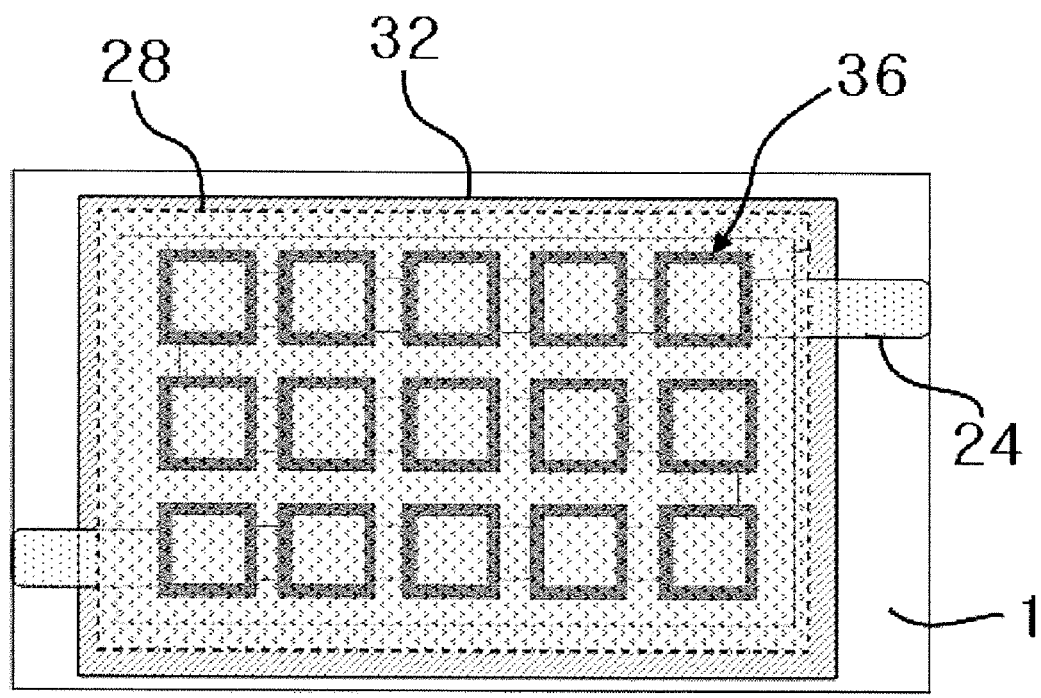
Figure 51B:
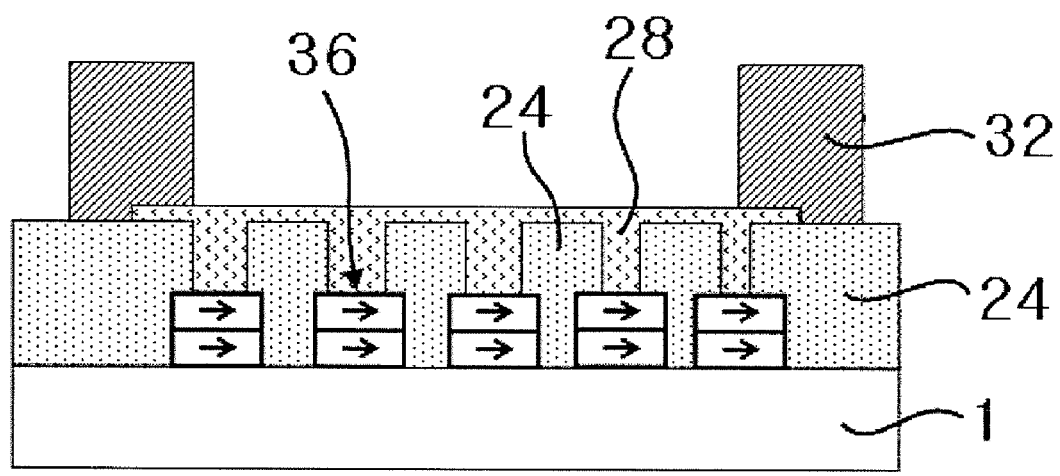

A magnetoresistive element shown in FIGS. 51A and 51B is similar to that shown in FIGS. 49A and 49B except that it has a square ring shape, and the magnetoresistive element is manufactured by the same method as described above. In FIGS. 51A and 51B, reference numeral 36 denotes the magnetoresistive element with the square ring shape. FIG. 51A is a plan view, and FIG. 51B is a diagram illustrating a magnetic field detector including a plurality of magnetoresistive elements 36 with the square ring shapes.

Figure 52A:
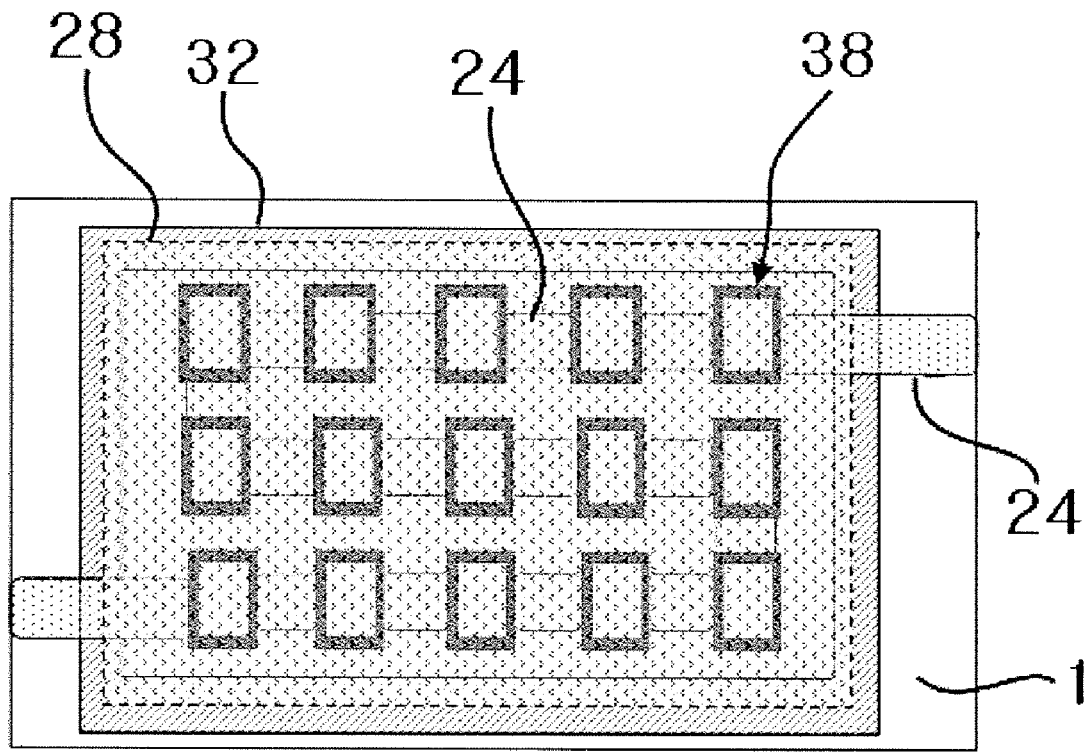
Figure 52B:
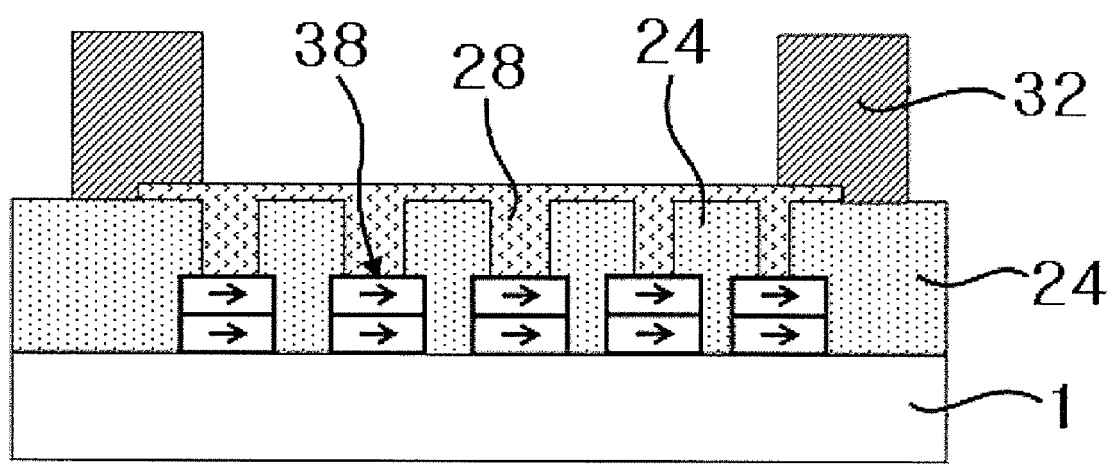

A magnetoresistive element shown in FIGS. 52A and 52B is similar to that shown in FIGS. 49A and 49B except that it has a rectangular ring shape, and the magnetoresistive element is manufactured by the same method as described above. In FIGS. 52A and 52B, reference numeral 38 denotes the magnetoresistive element with the rectangular ring shape. FIG. 52A is a plan view, and FIG. 52B is a diagram illustrating a magnetic field detector including a plurality of magnetoresistive elements 36 with the rectangular ring shapes.

In the magnetic field detectors manufactured according to the fifth embodiment and the modifications thereof, since a stray field is formed inside the magnetoresistive element having a circular ring shape, the stray field is circulated in the magnetoresistive element, and does not leak to the outside of the element. As a result, there is no mutual interference due to the stray field.

When the magnetic bead is magnetized by a magnetic field applied from the outside, a weak magnetic field is generated, and the generated magnetic field has an effect on the magnetization direction of the free layer, which causes a variation in the output voltage of the magnetoresistive element. The variation in the output voltage makes it possible to detect the magnetic bead.

Sixth Embodiment

FIGS. 53A to 59B are diagrams sequentially illustrating a method of manufacturing a magnetic field detector according to a sixth embodiment of the invention. The sixth embodiment differs from the fourth embodiment in that a plurality of magnetoresistive elements having circular ring shapes are arranged in a two-dimensional array (that is, in a matrix). Since a manufacturing method according to the sixth embodiment is most similar to that according to the fourth embodiment, those skilled in the art can easily understand the manufacturing method according to the sixth embodiment.

Figure 53A:
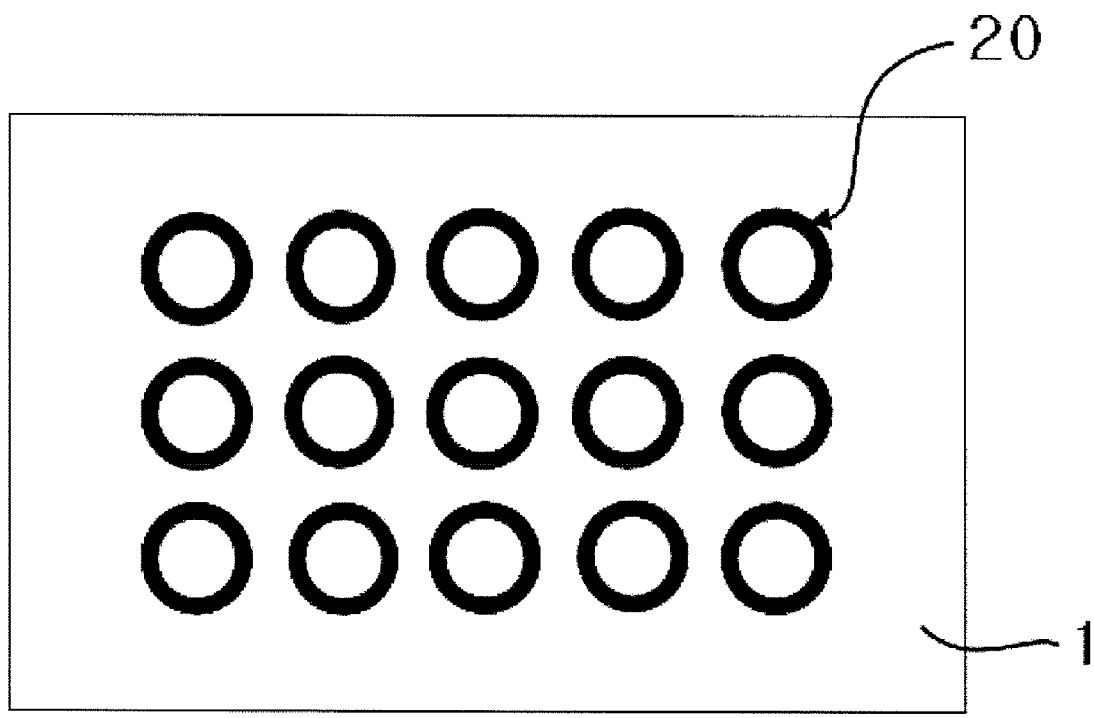
FIGS. 53A to 59B are diagrams sequentially illustrating a method of manufacturing a magnetic field detector according to a sixth embodiment of the invention.
Figure 53B:
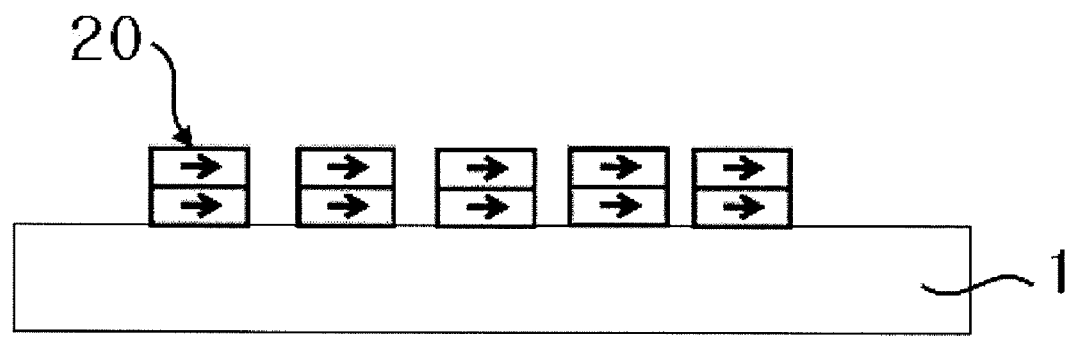

First, a giant magnetoresistive thin film 2 is formed on a substrate 1 by vapor deposition and then etched to form a plurality of magnetoresistive elements 20 with circular ring shapes in a matrix (see FIGS. 53A and 53B). The plurality of magnetoresistive elements 20 are arrayed in a matrix at equal distances. In the etching process, dry etching, such as an Ar gas ion milling method, is performed on the giant magnetoresistive thin film 2 shown in FIG. 1C to etch all the portions of the film except circular ring portions. FIG. 53A is a plan view, and FIG. 53B is a diagram illustrating the arrangement of the substrate 1 and the plurality of magnetoresistive elements 20.

Figure 54A:
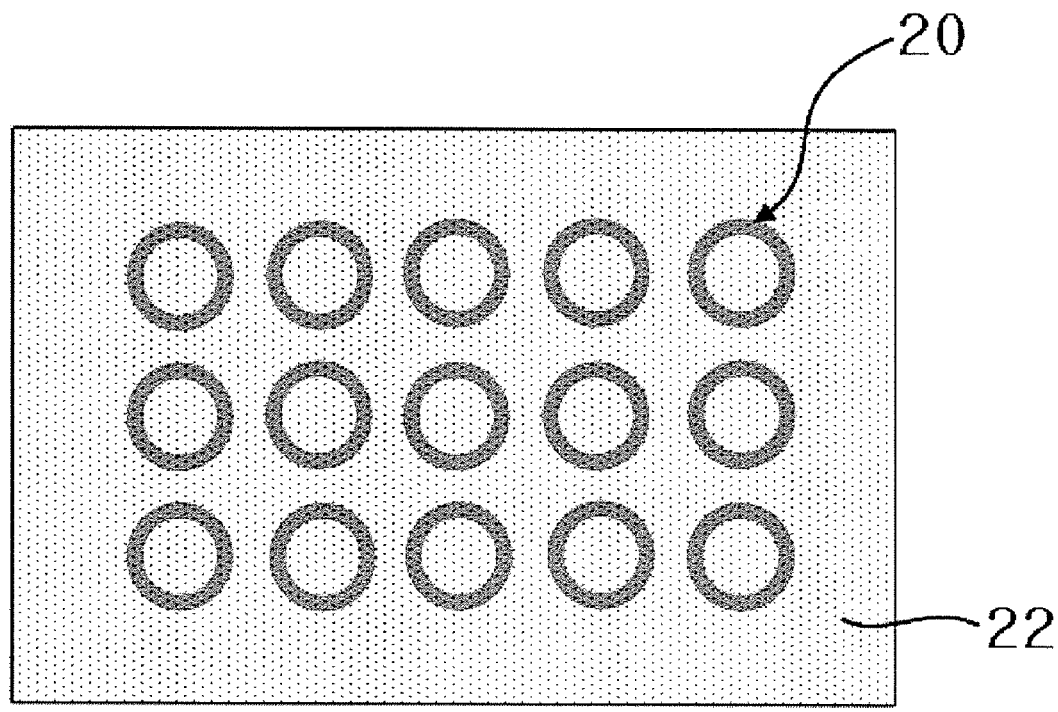
Figure 54B:
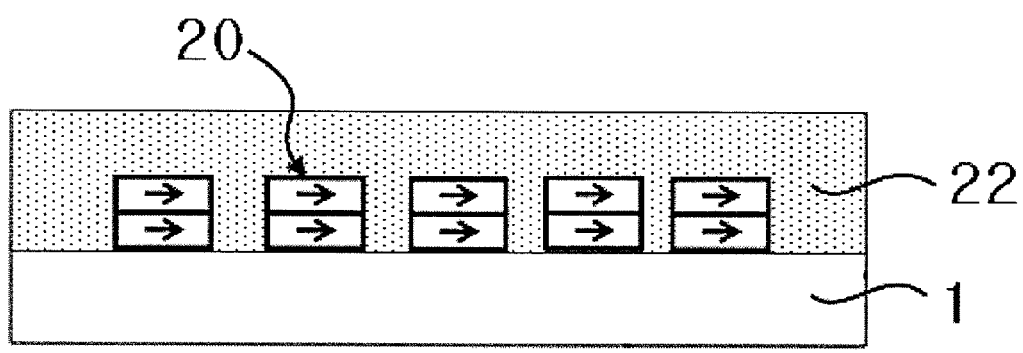

As shown in FIGS. 54A and 54B, a metal thin film layer 22 formed of Au is deposited on the substrate 1 and the plurality of magnetoresistive elements 20. For example, Au is grown with a thickness of about 150 nm by a sputtering deposition method under the conditions of an argon gas pressure of about $3 \times 10^{-4}$ Torr, a sputtering power of about 60 W, and room temperature, thereby forming the metal thin film layer 22. FIG. 54A is a plan view, and FIG. 54B is a diagram illustrating the deposited metal thin film layer 22. The metal thin film layer 22 may be formed of Ta.

Figure 55A:
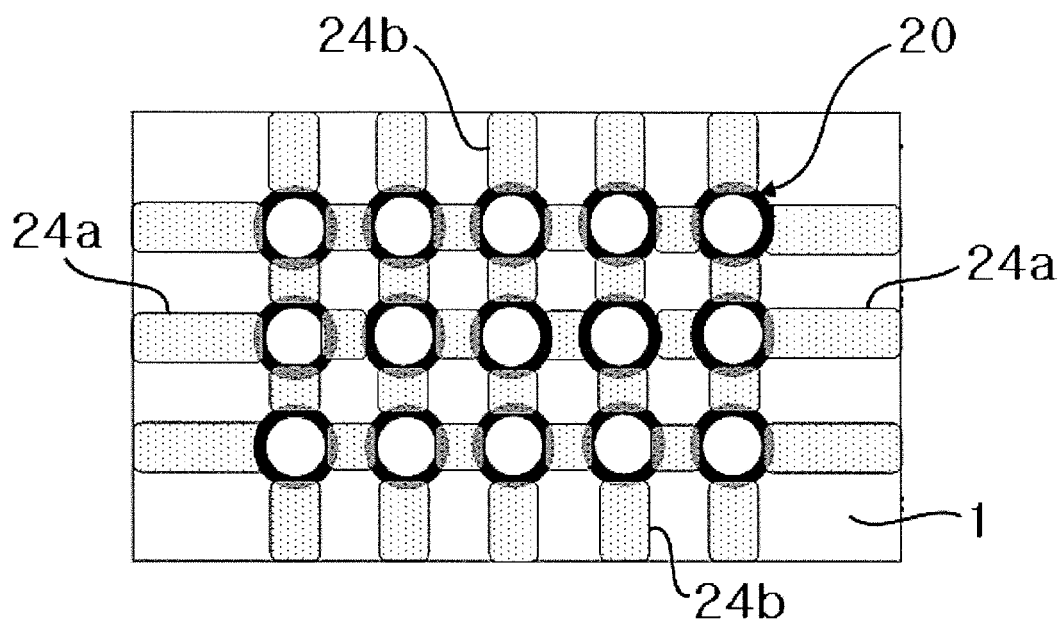
Figure 55B:
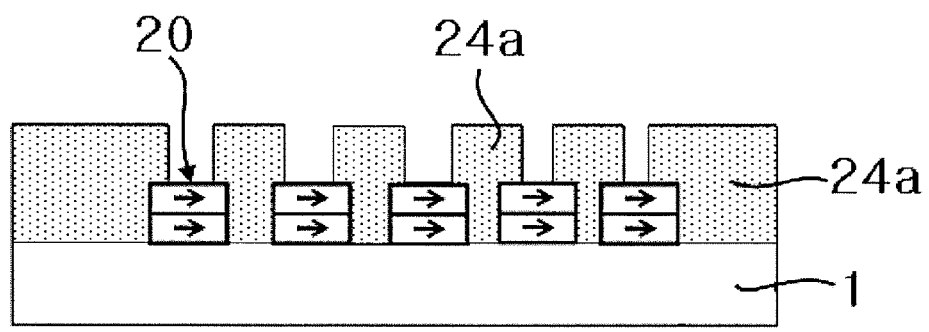

As shown in FIGS. 55A and 55B, horizontal electrode pads 24a and vertical electrode pads 24b are formed. The horizontal electrode pads 24a are used as electrodes for applying a current and measuring a horizontal voltage. The vertical electrode pads 24b are used as electrodes for measuring a vertical voltage. The horizontal and vertical electrode pads 24a and 24b are formed by a lift-up method, using dry etching or a negative photosensitive mask. In this case, all the portions of the metal thin film layer 22 except for portions serving as the electrode pads 24a and 24b are removed. For example, the horizontal electrode pads 24a are formed in the horizontal (row) direction with respect to the magnetoresistive elements 20, and the vertical electrode pads 24b are formed in the vertical (column) direction with respect to the magnetoresistive elements 20. FIG. 55A is a plan view, and FIG. 55B is a diagram illustrating the formed electrode pads 24a and 24b.

Figure 56A:
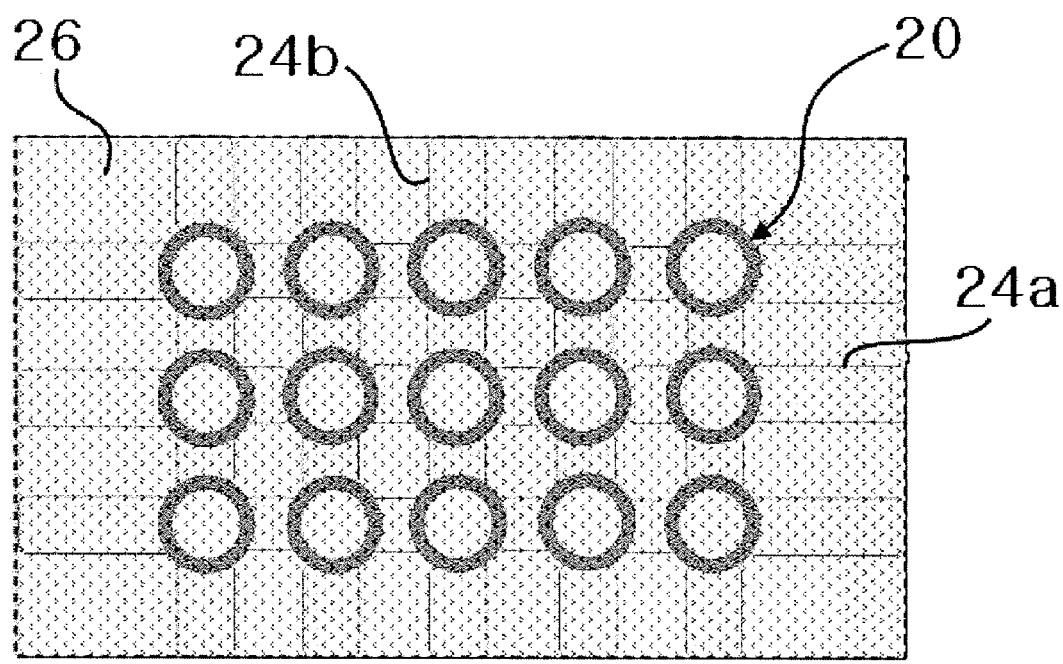
Figure 56B:
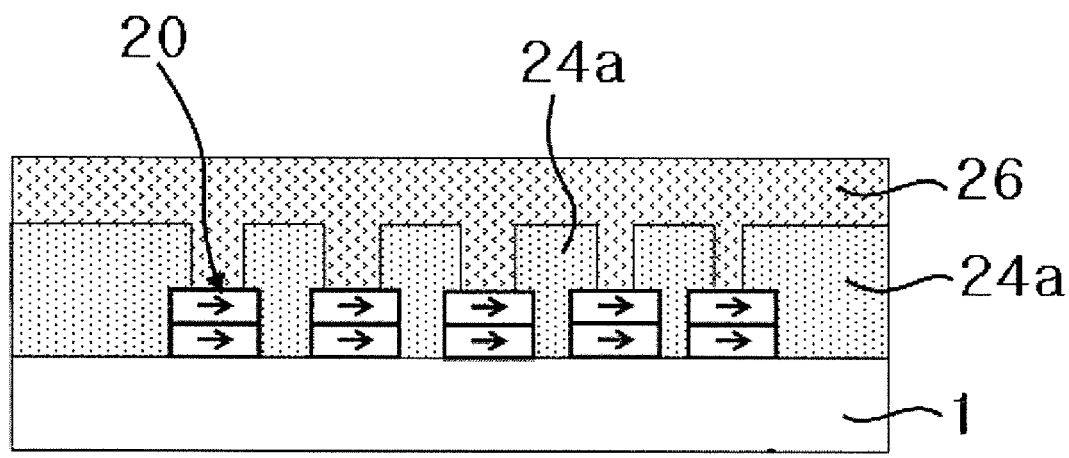

As shown in FIGS. 56A and 56B, an insulating thin film layer 26 is deposited on the substrate 1, the magnetoresistive elements 20, and the electrode pads 24a and 24b. The insulating thin film layer 26 is formed of $SiO_2$ or $Si_3N_4$. In order to prevent the magnetoresistive elements 20 and the electrode pads 24a and 24b from being corroded by an analytical solution, for example, $SiO_2$ or $Si_3N_4$ is grown with a thickness of about 50 to 300 nm (preferably, 150 nm) by a sputtering deposition method under the conditions of an argon gas pressure of about $3 \times 10^{-4}$ Torr, a sputtering power of about 100 W, and room temperature, thereby forming the $SiO_2$ or $Si_3N_4$ insulating thin film layer 26. FIG. 56A is a plan view, and FIG. 56B is a diagram illustrating the formed insulating thin film layer 26.

Figure 57A:
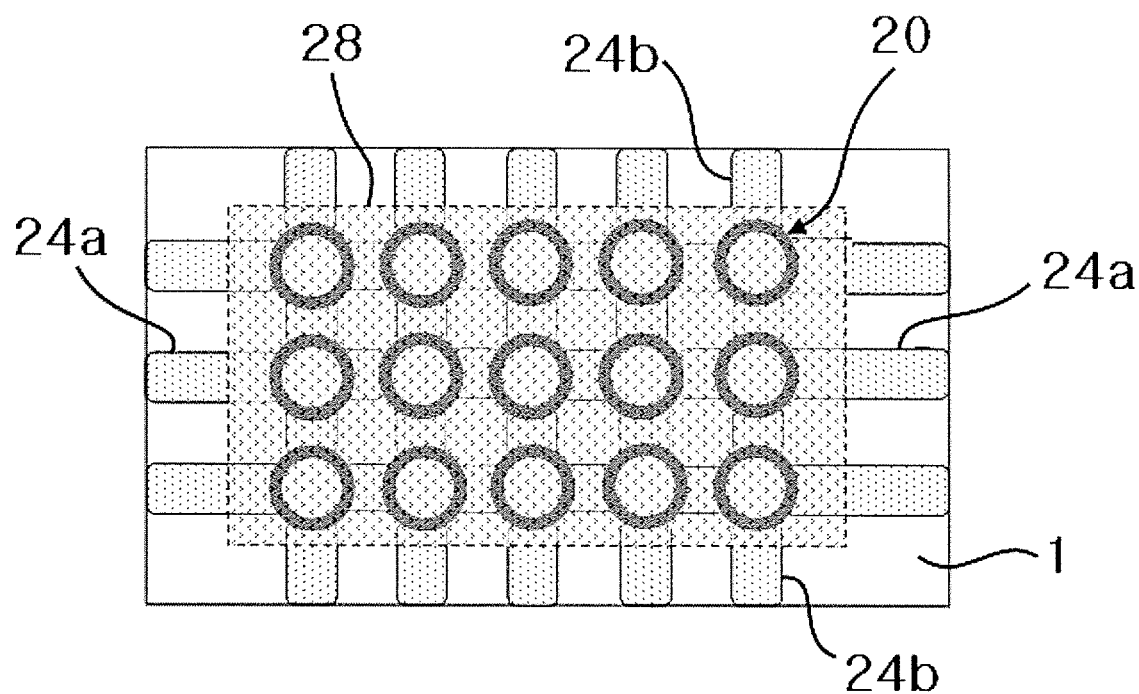
Figure 57B:
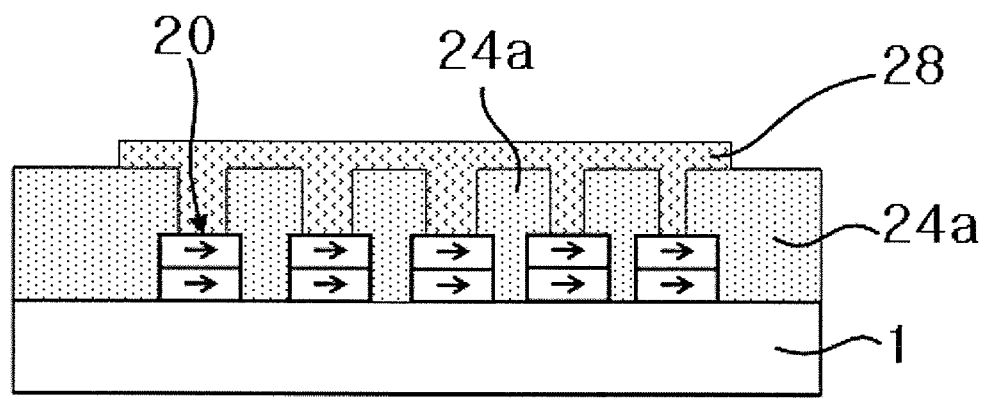

As shown in FIGS. 57A and 57B, the insulating thin film layer 26 is partially removed to form an insulating protective layer 28. All the portions of the insulating thin film layer 26 except a portion serving as the insulating protective layer are removed by a lift-up method, using dry etching, such as an Ar gas ion milling method, or a negative photosensitive mask, thereby forming the insulating protective layer 28. FIG. 57A is a plan view, and FIG. 57B is a diagram illustrating the formed insulating protective layer 28.

Figure 58A:
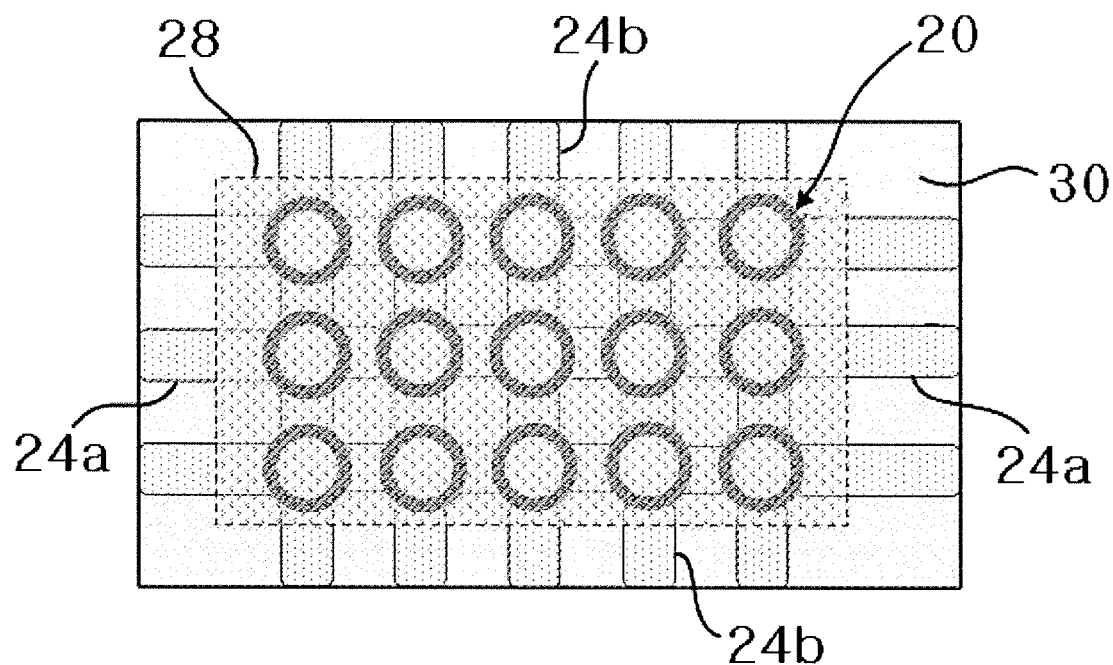
Figure 58B:
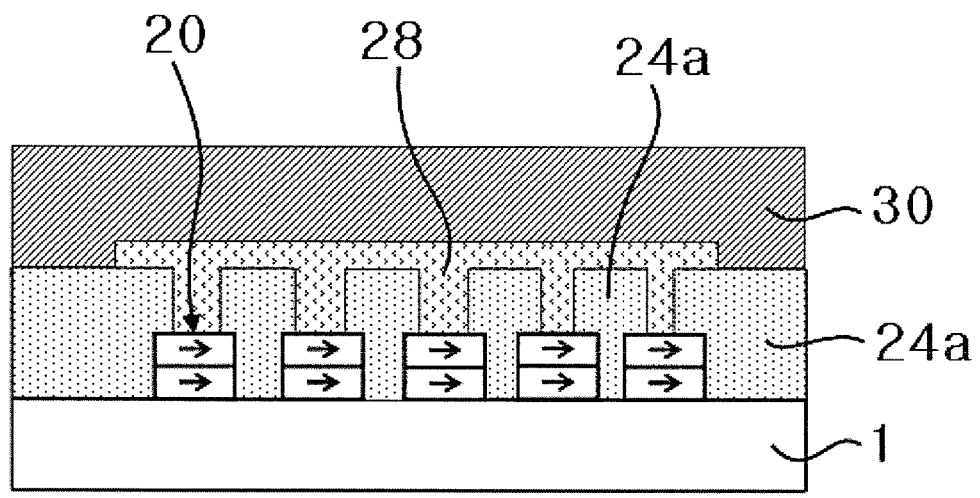

As shown in FIGS. 58A and 58B, a photosensitive magnetic bead thin film 30 is deposited on the substrate 1, the electrode pads 24a and 24b, and the insulating protective layer 28. The photosensitive magnetic bead thin film 30 is formed with a thickness of about 1 to 2 μm (preferably, about 1.5 μm) at room temperature by spin coating at a speed of about 3000 to 5000 rpm. FIG. 58A is a plan view, and FIG. 58B is a diagram illustrating the deposited photosensitive magnetic bead thin film 30.

Figure 59A:
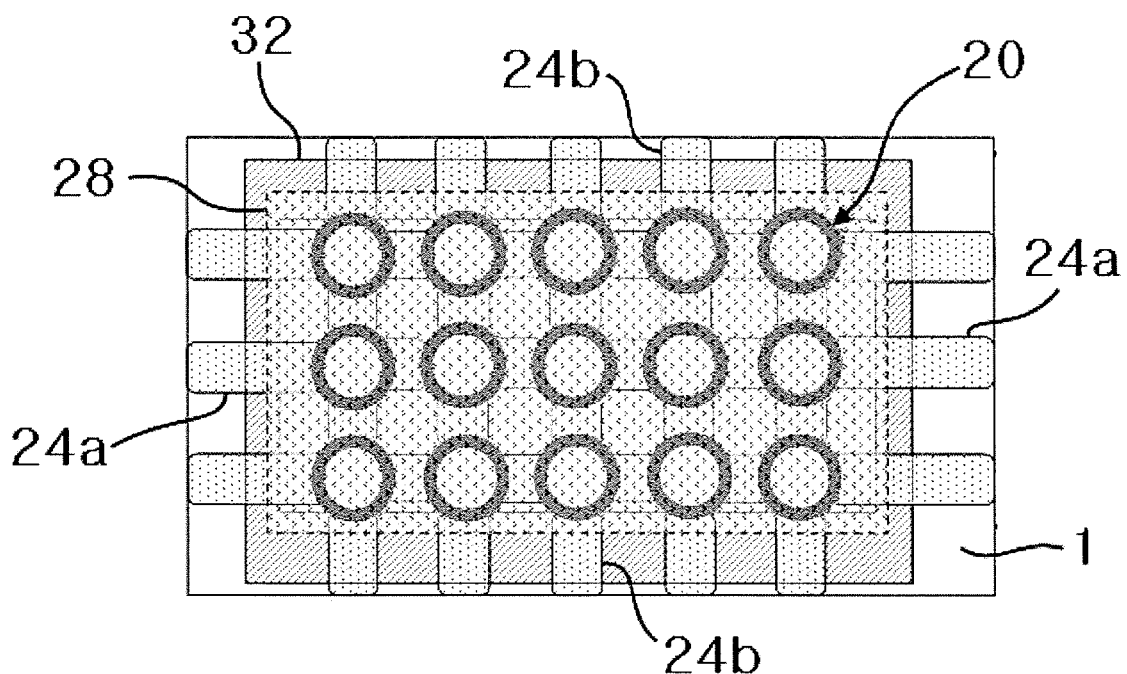
Figure 59B:
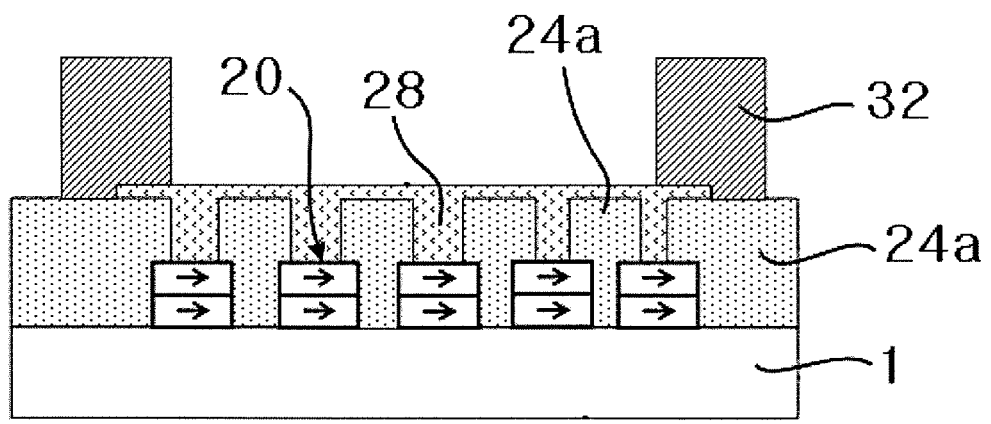

As shown in FIGS. 59A and 59B, the photosensitive magnetic bead thin film 30 is selectively removed to form a magnetic bead limiting layer 32. The magnetic bead limiting layer 32 is formed by removing all the portions of the photosensitive magnetic bead thin film 30 except a portion serving as the magnetic bead limiting layer 32, using a lift-up method and a negative photosensitive mask. The magnetic bead limiting layer 32 can impound a magnetic bead analysis solution therein such that the magnetic bead analysis solution is positioned close to the magnetoresistive element 20. FIG. 59A is a plan view, and FIG. 59B is a diagram illustrating the formed magnetic bead limiting layer 32.

The magnetic field detector manufactured through the above-mentioned processes includes the plurality of magnetoresistive elements 20 with circular ring shapes that are grown on the Si single crystal substrate 1, the horizontal electrodes 24a for applying a current to the plurality of magnetoresistive elements 20 and measuring a horizontal voltage, and the vertical electrodes 24b for measuring a vertical voltage, as shown in FIGS. 59A and 59B. The insulating protective layer 28 is deposited on the entire surface of each of the plurality of magnetoresistive elements 20 and portions of the electrodes 24a and 24b, and the magnetic bead limiting layer 32 is formed on the plurality of magnetoresistive elements 20, the electrodes 24a and 24b, and the insulating protective layer 28. The horizontal electrodes 24a mean the horizontal electrode pads described with reference to FIGS. 55A and 55B, and the vertical electrodes 24b mean the vertical electrode pads described with reference to FIGS. 55A and 55B.

FIGS. 60A to 62B are diagrams illustrating modifications of the sixth embodiment of the invention.

Figure 60A:
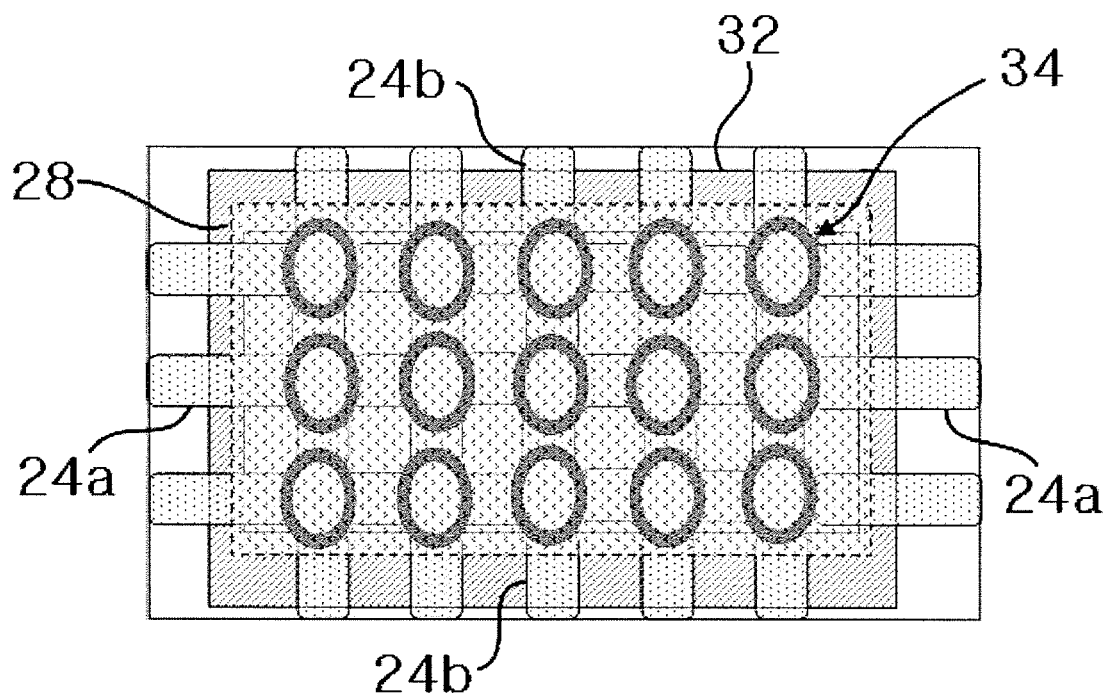
FIGS. 60A to 62B are diagrams illustrating modifications of the sixth embodiment.
Figure 60B:
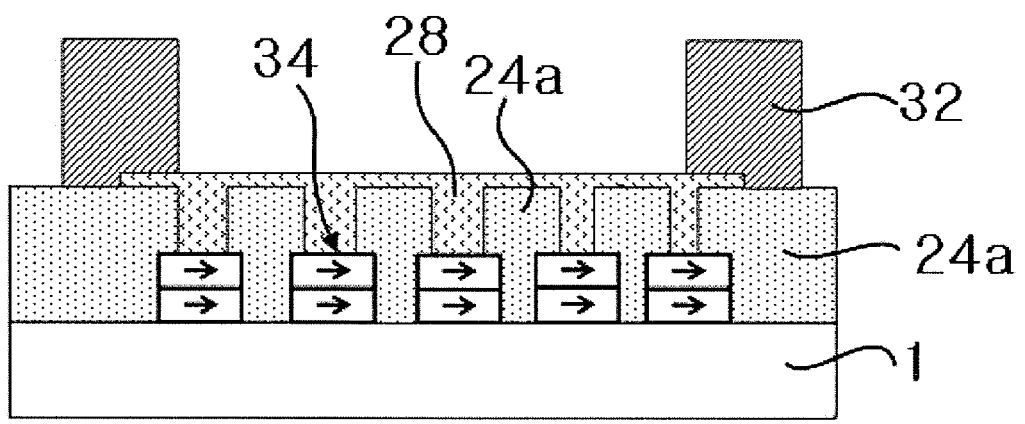

A magnetoresistive element shown in FIGS. 60A and 60B is similar to that shown in FIGS. 59A and 59B except that it has an elliptical ring shape, and the magnetoresistive element is manufactured by the same method as described above. In FIGS. 60A and 60B, reference numeral 34 denotes the magnetoresistive element with the elliptical ring shape. FIG. 60A is a plan view, and FIG. 60B is a diagram illustrating a magnetic field detector including a plurality of magnetoresistive elements 34 with the elliptical ring shapes.

Figure 61A:
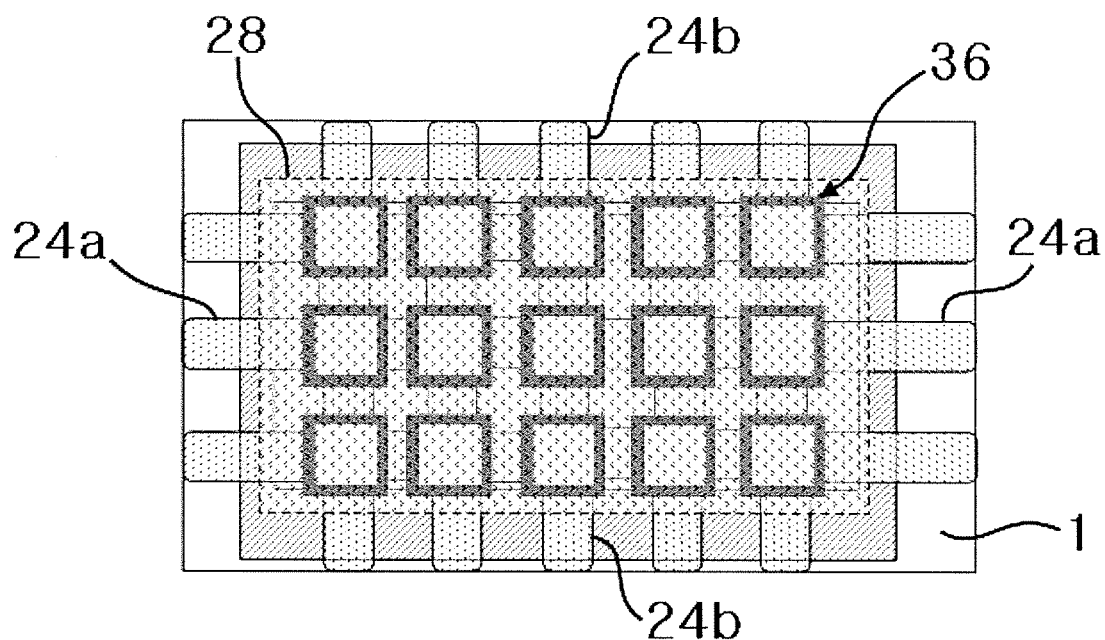
Figure 61B:
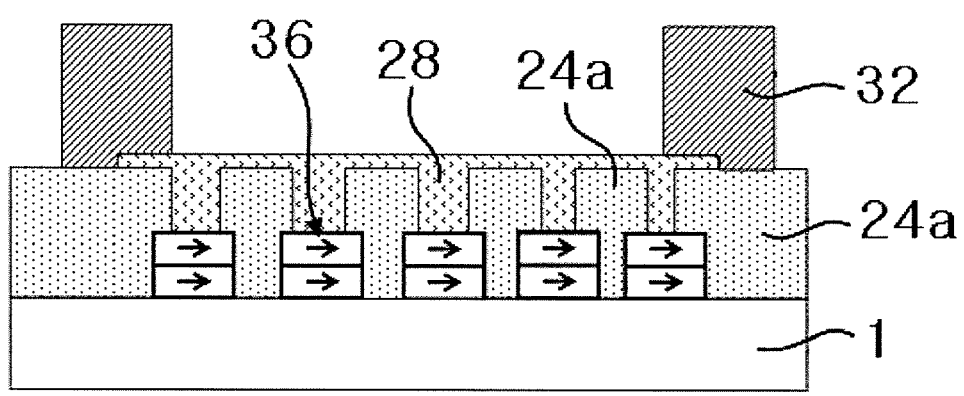

A magnetoresistive element shown in FIGS. 61A and 61B is similar to that shown in FIGS. 59A and 59B except that it has a square ring shape, and the magnetoresistive element is manufactured by the same method as described above. In FIGS. 61A and 61B, reference numeral 36 denotes the magnetoresistive element with the square ring shape. FIG. 61A is a plan view, and FIG. 61B is a diagram illustrating a magnetic field detector including a plurality of magnetoresistive elements 36 with the square ring shapes.

Figure 62A:
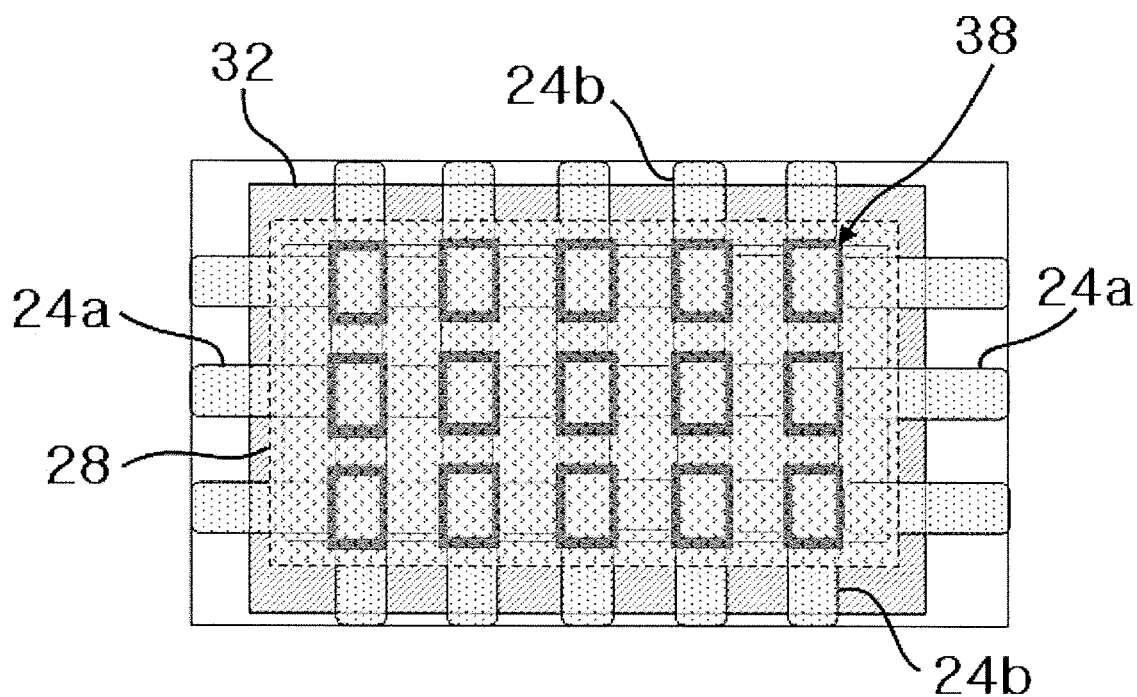
Figure 62B:
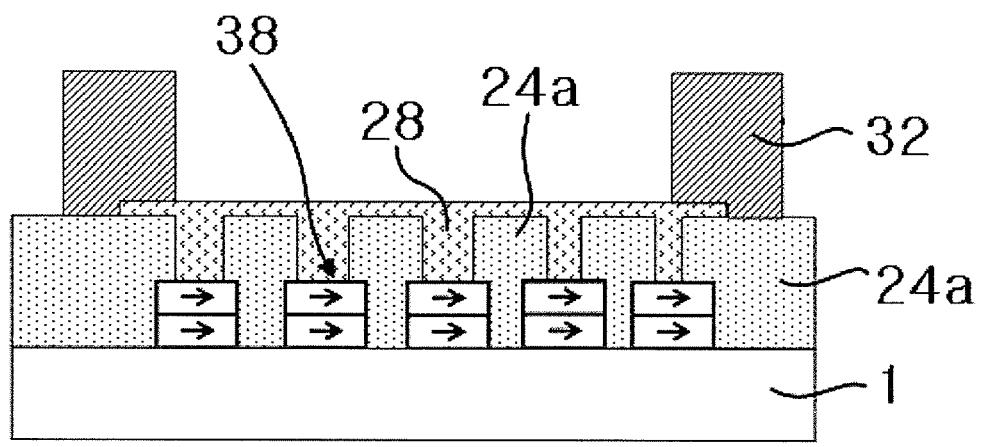

A magnetoresistive element shown in FIGS. 62A and 62B is similar to that shown in FIGS. 59A and 59B except that it has a rectangular ring shape, and the magnetoresistive element is manufactured by the same method as described above. In FIGS. 62A and 62B, reference numeral 38 denotes the magnetoresistive element with the rectangular ring shape. FIG. 62A is a plan view, and FIG. 62B is a diagram illustrating a magnetic field detector including a plurality of magnetoresistive elements 38 with the rectangular ring shapes.

In the magnetic field detectors manufactured according to the sixth embodiment and the modifications thereof, since a stray field is formed inside the magnetoresistive element having a circular ring shape, the stray field is circulated in the magnetoresistive element, but does not leak to the outside of the element. As a result, there is no mutual interference due to the stray field.

When the magnetic bead is magnetized by a magnetic field applied from the outside, a weak magnetic field is generated, and the generated magnetic field has an effect on the magnetization direction of the free layer, which causes a variation in the output voltage of the magnetoresistive element. The variation in the output voltage makes it possible to detect the magnetic bead.

In the above-described embodiments and modifications, as the size of the magnetoresistive element decreases, magnetic bead sensing capability (that is, sensitivity) is improved. However, when the size of the magnetoresistive element is excessively small, it is difficult to actually manufacture a magnetic field detector. Therefore, the above-mentioned dimensions of the magnetoresistive element are determined in consideration of the current capability of manufacturing the element and sensitivity. Of course, when the element manufacturing capability is improved, it may be possible to further reduce the size of the magnetoresistive element. In addition, sensitivity for sensing the magnetic bead is lowered when the size of the magnetoresistive element is out of the above-described numerical range.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. In the above-described embodiments and modifications, the magnetoresistive elements are formed in a circular ring shape, an elliptical ring shape, a square ring shape, and a rectangular ring shape. However, the magnetoresistive elements may be formed in various shapes, such as a pentagonal ring shape, a hexagonal ring shape, and an octagonal ring shape, as long as they can have ring shapes and electrodes can be provided.

What is claimed is:

1. A method of manufacturing a magnetic field detector using a thin film for detecting magnetic beads, the method comprising:
    preparing a substrate;
    depositing the thin film on an upper surface of the substrate;
    etching the thin film to form a ring-shaped magnetoresistive element;
    forming, on the upper surface of a substrate, electrode pads connected to the magnetoresistive element;
    forming a protective layer that covers the magnetoresistive element and portions of the electrode pads; and
    forming, on an upper surface of the protective layer, a magnetic bead limiting layer which has a ring-shape that encloses the entire surface of the magnetoresistive element, the magnetic bead limiting layer used for impounding a solution containing the magnetic beads.

2. The method of claim 1,
    wherein the thin film is formed of any one of a giant magnetoresistive thin film, an anisotropic magnetoresistive thin film, a spin valve thin film, and a tunnel-type magnetoresistive thin film.

3. The method of claim 1,
    wherein the thin film includes a pinned layer and a free layer.

4. The method of claim 1,
    wherein the thin film is a laminate of a seed layer, an antiferromagnetic layer, a pinned layer, a gap layer, a free layer, and a protective layer formed in this order.

5. The method of claim 1,
    wherein the magnetoresistive element is formed in any one of a circular ring shape, an elliptical ring shape, a square ring shape, and a rectangular ring shape.

6. The method of claim 1,
    wherein, in the forming of the electrode pads, the electrode pads are formed of Ta or Au.

7. The method of claim 1,
    wherein, in the forming of the electrode pads, the electrode pads are formed so as to be horizontally connected to the magnetoresistive element.

8. The method of claim 1,
    wherein, in the forming of the electrode pads, the electrode pads are formed so as to be vertically and horizontally connected to the magnetoresistive element.

9. The method of claim 1,
    wherein, in the forming of the protective layer, the protective layer is formed of $SiO_2$ or $Si_3N_4$.

10. The method of claim 1,
    wherein, in the forming of the protective layer, the protective layer is formed with a thickness of 50 to 300 nm at room temperature.

11. The method of claim 1,
    wherein, in the forming of the magnetic bead limiting layer, the magnetic bead limiting layer is formed using a photosensitive thin film.

12. The method of claim 1,
    wherein, in the forming of the magnetic bead limiting layer, the magnetic bead limiting layer is formed with a thickness of 1 to 2 µm at room temperature.

13. The method of claim 1,
    wherein the outside diameter of the magnetoresistive element is in a range of 100 nm to 30 µm.

14. The method of claim 1,
    wherein the width of the magnetoresistive element is in a range of 100 nm to 5 µm.

15. The method of claim 1,
    wherein a plurality of magnetoresistive elements are formed in a one-dimensional array.

16. The method of claim 1,
    wherein a plurality of magnetoresistive elements are formed in a two-dimensional array, that is, in a matrix.

* * * * *